(12) United States Patent
Li

(10) Patent No.: US 11,339,324 B2
(45) Date of Patent: *May 24, 2022

(54) METAL-ASSISTED DELAYED FLUORESCENT MATERIALS AS CO-HOST MATERIALS FOR FLUORESCENT OLEDS

(71) Applicant: Arizona Board of Regents on behalf of Arizona State University, Scottsdale, AZ (US)

(72) Inventor: Jian Li, Tempe, AZ (US)

(73) Assignee: Arizona Board of Regents on behalf of Arizona State University, Scottsdale, AZ (US)

(*) Notice: Subject to any disclaimer, the term of this patent is extended or adjusted under 35 U.S.C. 154(b) by 14 days.

This patent is subject to a terminal disclaimer.

(21) Appl. No.: 16/921,301

(22) Filed: Jul. 6, 2020

(65) Prior Publication Data

US 2020/0332185 A1 Oct. 22, 2020

Related U.S. Application Data

(63) Continuation of application No. 16/288,350, filed on Feb. 28, 2019, now Pat. No. 10,745,615, which is a
(Continued)

(51) Int. Cl.
*H01L 51/00* (2006.01)
*C09K 11/06* (2006.01)
*H01L 51/50* (2006.01)

(52) U.S. Cl.
CPC ............ *C09K 11/06* (2013.01); *H01L 51/005* (2013.01); *H01L 51/0052* (2013.01);
(Continued)

(58) Field of Classification Search
CPC ........ C09K 11/06; H01L 51/005–0092; H01L 51/5012
See application file for complete search history.

(56) References Cited

U.S. PATENT DOCUMENTS 4,769,292 A 9/1988 Tang
5,707,745 A 1/1998 Forrest
(Continued)

FOREIGN PATENT DOCUMENTS

CN 1777663 5/2006
CN 1894269 A 1/2007
(Continued)

OTHER PUBLICATIONS

Ayan Maity et al., "Room-temperature synthesis of cyclometalated iridium(III) complexes; kinetic isomers and reactive functionalities" Chem. Sci., vol. 4, pp. 1175-1181 (2013).
(Continued)

*Primary Examiner* — Nicholas J Tobergte
(74) *Attorney, Agent, or Firm* — Riverside Law LLP

(57) ABSTRACT

A light emitting device includes a first electrode, a hole transporting layer in contact with the first electrode, a second electrode, an electron transporting layer in contact with the second electrode; and an emissive layer between the hole transporting layer and the electron transporting layer. The emissive layer includes a metal-assisted delayed fluorescent (MADF) emitter, a fluorescent emitter, and a host, and the MADF emitter harvests electrogenerated excitons and transfers energy to the fluorescent emitter.

20 Claims, 7 Drawing Sheets

Related U.S. Application Data continuation of application No. 15/925,203, filed on Mar. 19, 2018, now Pat. No. 10,294,417, which is a continuation of application No. 15/505,544, filed as application No. PCT/US2015/046419 on Aug. 21, 2015, now Pat. No. 9,920,242.

(60) Provisional application No. 62/040,727, filed on Aug. 22, 2014.

(52) U.S. Cl.
CPC ...... *H01L 51/0062* (2013.01); *H01L 51/0065* (2013.01); *H01L 51/0067* (2013.01); *H01L 51/0068* (2013.01); *H01L 51/0069* (2013.01); *H01L 51/0071* (2013.01); *H01L 51/0072* (2013.01); *H01L 51/0073* (2013.01); *H01L 51/0074* (2013.01); *H01L 51/0083* (2013.01); *H01L 51/0084* (2013.01); *H01L 51/0085* (2013.01); *H01L 51/0087* (2013.01); *H01L 51/0091* (2013.01); *H01L 51/0092* (2013.01); *H01L 51/504* (2013.01); *H01L 51/5012* (2013.01); *C09K 2211/185* (2013.01); *C09K 2211/187* (2013.01); *C09K 2211/188* (2013.01); *H01L 51/0054* (2013.01)

(56) References Cited

U.S. PATENT DOCUMENTS

| | | | |
|---|---|---|---|
| 5,844,363 A | 12/1998 | Gu | |
| 6,200,695 B1 | 3/2001 | Arai | |
| 6,303,238 B1 | 10/2001 | Thompson | |
| 6,780,528 B2 | 8/2004 | Tsuboyama | |
| 7,002,013 B1 | 2/2006 | Chi | |
| 7,037,599 B2 | 5/2006 | Culligan | |
| 7,279,704 B2 | 10/2007 | Walters | |
| 7,332,232 B2 | 2/2008 | Ma | |
| 7,442,797 B2 | 10/2008 | Itoh | |
| 7,501,190 B2 | 3/2009 | Ise | |
| 7,655,322 B2 | 2/2010 | Forrest | |
| 7,947,383 B2 | 5/2011 | Ise | |
| 8,106,199 B2 | 1/2012 | Jabbour | |
| 8,389,725 B2 | 3/2013 | Li | |
| 8,617,723 B2 | 12/2013 | Stoessel | |
| 8,669,364 B2 | 3/2014 | Li | |
| 8,816,080 B2 | 8/2014 | Li | |
| 8,846,940 B2 | 9/2014 | Li | |
| 8,871,361 B2 | 10/2014 | Xia | |
| 8,927,713 B2 | 1/2015 | Li | |
| 8,946,417 B2 | 2/2015 | Jian | |
| 9,059,412 B2 | 6/2015 | Zeng | |
| 9,076,974 B2 | 7/2015 | Li | |
| 9,082,989 B2 | 7/2015 | Li | |
| 9,203,039 B2 | 12/2015 | Li | |
| 9,221,857 B2 | 12/2015 | Li | |
| 9,224,963 B2 | 12/2015 | Li | |
| 9,238,668 B2 | 1/2016 | Li | |
| 9,312,502 B2 | 4/2016 | Li | |
| 9,312,505 B2 | 4/2016 | Brooks | |
| 9,318,725 B2 | 4/2016 | Li | |
| 9,324,957 B2 | 4/2016 | Li | |
| 9,382,273 B2 | 7/2016 | Li | |
| 9,385,329 B2 | 7/2016 | Li | |
| 9,425,415 B2 | 8/2016 | Li | |
| 9,461,254 B2 | 10/2016 | Tsai | |
| 9,502,671 B2 | 11/2016 | Jian | |
| 9,550,801 B2 | 1/2017 | Li | |
| 9,598,449 B2 | 3/2017 | Li | |
| 9,617,291 B2 | 4/2017 | Li | |
| 9,666,822 B2 | 5/2017 | Forrest | |
| 9,673,409 B2 | 6/2017 | Li | |
| 9,698,359 B2 | 7/2017 | Li | |
| 9,711,739 B2 | 7/2017 | Li | |
| 9,711,741 B2 | 7/2017 | Li | |
| 9,711,742 B2 | 7/2017 | Li | |
| 9,755,163 B2 | 9/2017 | Li | |
| 9,818,959 B2 | 11/2017 | Li | |
| 9,865,825 B2 | 1/2018 | Li | |
| 9,879,039 B2 | 1/2018 | Li | |
| 9,882,150 B2 | 1/2018 | Li | |
| 9,899,614 B2 | 2/2018 | Li | |
| 9,920,242 B2 | 3/2018 | Li | |
| 9,923,155 B2 | 3/2018 | Li | |
| 9,941,479 B2 | 4/2018 | Li | |
| 9,947,881 B2 | 4/2018 | Li | |
| 9,985,224 B2 | 5/2018 | Li | |
| 10,020,455 B2 | 7/2018 | Li | |
| 10,033,003 B2 | 7/2018 | Li | |
| 10,056,564 B2 | 8/2018 | Li | |
| 10,056,567 B2 | 8/2018 | Li | |
| 10,158,091 B2 | 12/2018 | Li | |
| 10,177,323 B2 | 1/2019 | Li | |
| 10,211,411 B2 | 2/2019 | Li | |
| 10,211,414 B2 | 2/2019 | Li | |
| 10,263,197 B2 | 4/2019 | Li | |
| 10,294,417 B2 | 5/2019 | Li | |
| 10,392,387 B2 | 8/2019 | Li | |
| 10,411,202 B2 | 9/2019 | Li | |
| 10,414,785 B2 | 9/2019 | Li | |
| 10,516,117 B2 | 12/2019 | Li | |
| 10,566,553 B2 | 2/2020 | Li | |
| 10,566,554 B2 | 2/2020 | Li | |
| 10,745,615 B2 * | 8/2020 | Li | H01L 51/0062 |
| 2002/0068190 A1 | 6/2002 | Tsuboyama | |
| 2003/0062519 A1 | 4/2003 | Yamazaki | |
| 2003/0186077 A1 | 10/2003 | Chen | |
| 2005/0170207 A1 | 8/2005 | Ma | |
| 2005/0260446 A1 | 11/2005 | Mackenzie | |
| 2006/0073359 A1 | 4/2006 | Ise | |
| 2006/0094875 A1 | 5/2006 | Itoh | |
| 2006/0182992 A1 | 8/2006 | Nii | |
| 2006/0202197 A1 | 9/2006 | Nakayama | |
| 2006/0210831 A1 | 9/2006 | Sano | |
| 2006/0255721 A1 | 11/2006 | Igarashi | |
| 2006/0263635 A1 | 11/2006 | Ise | |
| 2006/0286406 A1 | 12/2006 | Igarashi | |
| 2007/0057630 A1 | 3/2007 | Nishita | |
| 2007/0059551 A1 | 3/2007 | Yamazaki | |
| 2007/0082284 A1 | 4/2007 | Stoessel | |
| 2007/0103060 A1 | 5/2007 | Itoh | |
| 2008/0001530 A1 | 1/2008 | Ise | |
| 2008/0036373 A1 | 2/2008 | Itoh | |
| 2008/0054799 A1 | 3/2008 | Satou | |
| 2008/0079358 A1 | 4/2008 | Satou | |
| 2008/0111476 A1 | 5/2008 | Choi | |
| 2008/0241518 A1 | 10/2008 | Satou | |
| 2008/0241589 A1 | 10/2008 | Fukunaga | |
| 2008/0269491 A1 | 10/2008 | Jabbour | |
| 2009/0026936 A1 | 1/2009 | Satou | |
| 2009/0026939 A1 | 1/2009 | Kinoshita | |
| 2009/0032989 A1 | 2/2009 | Karim | |
| 2009/0039768 A1 | 2/2009 | Igarashi | |
| 2009/0079340 A1 | 3/2009 | Kinoshita | |
| 2009/0128008 A1 | 5/2009 | Ise | |
| 2009/0136779 A1 | 5/2009 | Cheng | |
| 2009/0153045 A1 | 6/2009 | Kinoshita | |
| 2009/0218561 A1 | 9/2009 | Kitamura | |
| 2009/0261721 A1 | 10/2009 | Murakami | |
| 2009/0267500 A1 | 10/2009 | Kinoshita | |
| 2010/0000606 A1 | 1/2010 | Thompson | |
| 2010/0013386 A1 | 1/2010 | Thompson | |
| 2010/0171111 A1 | 7/2010 | Takada | |
| 2010/0171418 A1 | 7/2010 | Kinoshita | |
| 2010/0204467 A1 | 8/2010 | Lamarque | |
| 2011/0028723 A1 | 2/2011 | Li | |
| 2011/0049496 A1 | 3/2011 | Fukuzaki | |
| 2011/0227058 A1 | 9/2011 | Masui | |
| 2011/0301351 A1 | 12/2011 | Li | |
| 2012/0095232 A1 | 4/2012 | Li | |
| 2012/0108806 A1 | 5/2012 | Li | |
| 2012/0181528 A1 | 7/2012 | Takada | |
| 2012/0202997 A1 | 8/2012 | Parham | |
| 2012/0215001 A1 | 8/2012 | Li | |

(56) References Cited

U.S. PATENT DOCUMENTS

| | | |
|---|---|---|
| 2012/0223634 A1 | 9/2012 | Xia |
| 2012/0264938 A1 | 10/2012 | Li |
| 2012/0273736 A1 | 11/2012 | James |
| 2012/0302753 A1 | 11/2012 | Li |
| 2013/0048963 A1 | 2/2013 | Beers |
| 2013/0082245 A1 | 4/2013 | Kottas |
| 2013/0137870 A1 | 5/2013 | Li |
| 2013/0168656 A1 | 7/2013 | Tsai |
| 2013/0172561 A1 | 7/2013 | Tsai |
| 2013/0203996 A1 | 8/2013 | Li |
| 2013/0237706 A1 | 9/2013 | Li |
| 2013/0341600 A1 | 12/2013 | Lin |
| 2014/0014922 A1 | 1/2014 | Lin |
| 2014/0027733 A1 | 1/2014 | Zeng |
| 2014/0066628 A1 | 3/2014 | Li |
| 2014/0073798 A1 | 3/2014 | Li |
| 2014/0084261 A1 | 3/2014 | Brooks |
| 2014/0114072 A1 | 4/2014 | Li |
| 2014/0147996 A1 | 5/2014 | Vogt |
| 2014/0148594 A1 | 5/2014 | Li |
| 2014/0191206 A1 | 7/2014 | Cho |
| 2014/0203248 A1 | 7/2014 | Zhou |
| 2014/0249310 A1 | 9/2014 | Li |
| 2014/0330019 A1 | 11/2014 | Li |
| 2014/0364605 A1 | 12/2014 | Li |
| 2015/0008419 A1 | 1/2015 | Li |
| 2015/0018558 A1 | 1/2015 | Li |
| 2015/0028323 A1 | 1/2015 | Xia |
| 2015/0069334 A1 | 3/2015 | Xia |
| 2015/0105556 A1 | 4/2015 | Li |
| 2015/0162552 A1 | 6/2015 | Li |
| 2015/0194616 A1 | 7/2015 | Li |
| 2015/0207086 A1 | 7/2015 | Li |
| 2015/0228914 A1 | 8/2015 | Li |
| 2015/0274762 A1 | 10/2015 | Li |
| 2015/0287938 A1 | 10/2015 | Li |
| 2015/0311456 A1 | 10/2015 | Li |
| 2015/0318500 A1 | 11/2015 | Li |
| 2015/0349279 A1 | 12/2015 | Li |
| 2016/0028028 A1 | 1/2016 | Li |
| 2016/0028029 A1 | 1/2016 | Li |
| 2016/0043331 A1 | 2/2016 | Li |
| 2016/0072082 A1 | 3/2016 | Brooks |
| 2016/0133861 A1 | 5/2016 | Li |
| 2016/0133862 A1 | 5/2016 | Li |
| 2016/0194344 A1 | 7/2016 | Li |
| 2016/0197291 A1 | 7/2016 | Li |
| 2016/0285015 A1 | 9/2016 | Li |
| 2016/0359120 A1 | 12/2016 | Li |
| 2016/0359125 A1 | 12/2016 | Li |
| 2017/0005278 A1 | 1/2017 | Li |
| 2017/0012224 A1 | 1/2017 | Li |
| 2017/0040555 A1 | 2/2017 | Li |
| 2017/0047533 A1 | 2/2017 | Li |
| 2017/0066792 A1 | 3/2017 | Li |
| 2017/0069855 A1 | 3/2017 | Li |
| 2017/0077420 A1 | 3/2017 | Li |
| 2017/0125708 A1 | 5/2017 | Li |
| 2017/0267923 A1 | 9/2017 | Li |
| 2017/0271611 A1 | 9/2017 | Li |
| 2017/0301871 A1 | 10/2017 | Li |
| 2017/0305881 A1 | 10/2017 | Li |
| 2017/0309943 A1 | 10/2017 | Angell |
| 2017/0331056 A1 | 11/2017 | Li |
| 2017/0342098 A1 | 11/2017 | Li |
| 2017/0373260 A1 | 12/2017 | Li |
| 2018/0006246 A1 | 1/2018 | Li |
| 2018/0013096 A1 | 1/2018 | Hamada |
| 2018/0053904 A1 | 2/2018 | Li |
| 2018/0130960 A1 | 5/2018 | Li |
| 2018/0138428 A1 | 5/2018 | Li |
| 2018/0148464 A1 | 5/2018 | Li |
| 2018/0159051 A1 | 6/2018 | Li |
| 2018/0166655 A1 | 6/2018 | Li |
| 2018/0175329 A1 | 6/2018 | Li |
| 2018/0194790 A1 | 7/2018 | Li |
| 2018/0219161 A1 | 8/2018 | Li |
| 2018/0226592 A1 | 8/2018 | Li |
| 2018/0226593 A1 | 8/2018 | Li |
| 2018/0277777 A1 | 9/2018 | Li |
| 2018/0301641 A1 | 10/2018 | Li |
| 2018/0312750 A1 | 11/2018 | Li |
| 2018/0331307 A1 | 11/2018 | Li |
| 2018/0334459 A1 | 11/2018 | Li |
| 2018/0337345 A1 | 11/2018 | Li |
| 2018/0337349 A1 | 11/2018 | Li |
| 2018/0337350 A1 | 11/2018 | Li |
| 2019/0013485 A1 | 1/2019 | Li |
| 2019/0067602 A1 | 2/2019 | Li |
| 2019/0109288 A1 | 4/2019 | Li |
| 2019/0194536 A1 | 6/2019 | Li |
| 2019/0259963 A1 | 8/2019 | Li |
| 2019/0276485 A1 | 9/2019 | Li |
| 2019/0312217 A1 | 10/2019 | Li |
| 2019/0367546 A1 | 12/2019 | Li |
| 2019/0389893 A1 | 12/2019 | Li |
| 2020/0006678 A1 | 1/2020 | Li |
| 2020/0071330 A1 | 3/2020 | Li |
| 2020/0075868 A1 | 3/2020 | Li |

FOREIGN PATENT DOCUMENTS

| | | |
|---|---|---|
| CN | 101142223 A | 3/2008 |
| CN | 101667626 | 3/2010 |
| CN | 102449108 A | 5/2012 |
| CN | 102892860 A | 1/2013 |
| CN | 102971396 A | 3/2013 |
| CN | 103102372 | 5/2013 |
| CN | 104232076 A | 12/2014 |
| CN | 104693243 A | 6/2015 |
| CN | 105367605 A | 3/2016 |
| CN | 105418591 A | 3/2016 |
| EP | 1808052 A1 | 7/2007 |
| EP | 1874893 A1 | 1/2008 |
| EP | 1874894 A1 | 1/2008 |
| EP | 1919928 A1 | 5/2008 |
| EP | 2036907 A1 | 3/2009 |
| EP | 2096690 | 9/2009 |
| EP | 2112213 A2 | 10/2009 |
| EP | 2417217 A2 | 2/2012 |
| EP | 2711999 A2 | 3/2014 |
| JP | 2005267557 | 9/2005 |
| JP | 2005310733 A | 11/2005 |
| JP | 2006047240 A | 2/2006 |
| JP | 2006232784 A | 9/2006 |
| JP | 2006242080 | 9/2006 |
| JP | 2006242081 A | 9/2006 |
| JP | 2006256999 A | 9/2006 |
| JP | 2006257238 A | 9/2006 |
| JP | 2006261623 A | 9/2006 |
| JP | 2006290988 A | 10/2006 |
| JP | 2006313796 A | 11/2006 |
| JP | 2006332622 A | 12/2006 |
| JP | 2006351638 A | 12/2006 |
| JP | 2007019462 A | 1/2007 |
| JP | 2007042875 A | 2/2007 |
| JP | 2007051243 A | 3/2007 |
| JP | 2007053132 A | 3/2007 |
| JP | 2007066581 | 3/2007 |
| JP | 2007073620 A | 3/2007 |
| JP | 2007073845 A | 3/2007 |
| JP | 2007073900 A | 3/2007 |
| JP | 2007080593 | 3/2007 |
| JP | 2007080677 A | 3/2007 |
| JP | 2007088105 | 4/2007 |
| JP | 2007088164 A | 4/2007 |
| JP | 2007096259 A | 4/2007 |
| JP | 2007110067 | 4/2007 |
| JP | 2007110102 A | 4/2007 |
| JP | 2007519614 | 7/2007 |
| JP | 2007258550 A | 10/2007 |
| JP | 2007324309 A | 12/2007 |
| JP | 2008010353 A | 1/2008 |
| JP | 2008091860 A | 4/2008 |

(56) References Cited

FOREIGN PATENT DOCUMENTS

| | | |
|---|---|---|
| JP | 2008103535 A | 5/2008 |
| JP | 2008108617 A | 5/2008 |
| JP | 2008109085 | 5/2008 |
| JP | 2008109103 A | 5/2008 |
| JP | 2008160087 A | 7/2008 |
| JP | 2008198801 A | 8/2008 |
| JP | 2008270729 A | 11/2008 |
| JP | 2008270736 | 11/2008 |
| JP | 2009016184 A | 1/2009 |
| JP | 2009016579 | 1/2009 |
| JP | 2009032977 A | 2/2009 |
| JP | 2009032988 A | 2/2009 |
| JP | 2009076509 | 4/2009 |
| JP | 2009161524 A | 7/2009 |
| JP | 2009266943 A | 11/2009 |
| JP | 2009267171 A | 11/2009 |
| JP | 2009267244 A | 11/2009 |
| JP | 2009272339 A | 11/2009 |
| JP | 2009283891 A | 12/2009 |
| JP | 2010135689 A | 6/2010 |
| JP | 2010171205 A | 8/2010 |
| JP | 2011071452 A | 4/2011 |
| JP | 2012079895 A | 4/2012 |
| JP | 2012079898 A | 4/2012 |
| JP | 5604505 | 9/2012 |
| JP | 2012522843 | 9/2012 |
| JP | 2012207231 A | 10/2012 |
| JP | 2012222255 A | 11/2012 |
| JP | 2012231135 A | 11/2012 |
| JP | 2013023500 A | 2/2013 |
| JP | 2013048256 A | 3/2013 |
| JP | 2013053149 A | 3/2013 |
| JP | 2013525436 | 6/2013 |
| JP | 2014019701 A | 2/2014 |
| JP | 2014058504 A | 4/2014 |
| JP | 2014221807 A | 11/2014 |
| JP | 2014239225 A | 12/2014 |
| JP | 2015081257 A | 4/2015 |
| KR | 20060015371 | 2/2006 |
| KR | 20060115371 | 11/2006 |
| KR | 20070061830 | 6/2007 |
| KR | 20070112465 | 11/2007 |
| KR | 20130043460 | 4/2013 |
| TW | 200701835 | 1/2007 |
| TW | 201307365 A | 2/2013 |
| TW | 201710277 | 3/2017 |
| WO | 0070655 A2 | 11/2000 |
| WO | 2000070655 | 11/2000 |
| WO | 2004003108 | 1/2004 |
| WO | 2004108857 | 12/2004 |
| WO | 2005042444 A2 | 5/2005 |
| WO | 2005042550 A1 | 5/2005 |
| WO | 2005113704 | 12/2005 |
| WO | 2006033440 A1 | 3/2006 |
| WO | 2006098505 A1 | 9/2006 |
| WO | 2006115299 A1 | 11/2006 |
| WO | 2006115301 | 11/2006 |
| WO | 2007034985 A1 | 3/2007 |
| WO | 2007069498 A1 | 6/2007 |
| WO | 2008066192 A1 | 6/2008 |
| WO | 2008066195 A1 | 6/2008 |
| WO | 2008066196 A1 | 6/2008 |
| WO | 2008117889 | 10/2008 |
| WO | 2008123540 | 10/2008 |
| WO | 2009017211 A1 | 2/2009 |
| WO | 2009086209 | 7/2009 |
| WO | 2009111299 | 9/2009 |
| WO | 2010105141 | 9/2010 |
| WO | 2010118026 A2 | 10/2010 |
| WO | 2011137429 A2 | 11/2011 |
| WO | 2011137431 A2 | 11/2011 |
| WO | 2012074909 | 6/2012 |
| WO | 2012112853 A1 | 8/2012 |
| WO | 2012116231 | 8/2012 |
| WO | 2012142387 | 10/2012 |
| WO | 2012162488 A1 | 11/2012 |
| WO | 2012163471 A1 | 12/2012 |
| WO | 2013130483 A1 | 9/2013 |
| WO | 2014016611 | 1/2014 |
| WO | 2014031977 | 2/2014 |
| WO | 2014047616 A1 | 3/2014 |
| WO | 2014109814 | 7/2014 |
| WO | 2015027060 A1 | 2/2015 |
| WO | 2015131158 | 9/2015 |
| WO | 2016025921 A1 | 2/2016 |
| WO | 2016029137 | 2/2016 |
| WO | 2016029186 | 2/2016 |
| WO | 2016197019 | 12/2016 |
| WO | 2018071697 | 4/2018 |
| WO | 2018140765 | 8/2018 |
| WO | 2019079505 | 4/2019 |
| WO | 2019079508 | 4/2019 |
| WO | 2019079509 | 4/2019 |
| WO | 2019236541 | 12/2019 |
| WO | 2020018476 | 1/2020 |

OTHER PUBLICATIONS

Baldo et al., "Highly Efficient Phosphorescent Emission from Organic Electroluminescent Devices," Nature, vol. 395, Sep. 10, 1998, pp. 151-154.

Baldo et al., "Very high-efficiency green organic light-emitting devices based on electrophosphorescence," Applied Physics Letters, vol. 75, No. 1, Jul. 5, 1999, pp. 4-6.

Barry O'Brien et al.: White organic light emitting diodes using Pt-based red, green and blue phosphorescent dopants. Proc. SPIE, vol. 8829, pp. 1-6, Aug. 25, 2013.

Barry O'Brien et al., "High efficiency white organic light emitting diodes employing blue and red platinum emitters," Journal of Photonics for Energy, vol. 4, 2014, p. 043597-1-043597-8.

Brian W. D'Andrade et al., "Controlling Exciton Diffusion in Multilayer White Phosphorescent Organic Light Emitting Devices", Adv. Mater., vol. 14, No. 2, Jan. 16, 2002, pp. 147-151.

Chi et al.; Transition-metal phosphors with cyclometalating ligands: fundamentals and applications, Chemical Society Reviews, vol. 39, No. 2, Feb. 2010, pp. 638-655.

Chi-Ming Che et al. "Photophysical Properties and OLEO Applications of Phosphorescent Platinum(II) Schiff Base Complexes," Chem. Eur. J., vol. 16, 2010, pp. 233-247.

Dileep A. K. Vezzu et al., "Highly Luminescent Tetradentate Bis-Cyclometalated Platinum Complexes: Design, Synthesis, Structure, Photophysics, and Electroluminescence Application," Inorg. Chem., vol. 49, 2010, pp. 5107-5119.

Dorwald; "Side Reactions in Organic Synthesis: A Guide to Successful Synthesis Design," Chapter 1, 2005 Wiley-VCH Verlag GmbH & Co. KGaA, Wienheim, 32 pages.

Eric Turner et al., "Cyclometalated Platinum Complexes with Luminescent Quantum Yields Approaching 100%," Inorg. Chem., 2013, vol. 52, pp. 7344-7351.

Evan L. Williams et al., "Excimer-Based White Phosphorescent Organic Light Emitting Diodes with Nearly 100% Internal Quantum Efficiency," Adv. Mater., vol. 19, 2007, pp. 197-202.

Glauco Ponterini et al., "Comparison of Radiationless Decay Processes in Osmium and Platinum Porphyrins," J. Am. Chem. Soc., vol. 105, No. 14, 1983, pp. 4639-4645.

Guijie Li et al., "Efficient and stable red organic light emitting devices from a tetradentate cyclometalated platinum complex," Organic Electronics, 2014, vol. 15 pp. 1862-1867.

Guijie Li et al., "Modifying Emission Spectral Bandwidth of Phosphorescent Platinum(II) Complexes Through Synthetic Control," Inorg. Chem. 2017, 56, 8244-8256.

Guijie Li et al., Efficient and Stable White Organic Light-Emitting Diodes Employing a Single Emitter, Adv. Mater., 2014, vol. 26, pp. 2931-2936.

Hirohiko Fukagawa et al., "Highly Efficient and Stable Red Phosphorescent Organic Light-Emitting Diodes Using Platinum Complexes," Adv. Mater., 2012, vol. 24, pp. 5099-5103.

(56) References Cited

OTHER PUBLICATIONS

Jan Kalinowski et al., "Light-emitting devices based on organometallic platinum complexes as emitters," Coordination Chemistry Reviews, vol. 255, 2011, pp. 2401-2425.
Jeonghun Kwak et al., "Bright and Efficient Full-Color Colloidal Quantum Dot Light-Emitting Diodes Using an Inverted Device Structure," Nano Letters 12, Apr. 2, 2012, pp. 2362-2366.
Ji Hyun Seo et al., "Efficient blue-green organic light-emitting diodes based on heteroleptic tris-cyclometalated iridium (III) complexes". Thin Solid Films, vol. 517, pp. 1807-1810 (2009).
Jp2009267244, English Translation from EPO, Nov. 2009, 80 pages.
Jp2010135689, English translation from EPO, dated Jun. 2010, 95 pages.
Kai Li et al., "Light-emitting platinum(II) complexes supported by tetradentate dianionic bis(N-heterocyclic carbene) ligands: towards robust blue electrophosphors," Chem. Sci., 2013, vol. 4, pp. 2630-2644.
Ke Feng et al., "Norbornene-Based Copolymers Containing Platinum Complexes and Bis(carbazolyl)benzene Groups in Their Side-Chains," Macromolecules, vol. 42, 2009, pp. 6855-6864.
Maestri et al., "Absorption Spectra and Luminescence Properties of Isomeric Platinum (II) and Palladium (II) Complexes Containing 1,1'-Biphenyldiyl, 2-Phenylpyridine, and 2,2'-Bipyridine as Ligands," Helvetica Chimica Acta, vol. 71, Issue 5, Aug. 10, 1988, pp. 1053-1059.
Marc Lepeltier et al., "Efficient blue green organic light-emitting devices based on a monofluorinated heteroleptic iridium(III) complex," Synthetic Metals, vol. 199, 2015, pp. 139-146.
Murakami; JP 2007324309, English machine translation from EPO, dated Dec. 13, 2007, 89 pages.
Nicholas R. Evans et al., "Triplet Energy Back Transfer in Conjugated Polymers with Pendant Phosphorescent Iridium Complexes," J. Am. Chem. Soc., vol. 128, 2006, pp. 6647-6656.
Pui Keong Chow et al., "Strongly Phosphorescent Palladium(ll) Complexes of Tetradentate Ligands with Mixed Oxygen, Carbon, and Nitrogen Donor Atoms: Photophysics, Photochemistry, and Applications," Angew. Chem. Int. Ed. 2013, 52, 11775-11779.
Pui-Keong Chow et al., "Highly luminescent palladium(ll) complexes with sub-millisecond blue to green phosphorescent excited states. Photocatalysis and highly efficient PSF-OLEDs," Chem. Sci., 2016, 7, 6083-6098.
Russell J. Holmes et al., "Blue and Near-UV Phosphorescence from Iridium Complexes with Cyclometalated Pyrazolyl or N-Heterocyclic Carbene Ligands," Inorganic Chemistry, 2005, vol. 44, No. 22, pp. 7995-8003.
Satake et al., "Interconvertible Cationic and Neutral Pyridinylimidazole η3-Allylpalladium Complexes. Structural Assignment by 1H, 13C, and 15N NMR and X-ray Diffraction", Organometallics, vol. 18, No. 24, 1999, pp. 5108-5111.
Shih-Chun Lo et al. "High-Triplet-Energy Dendrons: Enhancing the Luminescence of Deep Blue Phosphorescent Indium(III) Complexes" J. Am. Chem. Soc.,vol. 131, 2009, pp. 16681-16688.
Shiro Koseki et al., "Spin-orbit coupling analyses of the geometrical effects on phosphorescence in Ir(ppy)3 and its derivatives", J. Phys. Chem. C, vol. 117, pp. 5314-5327 (2013).
Shizuo Tokito et al. "Confinement of triplet energy on phosphorescent molecules for highly-efficient organic blue-light-emitting devices" Applied Physics Letters, vol. 83, No. 3, Jul. 21, 2003, pp. 569-571.
Stefan Bernhard, "The First Six Years: A Report," Department of Chemistry, Princeton University, May 2008, 11 pages.
Stephen R. Forrest, "The path to ubiquitous and low-cost organic electronic appliances on plastic," Nature, vol. 428, Apr. 29, 2004, pp. 911-918.
Steven C. F. Kui et al., "Robust phosphorescent platinum(II) complexes with tetradentate ONCN ligands: high efficiency OLEDs with excellent efficiency stability," Chem. Commun., 2013, vol. 49, pp. 1497-1499.
Steven C. F. Kui et al., "Robust Phosphorescent Platinum(II) Complexes Containing Tetradentate ONCN Ligands: Excimeric Excited State and Application in Organic White-Light-Emitting Diodes," Chem. Eur. J., 2013, vol. 19, pp. 69-73.
Supporting Information: Xiao-Chun Hang et al., "Highly Efficient Blue-Emitting Cyclometalated Platinum(II) Complexes by Judicious Molecular Design," Wiley-VCH 2013, 7 pages.
Tyler Fleetham et al., "Efficient "pure" blue OLEDs employing tetradentate Pt complexes with a narrow spectral bandwidth," Advanced Materials (Weinheim, Germany), Vo. 26, No. 41, 2014, pp. 7116-7121.
Tyler Fleetham et al., "Efficient Red-Emitting Platinum Complex with Long Operational Stability," ACS Appl. Mater. Interfaces 2015, 7, 16240-16246.
U.S. Appl. No. 16/751,561, filed Jan. 24, 2020, has not yet published. Inventor: Li.
U.S. Appl. No. 16/751,586, filed Jan. 24, 2020, has not yet published. Inventor: Li et al.
Vanessa Wood et al., "Colloidal quantum dot light-emitting devices," Nano Reviews 1, Jul. 2010, pp. 5202.
Wong. Challenges in organometallic research—Great opportunity for solar cells and OLEDs. Journal of Organometallic Chemistry 2009, vol. 694, pp. 2644-2647.
Xiao-Chu Hang et al., "Highly Efficient Blue-Emitting Cyclometalated Platinum(II) Complexes by Judicious Molecular Design," Angewandte Chemie, International Edition, vol. 52, Issue 26, Jun. 24, 2013, pp. 6753-6756.
Xiaofan Ren et al., "Ultrahigh Energy Gap Hosts in Deep Blue Organic Electrophosphorescent Devices," Chem. Mater., vol. 16, 2004, pp. 4743-4747.
Ying Yang et al., "Induction of Circularly Polarized Electroluminescence from an Achiral Light-Emitting Polymer via a Chiral Small-Molecule Dopant," Advanced Materials, vol. 25, Issue 18, May 14, 2013, pp. 2624 2628.
Zhi-Qiang Zhu et. al., "Efficient Cyclometalated Platinum(II) Complex with Superior Operational Stability," Adv. Mater. 29 (2017) 1605002, pp. 1-5.
Zhi-Qiang Zhu et.al., "Harvesting All Electrogenerated Excitons through Metal Assisted Delayed Fluorescent Materials," Adv. Mater. 27 (2015) 2533-2537.

* cited by examiner

METAL-ASSISTED DELAYED FLUORESCENT MATERIALS AS CO-HOST MATERIALS FOR FLUORESCENT OLEDS

CROSS-REFERENCE TO RELATED APPLICATION

This application is a continuation of, and claims priority to, U.S. patent application Ser. No. 16/288,350, filed Feb. 28, 2019, now allowed, which is a continuation of U.S. patent application Ser. No. 15/925,203, filed on Mar. 19, 2018, now U.S. Pat. No. 10,294,417, which is a continuation of U.S. patent application Ser. No. 15/505,544 filed on Feb. 21, 2017, now U.S. Pat. No. 9,920,242, which is a U.S. National Phase Application of International Patent Application No. PCT/US2015/046419 filed on Aug. 21, 2015, which claims the benefit of U.S. Provisional Application Ser. No. 62/040,727 filed on Aug. 22, 2014, the contents of all of which are incorporated herein by reference in their entirety.

TECHNICAL FIELD

This disclosure relates to organic light emitting diodes (OLEDs), and more particularly to OLEDs with emissive layers including metal-assisted delayed fluorescent (MADF) emitters and fluorescent emitters.

BACKGROUND

Organic light emitting devices (OLEDs) are typically multilayer devices which upon an applied voltage are capable emitting light from the radiative relaxation of an excited state located on an organic material. OLEDs have found widespread application as an alternative to liquid crystal displays (LCDs) for handheld devices or flat panel displays. Furthermore, OLEDs have shown promise as next generation solid state white lighting, use in medical devices, and as infrared emitters for communication applications. The use of organic materials presents a number of unique benefits including: compatibility with flexible substrates, capabilities for large scale production, and simplified tuning of the emission properties through molecular modification.

FIG. 1 depicts a cross-sectional view of an OLED 100. OLED 100 includes substrate 102, anode 104, hole-transporting material(s) (HTL) 106, light processing material (EML) 108, electron-transporting material(s) (ETL) 110, and a metal cathode layer 112. Anode 104 may be indium tin oxide (ITO). Light processing material 108 may be an emissive material (EML) including an emitter and a host. A typical OLED device includes at least one transparent electrode through which light is emitted. For example, OLEDs that emit through the bottom substrate typically contain a transparent conductive oxide material, such as indium tin oxide, as an anode, while at the cathode a reflective metal is typically used. Alternatively, devices may emit from the top through a thin metal layer as the cathode while having an either opaque or transparent anode layer. In this way it is possible to have dual emission from both top and bottom if such a device is so desired and furthermore it is possible for these OLEDs to be transparent. Sandwiched between the electrodes is typically a multilayer organic stack. A multilayer organic stack typically includes a single layer of hole-transporting materials (HTL), a single layer of emissive materials (EML) including emitters and hosts, a single layer of electron-transporting materials (ETL) and a layer of metal cathode, as depicted in FIG. 1.

For each of the transport layers care must be taken to optimize the separate process of facilitating charge injection, having efficient charge transport, and confining the charges and excitons in a specified emissive region (typically the emissive layer). Such a process can be achieved through either a single material or through a multilayer stack which may separate the injection, transport, charge confining, and exciton confining tasks. The emissive layer may be composed of a single emissive material, a single emissive material dispersed in a host matrix material, multiple emissive materials dispersed in a host matrix, or any number of emissive materials dispersed in multiple host materials. The host materials are typically chosen carefully to not quench the excited state of the emitter as well as to provide appropriate distribution of charges and excitons within the emissive layer. The emission color of the OLED is determined by the emission energy (optical energy gap) of emitters.

Light is generated in OLEDs through the formation of excited states from separately injected electrons and holes to form an exciton, located on the organic material. Due to the uncorrelated nature of the injected charges, excitons with total spin of 0 and 1 are possible. Spin 0 excitons are denoted singlets, while spin 1 excitons are denoted triplets, reflecting their respective degeneracies. Due to the selection rules for radiative transitions, the symmetry of the excited state and the ground state must be the same. Since the ground state of most molecules are antisymmetric, radiative relaxation of the symmetric triplet excited state is typically disallowed. As such, emission from the triplet state, called phosphorescence, is slow and the transition probability is low. However emission from the singlet state, called fluorescence, can be rapid and consequently efficient. Nevertheless, statistically there is only 1 singlet exciton for every 3 triplet excitons formed. There are very few fluorescent emitters which exhibit emission from the triplet state at room temperature, so 75% of the generated excitons are wasted in most fluorescent emitters. However, emission from the triplet state can be facilitated through spin orbit coupling which incorporates a heavy metal atom in order to perturb the triplet state and add in some singlet character to and achieve a higher probability of radiative relaxation.

Some efficient emitters include heavy metals such as Ir, Pt, Pd, Au, Os, Rh, and Ru, which can emit efficiently across the visible spectrum. Thus, due to their typically high efficiencies, phosphorescent OLEDs (i.e. OLEDs with phosphorescent materials as emitters) have been a mainstay in OLED development. Recently, OLEDs with electron to photon conversion efficiencies near 100% across the visible spectrum have been demonstrated. However, there remains a deficit of efficient phosphorescent emissive materials that also demonstrate long operational stability in a device setting, particularly in the blue region. Fluorescent OLEDs (i.e., OLEDs with fluorescent materials as emitters), on the other hand, have found widespread use in devices with long operational lifetime. Furthermore, fluorescent emitters typically do not contain precious metals and are not affected by triplet-triplet annihilation which degrades device performance at high current densities.

SUMMARY

In a general aspect, a light emitting device includes a first electrode, a hole transporting layer in contact with the first electrode, a second electrode, an electron transporting layer in contact with the second electrode; and an emissive layer between the hole transporting layer and the electron transporting layer. The emissive layer includes a metal-assisted delayed fluorescent (MADF) emitter, a fluorescent emitter, and a host, and the MADF emitter harvests electrogenerated excitons and transfers energy to the fluorescent emitter.

Certain implementations may include one or more of the following features. In some cases, the emissive layer is a single layer including the host, the MADF emitter, and the fluorescent emitter. The MADF emitter may include a luminophore with a five- or six-membered chelation ring. In certain cases, the emissive layer includes n emitter layers including the host and the fluorescent emitter, and m donor layers including the host and the MADF emitter, where n and m are integers ≥1. In some cases, n=m, n=m+1, or m=n+1. Each emitter layer may be adjacent to at least one donor layer.

The devices described herein include fluorescent and MADF emitters in order to harvest all or substantially all of electrogenerated singlet and triplet excitons for fluorescent OLEDs to achieve high device operational stability while maintaining the high efficiency characteristic of OLEDs.

Thus, particular embodiments have been described. Variations, modifications, and enhancements of the described embodiments and other embodiments can be made based on what is described and illustrated. In addition, one or more features of one or more embodiments may be combined. The details of one or more implementations and various features and aspects are set forth in the accompanying drawings, the description, and the claims below.

DETAILED DESCRIPTION

Figure 1:
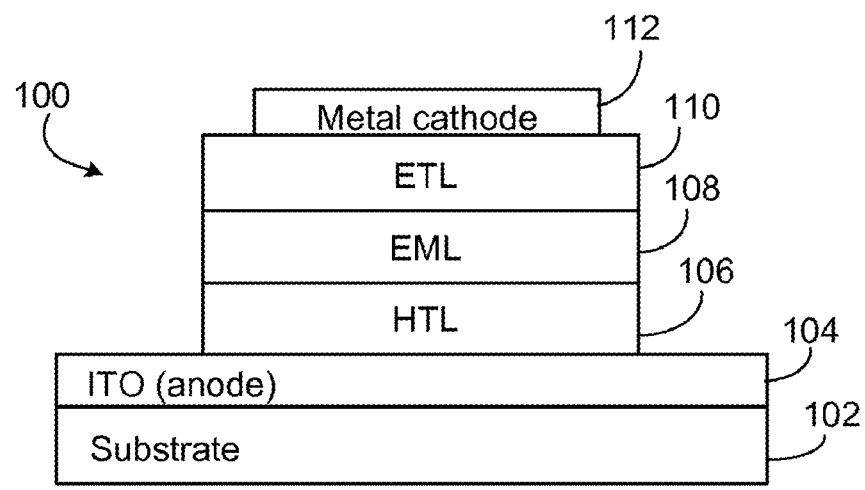
FIG. 1 depicts an OLED.

The present disclosure can be understood more readily by reference to the following detailed description and the Examples included therein.

Before the present compounds, devices, and/or methods are disclosed and described, it is to be understood that they are not limited to specific synthetic methods unless otherwise specified, or to particular reagents unless otherwise specified, as such can, of course, vary. It is also to be understood that the terminology used herein is for the purpose of describing particular aspects only and is not intended to be limiting. Although any methods and materials similar or equivalent to those described herein can be used in the practice or testing of compounds of the present disclosure, example methods and materials are now described.

As used in the specification and the appended claims, the singular forms "a", "an", and "the" include plural referents unless the context clearly dictates otherwise. Thus, for example, reference to "a component" includes mixtures of two or more components.

As used herein, the terms "optional" or "optionally" means that the subsequently described event or circumstance can or cannot occur, and that the description includes instances where said event or circumstance occurs and instances where it does not.

Disclosed are the components to be used to prepare the compositions of this disclosure as well as the compositions themselves to be used within the methods disclosed herein. These and other materials are disclosed herein, and it is understood that when combinations, subsets, interactions, groups, etc. of these materials are disclosed that while specific reference of each various individual and collective combinations and permutation of these compounds cannot be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B—F, C-D, C-E, and C—F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions disclosed herein. Thus, if there are a variety of additional steps that can be performed it is understood that each of these additional steps can be performed with any specific embodiment or combination of embodiments of the methods described herein.

As referred to herein, a linking atom or group connects two atoms such as, for example, an N atom and a C atom. A linking atom or group is in one aspect disclosed as $L^1$, $L^2$, $L^3$, etc. herein. The linking atom can optionally, if valency permits, have other chemical moieties attached. For example, in one aspect, an oxygen would not have any other chemical groups attached as the valency is satisfied once it is bonded to two groups (e.g., N and/or C groups). In another aspect, when carbon is the linking atom, two additional chemical moieties can be attached to the carbon. Suitable chemical moieties include amine, amide, thiol, aryl, heteroaryl, cycloalkyl, and heterocyclyl moieties. The term "cyclic structure" or the like terms used herein refer to any cyclic chemical structure which includes, but is not limited to, aryl, heteroaryl, cycloalkyl, cycloalkenyl, heterocyclyl, carbene, and N-heterocyclic carbene.

As used herein, the term "substituted" is contemplated to include all permissible substituents of organic compounds. In a broad aspect, the permissible substituents include acyclic and cyclic, branched and unbranched, carbocyclic and heterocyclic, and aromatic and nonaromatic substituents of organic compounds. Illustrative substituents include, for example, those described below. The permissible substituents can be one or more and the same or different for appropriate organic compounds. For purposes of this disclosure, the heteroatoms, such as nitrogen, can have hydrogen substituents and/or any permissible substituents of organic compounds described herein which satisfy the valences of the heteroatoms. This disclosure is not intended to be limited in any manner by the permissible substituents of organic compounds. Also, the terms "substitution" or "substituted with" include the implicit proviso that such substitution is in accordance with permitted valence of the substituted atom and the substituent, and that the substitution results in a stable compound, e.g., a compound that does not spontaneously undergo transformation such as by rearrangement, cyclization, elimination, etc. It is also contemplated that, in certain aspects, unless expressly indicated to the contrary, individual substituents can be further optionally substituted (i.e., further substituted or unsubstituted).

In defining various terms, "$A^1$", "$A^2$", "$A^3$", "$A^4$" and "$A^5$" are used herein as generic symbols to represent various specific substituents. These symbols can be any substituent, not limited to those disclosed herein, and when they are defined to be certain substituents in one instance, they can, in another instance, be defined as some other substituents.

The term "alkyl" as used herein is a branched or unbranched saturated hydrocarbon group of 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dodecyl, tetradecyl, hexadecyl, eicosyl, tetracosyl, and the like. The alkyl group can be cyclic or acyclic. The alkyl group can be branched or unbranched. The alkyl group can also be substituted or unsubstituted. For example, the alkyl group can be substituted with one or more groups including, but not limited to, alkyl, cycloalkyl, alkoxy, amino, ether, halide, hydroxy, nitro, silyl, sulfo-oxo, or thiol, as described herein. A "lower alkyl" group is an alkyl group containing from one to six (e.g., from one to four) carbon atoms.

Throughout the specification "alkyl" is generally used to refer to both unsubstituted alkyl groups and substituted alkyl groups; however, substituted alkyl groups are also specifically referred to herein by identifying the specific substituent(s) on the alkyl group. For example, the term "halogenated alkyl" or "haloalkyl" specifically refers to an alkyl group that is substituted with one or more halide, e.g., fluorine, chlorine, bromine, or iodine. The term "alkoxyalkyl" specifically refers to an alkyl group that is substituted with one or more alkoxy groups, as described below. The term "alkylamino" specifically refers to an alkyl group that is substituted with one or more amino groups, as described below, and the like. When "alkyl" is used in one instance and a specific term such as "alkylalcohol" is used in another, it is not meant to imply that the term "alkyl" does not also refer to specific terms such as "alkylalcohol" and the like.

This practice is also used for other groups described herein. That is, while a term such as "cycloalkyl" refers to both unsubstituted and substituted cycloalkyl moieties, the substituted moieties can, in addition, be specifically identified herein; for example, a particular substituted cycloalkyl can be referred to as, e.g., an "alkylcycloalkyl." Similarly, a substituted alkoxy can be specifically referred to as, e.g., a "halogenated alkoxy," a particular substituted alkenyl can be, e.g., an "alkenylalcohol," and the like. Again, the practice of using a general term, such as "cycloalkyl," and a specific term, such as "alkylcycloalkyl," is not meant to imply that the general term does not also include the specific term.

The term "cycloalkyl" as used herein is a non-aromatic carbon-based ring composed of at least three carbon atoms. Examples of cycloalkyl groups include, but are not limited to, cyclopropyl, cyclobutyl, cyclopentyl, cyclohexyl, norbornyl, and the like. The term "heterocycloalkyl" is a type of cycloalkyl group as defined above, and is included within the meaning of the term "cycloalkyl," where at least one of the carbon atoms of the ring is replaced with a heteroatom such as, but not limited to, nitrogen, oxygen, sulfur, or phosphorus. The cycloalkyl group and heterocycloalkyl group can be substituted or unsubstituted. The cycloalkyl group and heterocycloalkyl group can be substituted with one or more groups including, but not limited to, alkyl, cycloalkyl, alkoxy, amino, ether, halide, hydroxy, nitro, silyl, sulfo-oxo, or thiol as described herein.

The term "polyalkylene group" as used herein is a group having two or more $CH_2$ groups linked to one another. The polyalkylene group can be represented by the formula —$(CH_2)_a$—, where "a" is an integer of from 2 to 500.

The terms "alkoxy" and "alkoxyl" as used herein to refer to an alkyl or cycloalkyl group bonded through an ether linkage; that is, an "alkoxy" group can be defined as —$OA^1$ where $A^1$ is alkyl or cycloalkyl as defined above. "Alkoxy" also includes polymers of alkoxy groups as just described; that is, an alkoxy can be a polyether such as —$OA^1$-$OA^2$ or —$OA^1$-$(OA^2)_a$-$OA^3$, where "a" is an integer of from 1 to 200 and $A^1$, $A^2$, and $A^3$ are alkyl and/or cycloalkyl groups.

The term "alkenyl" as used herein is a hydrocarbon group of from 2 to 24 carbon atoms with a structural formula containing at least one carbon-carbon double bond. Asymmetric structures such as $(A^1A^2)C=C(A^3A^4)$ are intended to include both the E and Z isomers. This can be presumed in structural formulae herein wherein an asymmetric alkene is present, or it can be explicitly indicated by the bond symbol C=C. The alkenyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol, as described herein.

The term "cycloalkenyl" as used herein is a non-aromatic carbon-based ring composed of at least three carbon atoms and containing at least one carbon-carbon double bound, i.e., C=C. Examples of cycloalkenyl groups include, but are not limited to, cyclopropenyl, cyclobutenyl, cyclopentenyl, cyclopentadienyl, cyclohexenyl, cyclohexadienyl, norbornenyl, and the like. The term "heterocycloalkenyl" is a type of cycloalkenyl group as defined above, and is included within the meaning of the term "cycloalkenyl," where at least one of the carbon atoms of the ring is replaced with a heteroatom such as, but not limited to, nitrogen, oxygen, sulfur, or phosphorus. The cycloalkenyl group and heterocycloalkenyl group can be substituted or unsubstituted. The cycloalkenyl group and heterocycloalkenyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein.

The term "alkynyl" as used herein is a hydrocarbon group of 2 to 24 carbon atoms with a structural formula containing at least one carbon-carbon triple bond. The alkynyl group can be unsubstituted or substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol, as described herein.

The term "cycloalkynyl" as used herein is a non-aromatic carbon-based ring composed of at least seven carbon atoms and containing at least one carbon-carbon triple bound. Examples of cycloalkynyl groups include, but are not limited to, cycloheptynyl, cyclooctynyl, cyclononynyl, and the like. The term "heterocycloalkynyl" is a type of cycloalkenyl group as defined above, and is included within the meaning of the term "cycloalkynyl," where at least one of the carbon atoms of the ring is replaced with a heteroatom such as, but not limited to, nitrogen, oxygen, sulfur, or phosphorus. The cycloalkynyl group and heterocycloalkynyl group can be substituted or unsubstituted. The cycloalkynyl group and heterocycloalkynyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein.

The term "aryl" as used herein is a group that contains any carbon-based aromatic group including, but not limited to, benzene, naphthalene, phenyl, biphenyl, phenoxybenzene, and the like. The term "aryl" also includes "heteroaryl," which is defined as a group that contains an aromatic group that has at least one heteroatom incorporated within the ring of the aromatic group. Examples of heteroatoms include, but are not limited to, nitrogen, oxygen, sulfur, and phosphorus. Likewise, the term "non-heteroaryl," which is also included in the term "aryl," defines a group that contains an aromatic group that does not contain a heteroatom. The aryl group can be substituted or unsubstituted. The aryl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein. The term "biaryl" is a specific type of aryl group and is included in the definition of "aryl." Biaryl refers to two aryl groups that are bound together via a fused ring structure, as in naphthalene, or are attached via one or more carbon-carbon bonds, as in biphenyl.

The term "aldehyde" as used herein is represented by the formula —C(O)H. Throughout this specification "C(O)" is a short hand notation for a carbonyl group, i.e., C=O.

The terms "amine" or "amino" as used herein are represented by the formula —$NA^1A^2$, where $A^1$ and $A^2$ can be, independently, hydrogen or alkyl, cycloalkyl, alkenyl, cycloalkenyl, alkynyl, cycloalkynyl, aryl, or heteroaryl group as described herein.

The term "alkylamino" as used herein is represented by the formula —NH(-alkyl) where alkyl is a described herein. Representative examples include, but are not limited to, methylamino group, ethylamino group, propylamino group, isopropylamino group, butylamino group, isobutylamino group, (sec-butyl)amino group, (tert-butyl)amino group, pentylamino group, isopentylamino group, (tert-pentyl) amino group, hexylamino group, and the like.

The term "dialkylamino" as used herein is represented by the formula —N(-alkyl)$_2$ where alkyl is a described herein. Representative examples include, but are not limited to, dimethylamino group, diethylamino group, dipropylamino group, diisopropylamino group, dibutylamino group, diisobutylamino group, di(sec-butyl)amino group, di(tert-butyl)amino group, dipentylamino group, diisopentylamino group, di(tert-pentyl)amino group, dihexylamino group, N-ethyl-N-methylamino group, N-methyl-N-propylamino group, N-ethyl-N-propylamino group and the like.

The term "carboxylic acid" as used herein is represented by the formula —C(O)OH.

The term "ester" as used herein is represented by the formula —OC(O)$A^1$ or —C(O)O$A^1$, where $A^1$ can be alkyl, cycloalkyl, alkenyl, cycloalkenyl, alkynyl, cycloalkynyl, aryl, or heteroaryl group as described herein. The term "polyester" as used herein is represented by the formula -($A^1$O(O)C-$A^2$-C(O)O)$_a$— or -($A^1$O(O)C-$A^2$—OC(O))$_a$—, where $A^1$ and $A^2$ can be, independently, an alkyl, cycloalkyl, alkenyl, cycloalkenyl, alkynyl, cycloalkynyl, aryl, or heteroaryl group described herein and "a" is an integer from 1 to 500. "Polyester" is as the term used to describe a group that is produced by the reaction between a compound having at least two carboxylic acid groups with a compound having at least two hydroxyl groups.

The term "ether" as used herein is represented by the formula $A^1$O$A^2$, where $A^1$ and $A^2$ can be, independently, an alkyl, cycloalkyl, alkenyl, cycloalkenyl, alkynyl, cycloalkynyl, aryl, or heteroaryl group described herein. The term "polyether" as used herein is represented by the formula -($A^1$O-$A^2$O)$_a$—, where $A^1$ and $A^2$ can be, independently, an alkyl, cycloalkyl, alkenyl, cycloalkenyl, alkynyl, cycloalkynyl, aryl, or heteroaryl group described herein and "a" is an integer of from 1 to 500. Examples of polyether groups include polyethylene oxide, polypropylene oxide, and polybutylene oxide.

The term "polymeric" includes polyalkylene, polyether, polyester, and other groups with repeating units, such as, but not limited to —(CH$_2$O)$_n$—CH$_3$, —(CH$_2$CH$_2$O)$_n$—CH$_3$, —[CH$_2$CH(CH$_3$)]$_n$—CH$_3$, —[CH$_2$CH(COOCH$_3$)]$_n$—CH$_3$, —[CH$_2$CH(COO CH$_2$CH$_3$)]$_n$—CH$_3$, and —[CH$_2$CH (COO$^t$Bu)]$_n$—CH$_3$, where n is an integer (e.g., n>1 or n>2).

The term "halide" as used herein refers to the halogens fluorine, chlorine, bromine, and iodine.

The term "heterocyclyl," as used herein refers to single and multi-cyclic non-aromatic ring systems and "heteroaryl as used herein refers to single and multi-cyclic aromatic ring systems: in which at least one of the ring members is other than carbon. The terms includes azetidine, dioxane, furan, imidazole, isothiazole, isoxazole, morpholine, oxazole, oxazole, including, 1,2,3-oxadiazole, 1,2,5-oxadiazole and 1,3, 4-oxadiazole, piperazine, piperidine, pyrazine, pyrazole, pyridazine, pyridine, pyrimidine, pyrrole, pyrrolidine, tetrahydrofuran, tetrahydropyran, tetrazine, including 1,2,4,5-tetrazine, tetrazole, including 1,2,3,4-tetrazole and 1,2,4,5-tetrazole, thiadiazole, including, 1,2,3-thiadiazole, 1,2,5-thiadiazole, and 1,3,4-thiadiazole, thiazole, thiophene, triazine, including 1,3,5-triazine and 1,2,4-triazine, triazole, including, 1,2,3-triazole, 1,3,4-triazole, and the like.

The term "hydroxyl" as used herein is represented by the formula —OH.

The term "ketone" as used herein is represented by the formula $A^1$C(O)$A^2$, where $A^1$ and $A^2$ can be, independently, an alkyl, cycloalkyl, alkenyl, cycloalkenyl, alkynyl, cycloalkynyl, aryl, or heteroaryl group as described herein.

The term "azide" as used herein is represented by the formula —N$_3$.

The term "nitro" as used herein is represented by the formula —NO$_2$.

The term "nitrile" as used herein is represented by the formula —CN.

The term "silyl" as used herein is represented by the formula —SiA$^1$A$^2$A$^3$, where A$^1$, A$^2$, and A$^3$ can be, independently, hydrogen or an alkyl, cycloalkyl, alkoxy, alkenyl, cycloalkenyl, alkynyl, cycloalkynyl, aryl, or heteroaryl group as described herein.

The term "sulfo-oxo" as used herein is represented by the formulas —S(O)A$^1$, —S(O)$_2$A$^1$, —OS(O)$_2$A$^1$, or —OS(O)$_2$OA$^1$, where A$^1$ can be hydrogen or an alkyl, cycloalkyl, alkenyl, cycloalkenyl, alkynyl, cycloalkynyl, aryl, or heteroaryl group as described herein. Throughout this specification "S(O)" is a short hand notation for S═O. The term "sulfonyl" is used herein to refer to the sulfo-oxo group represented by the formula —S(O)$_2$A$^1$, where A$^1$ can be hydrogen or an alkyl, cycloalkyl, alkenyl, cycloalkenyl, alkynyl, cycloalkynyl, aryl, or heteroaryl group as described herein. The term "sulfone" as used herein is represented by the formula A$^1$S(O)$_2$A$^2$, where A$^1$ and A$^2$ can be, independently, an alkyl, cycloalkyl, alkenyl, cycloalkenyl, alkynyl, cycloalkynyl, aryl, or heteroaryl group as described herein. The term "sulfoxide" as used herein is represented by the formula A$^1$S(O)A$^2$, where A$^1$ and A$^2$ can be, independently, an alkyl, cycloalkyl, alkenyl, cycloalkenyl, alkynyl, cycloalkynyl, aryl, or heteroaryl group as described herein.

The term "thiol" as used herein is represented by the formula —SH.

"R," "R$^1$," "R$^2$," "R$^3$," "R$^n$," where n is an integer, as used herein can, independently, possess one or more of the groups listed above. For example, if R$^1$ is a straight chain alkyl group, one of the hydrogen atoms of the alkyl group can optionally be substituted with a hydroxyl group, an alkoxy group, an alkyl group, a halide, and the like. Depending upon the groups that are selected, a first group can be incorporated within second group or, alternatively, the first group can be pendant (i.e., attached) to the second group. For example, with the phrase "an alkyl group comprising an amino group," the amino group can be incorporated within the backbone of the alkyl group. Alternatively, the amino group can be attached to the backbone of the alkyl group. The nature of the group(s) that is (are) selected will determine if the first group is embedded or attached to the second group.

Compounds described herein may contain "optionally substituted" moieties. In general, the term "substituted," whether preceded by the term "optionally" or not, means that one or more hydrogens of the designated moiety are replaced with a suitable substituent. Unless otherwise indicated, an "optionally substituted" group may have a suitable substituent at each substitutable position of the group, and when more than one position in any given structure may be substituted with more than one substituent selected from a specified group, the substituent may be either the same or different at every position. Combinations of substituents envisioned by this disclosure are preferably those that result in the formation of stable or chemically feasible compounds. In is also contemplated that, in certain aspects, unless expressly indicated to the contrary, individual substituents can be further optionally substituted (i.e., further substituted or unsubstituted).

In some aspects, a structure of a compound can be represented by a formula:

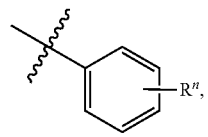

which is understood to be equivalent to a formula:

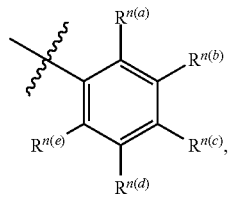

wherein n is typically an integer. That is, R$^n$ is understood to represent up to five independent non-hydrogen substituents, R$^{n(a)}$, R$^{n(b)}$, R$^{n(c)}$, R$^{n(d)}$, R$^{n(e)}$. By "independent substituents," it is meant that each R substituent can be independently defined. For example, if in one instance R$^{n(a)}$ is halogen, then R$^{n(b)}$ is not necessarily halogen in that instance.

Several references to R, R$^1$, R$^2$, R$^3$, R$^4$, R$^5$, R$^6$, etc. are made in chemical structures and moieties disclosed and described herein. Any description of R, R$^1$, R$^2$, R$^3$, R$^4$, R$_5$, R$^6$, etc. in the specification is applicable to any structure or moiety reciting R, R$^1$, R$^2$, R$^3$, R$^4$, R$^5$, R$^6$, etc. respectively.

OLEDs described herein use metal-assisted delayed fluorescent (MADF) emitters for efficient exciton harvesting while emitting primarily from stable fluorescent emitters in order to enhance the device operational lifetime. To achieve this, both MADF emitters and fluorescent emitters are present in the EML, and energy transfer occurs between the MADF and fluorescent materials. Two major mechanisms for exciton transport exist, namely Dexter energy transfer and Förster resonant energy transfer (FRET) mechanisms. Dexter energy transfer is a short range transport which consists of consecutive hopping of excitons between neighboring molecules and depends on the orbital overlap between the molecules. FRET is a long range transport process in which dipole coupling between an excited donor molecule (D) and a ground state acceptor molecule (A) leads to a long range non-radiative transfer. This process depends on the overlap between the emission profile of D and the absorption of A. This transfer mechanism requires an allowed relaxation transition of the donor molecule and an allowed excitation mechanism of the acceptor molecules. As such, FRET typically occurs between singlet excitons. However, if the phosphorescent emission process of the donor molecule is efficient, transfer between the triplet of the donor molecule and the singlet of the acceptor molecule is also possible, The stability of blue phosphorescent OLEDs has remained as a great technical challenge for OLED displays and lighting applications. If triplet emitters are less stable than singlet emitters with the same emission energy, the relocation of excitons from triplet emitters to known stable blue singlet emitters may improve the device operational stability. Thus, a process may occur, such as that depicted in FIG. 2, in which the excitons are formed on a MADF donor material which can then transfer via FRET to a fluorescent acceptor material and emit with high efficiency. Such a process would maintain the 100% utilization of electrogenerated excitons while emitting primarily from the fluorescent emitter to achieve high stability and avoid triplet-triplet annihilation. As an added benefit, the color quality of EL spectra of devices will also improve if the emission originated solely from the narrow band fluorescent emitters.

Figure 2:
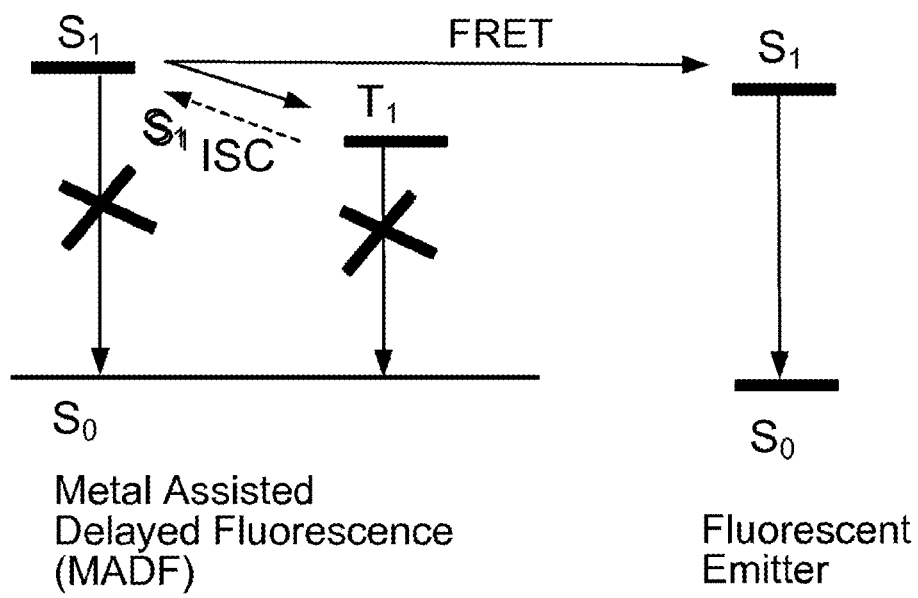
FIG. 2 depicts an energy transfer process inside an emissive layer for the fluorescent OLEDs described herein.
Figure 3:
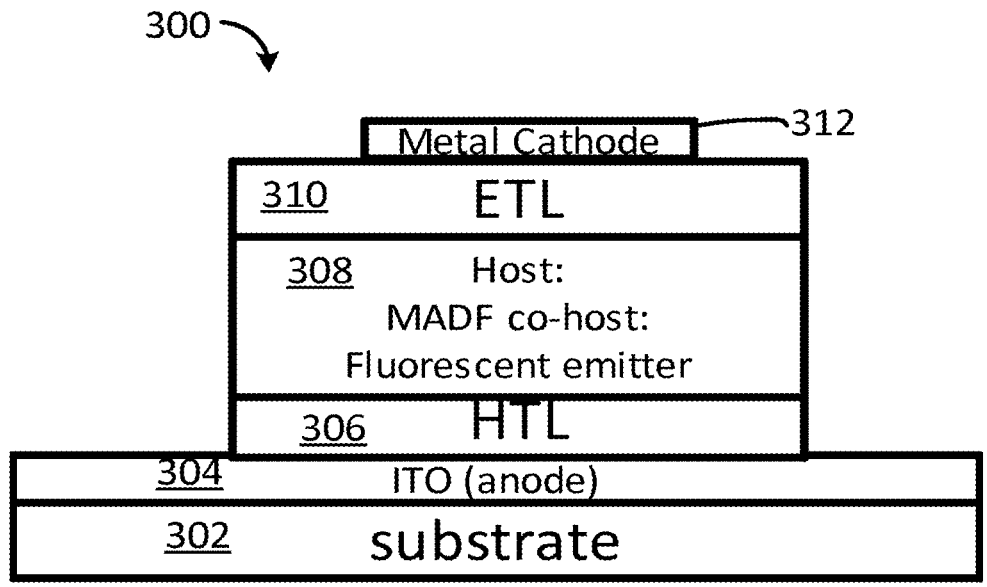
FIG. 3 depicts an OLED with an emissive layer including a mixture of MADF emitter and fluorescent emitter dispersed within a host matrix.
Figure 4:
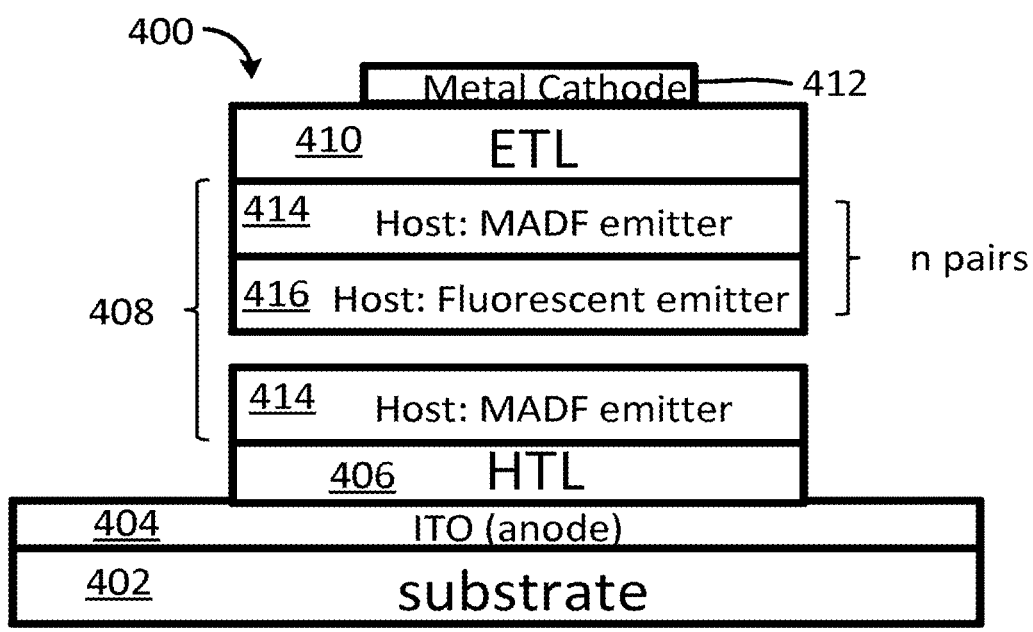
FIG. 4 depicts an OLED with alternating fluorescent and MADF doped layers.

MADF materials may be used to develop efficient and stable materials with potential triplet energy in the "green" region. However, typical MADF materials have disadvantages, including a long triplet lifetime, a large roll-off in the device settings and portion of triplet emission in the green region to affect the EL color. These disadvantages may be overcome if an effective Förster resonance energy transfer (FRET) process occurs between MADF and fluorescent emitters. This can be achieved by harvesting the electrogenerated excitons with a phosphorescent material then transferring the energy to a fluorescent emitter through a FRET mechanism. Two methods of creating such a system include: 1) a single emissive layer containing both the MADF emitter and the fluorescent emitter doped into a host matrix, as depicted in FIG. 3, and 2) an emissive layer containing alternating fluorescent and MADF doped layers, as depicted in FIG. 4. In both cases there are constraints on the suitable materials. First, the emission spectrum of the MADF donor must have spectral overlap with the absorption spectrum of the fluorescent emitter in order for the FRET process to occur. Additionally, the photoluminescent quantum yield of the MADF material must be high enough to ensure that the dipole relaxation in the FRET process can occur with high efficiency. Similarly, the photoluminescent quantum yield of the fluorescent emitter must be high enough to ensure efficient emission.

The first case, depicted in FIG. 3, includes OLED device 300. Device 300 includes substrate 302, anode 304, HTL 306, EML 308, ETL 310, and cathode 312. EML 308 includes a MADF donor material and a fluorescent emitter dispersed within a host matrix. In such a case where both the MADF and fluorescent materials exist within the same layer, care must be taken to avoid direct formation of excitons on the fluorescent emitter (which can only harvest singlet excitons) to ensure that all (100%) or substantially all of the electrogenerated excitons are utilized. On the other hand, the concentration of the fluorescent emitter must be high enough for there to close proximity between the MADF material and the fluorescent emitter so that rapid transfer from the MADF donor to the fluorescent emitter can be achieved and direct triplet emission or triplet-triplet annihilation can be avoided.

The second case, depicted in FIG. 4, includes OLED device 400. Device 400 includes substrate 402, anode 404, HTL 406, EML 408, ETL 410, and cathode 412. EML 408 includes alternating MADF doped layers 414 and fluorescent doped layers 416. MADF emitter layer 414 and fluorescent emitter layer 416 alternate and are present in pairs (e.g., n pairs, where n is an integer such as 1, 2, 3, or the like). In FIG. 4, a space is depicted between layer 416 and one of layers 414 for clarity.

In some implementations, the emissive layer includes n emitter layers including the host and the fluorescent emitter, and m donor layers including the host and the MADF emitter, where n and m are integers ≥1. In some implementations, n=m, n=m+1, or m=n+1. Each emitter layer may be adjacent to at least one donor layer.

In device 400, the thickness and location of the layers must be tuned to ensure that exciton formation primarily occurs in the region that is doped with the MADF material. Furthermore, the region that contains the fluorescent doped layer should be close enough to the exciton formation zone so that the fluorescent emitters are within the distance for FRET to occur.

Metal-assisted delayed fluorescent emitters for devices described herein include MADF emitters (a) and (b) shown below:

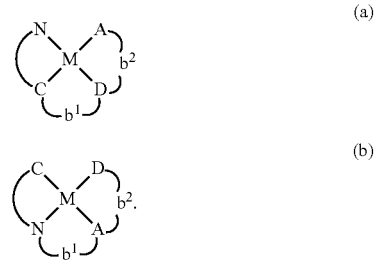

wherein:

M is platinum (II), palladium (II), nickel (II), manganese (II), zinc (II), gold (III), silver (III), copper (III), iridium (I), rhodium (I), or cobalt (I);

A is an accepting group having one of the following structures, which can optionally be substituted:

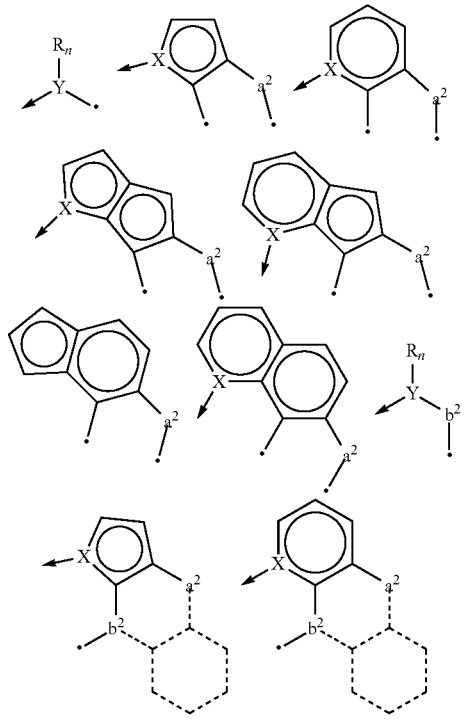

D is a donor group having one of the following structures, which can optionally be substituted:

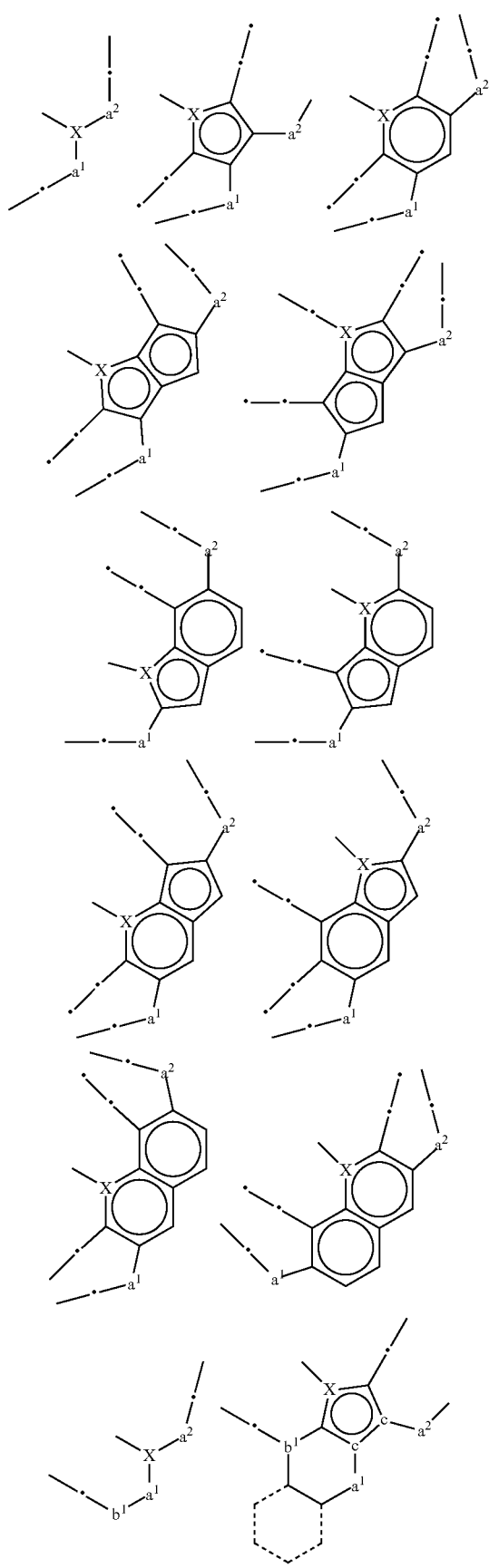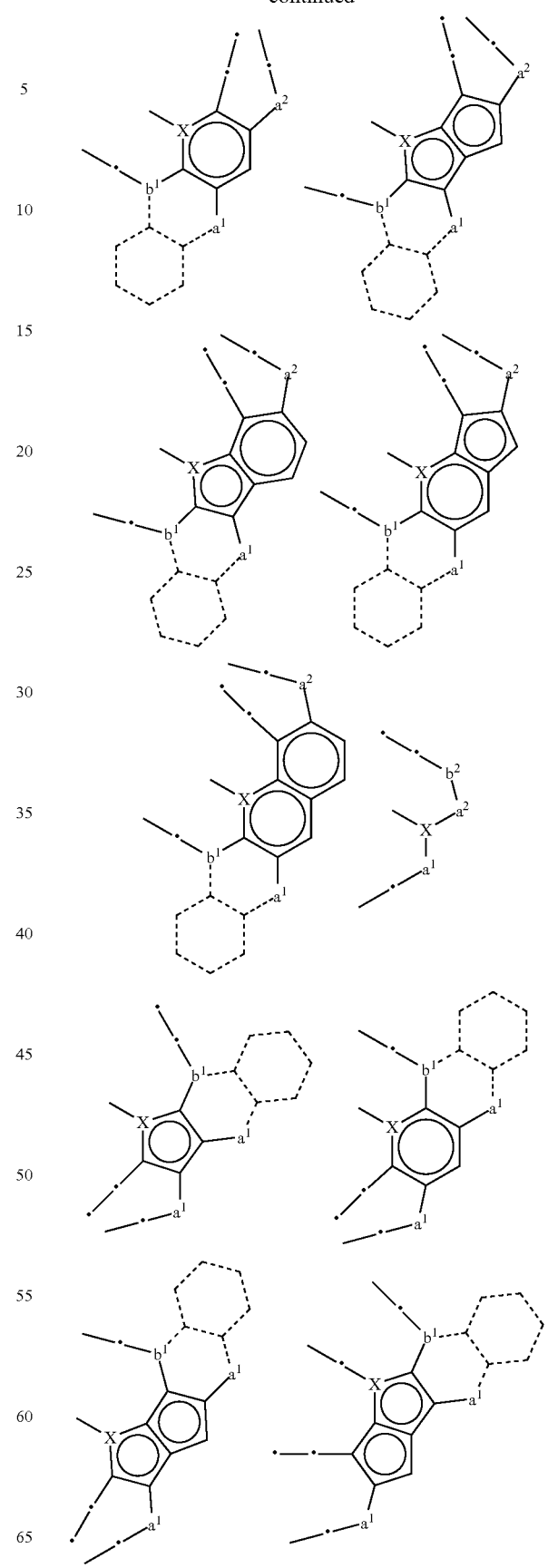

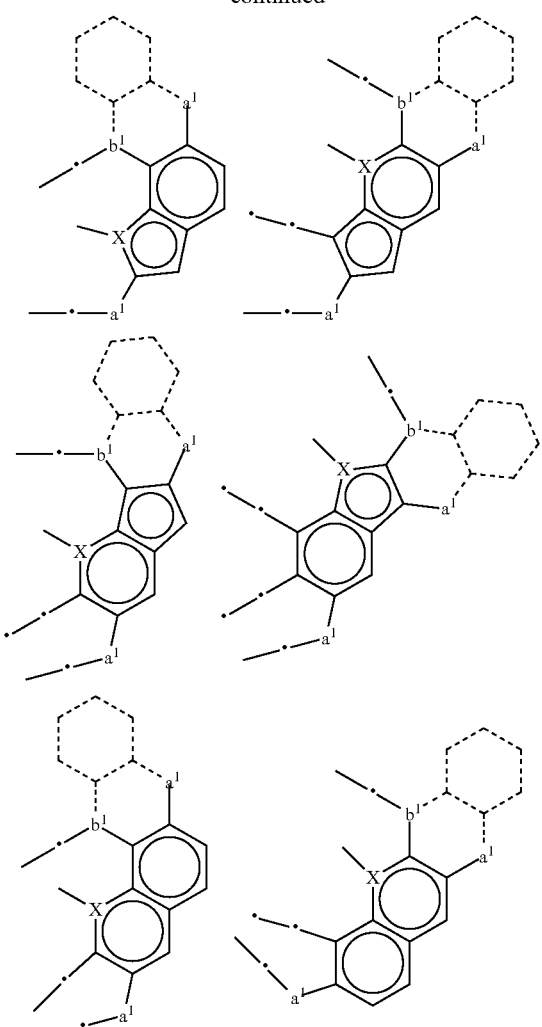
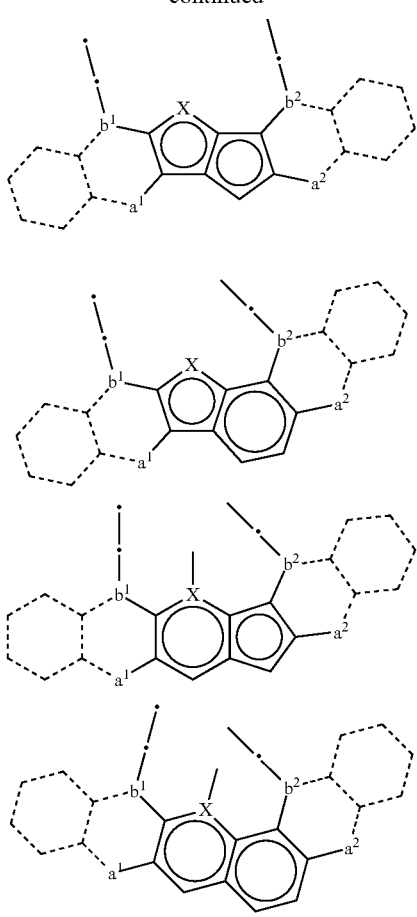
C has one of the following structures, which can optionally be substituted:
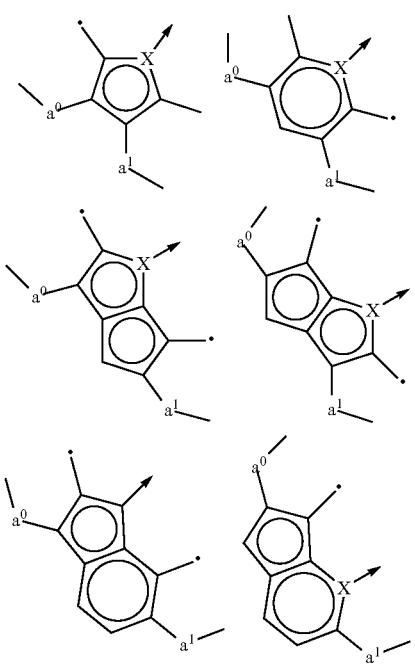

-continued

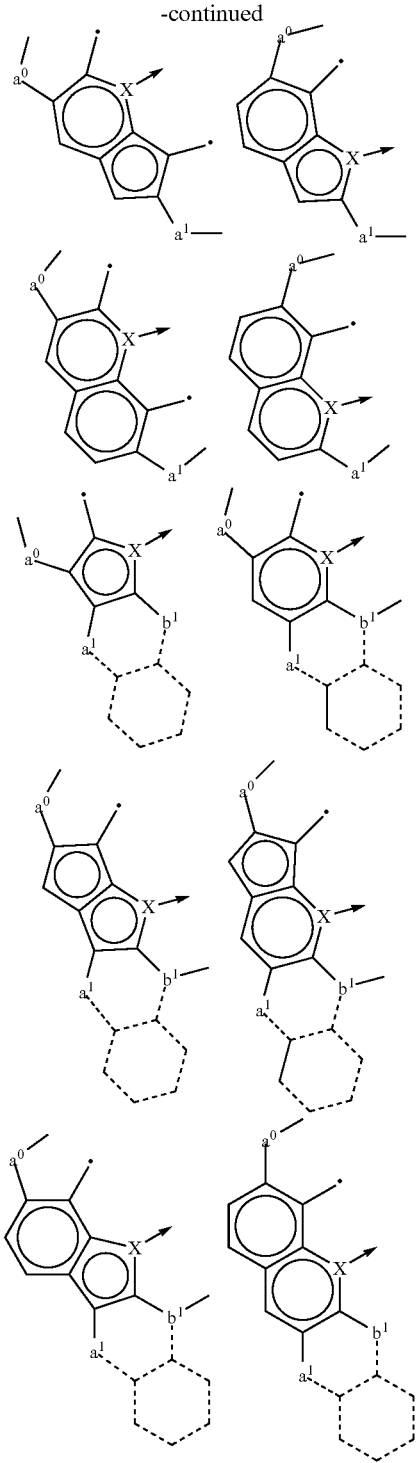

N has one of the following structures, which can optionally be substituted:

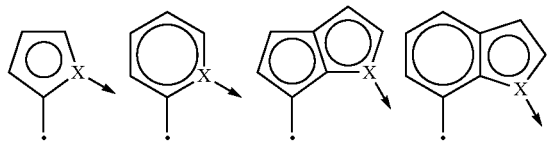

-continued

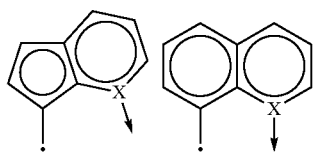

each of $a^0$, $a^1$, and $a^2$ is independently present or absent, and if present, is a direct bond or linking group having one of the following structures:

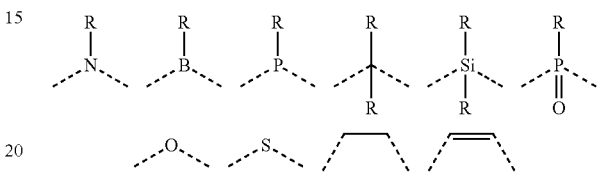

each of $b^1$ and $b^2$ is independently present or absent, and if present, is a linking group having one of the following structures:

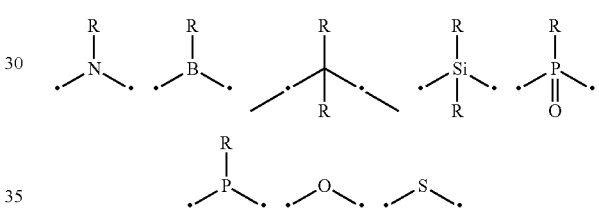

X is B, C, N, O, Si, P, S, Ge, As, Se, Sn, Sb, or Te,

Y is N, P, P=O, As, As=O, CH, CR, SiH, SiR, GeH, GeR, each R is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric, or any conjugate or combination thereof, and n is an integer that satisfies the valency of Y.

In some cases, $a^2$ is absent, $a^2$ and $b^2$ are absent, X is N, or a combination thereof.

In some cases, A is

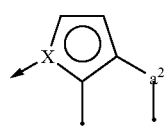

wherein a² is absent, b² is absent, and D is

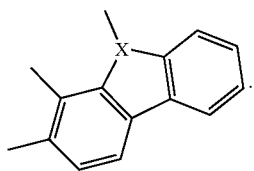

In some cases, C in structure (a) or (b) is

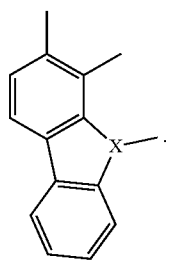

In some cases, N in structure (a) or (b) is

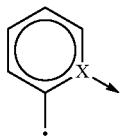

or substituted

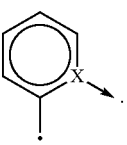

In some cases, M is palladium (II).

Emitters described herein include six-membered emitters. As used herein, a "six-membered emitter" refers to an emitter with a luminophore (i.e., a portion of the emitter responsible for its luminescent properties) including a six-membered chelation ring. In one example, a six-membered MADF emitter has a luminophore including a six-membered chelation ring.

Metal-assisted delayed fluorescent emitters for devices described herein include the emitters shown below.

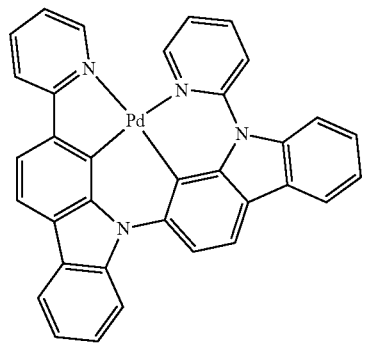

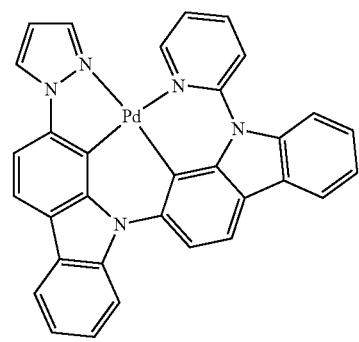

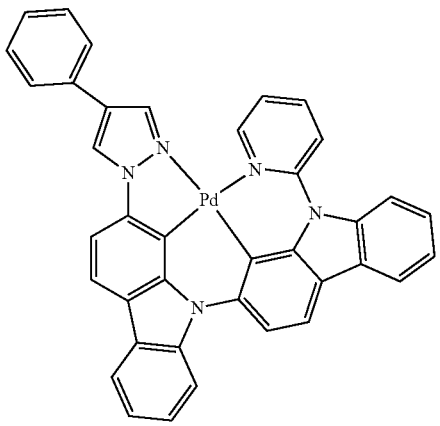

Metal-assisted delayed fluorescent emitters for devices described herein include emitters of General Formula A:

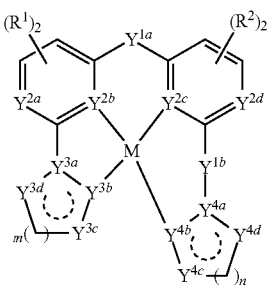

General Formula A wherein:

M is Ir, Rh, Mn, Ni, Cu, or Ag;

each $R^1$ and $R^2$ is independently hydrogen, halogen, hydroxyl, nitro, thiol, or substituted or unsubstituted alkyl, alkenyl, alkynyl, aryl, heteroaryl, cycloalkane, cycloalkane, heterocyclyl, amino, alkoxy, haloalkyl, arylalkane, or arylalkene;

each of $Y^{1a}$ and $Y^{1b}$ is independently O, $NR^3$, $CR^3R^4$, S, $AsR^3$, $BR^3$, $PR^3$, $P(O)R^3$, or $SiR^3R^4$, or a combination thereof, wherein each of $R^3$ and $R^4$ is independently hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, arylalkene, or $R^3$ and $R^4$ together form C=O, wherein each of $R^3$ and $R^4$ is independently optionally linked to an adjacent ring structure, thereby forming a cyclic structure;

each of $Y^{2a}$, $Y^{2b}$, $Y^{2c}$, and $Y^{2d}$ is independently N or $CR^5$, wherein $R^5$ is hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, or arylalkene;

each of $Y^{3a}$, $Y^{3b}$, $Y^{3c}$, $Y^{3d}$, $Y^{4a}$, $Y^{4b}$, $Y^{4c}$, and $Y^{4d}$ is independently N, O, S, $NR^6$, or $CR^7$, wherein each of $R^6$ and $R^7$ is independently hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, or arylalkene; or $Z(R^8)_2$, wherein Z is C or Si, and wherein each $R^8$ is independently hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, or arylalkene;

each of m and n is independently 1 or 2; and each $\overset{\frown}{\phantom{-}}$ independently represents partial or full unsaturation of the ring with which it is associated.

In some cases, $Y^{2b}$ is C; $Y^{2c}$, $Y^{3b}$ and $Y^{4b}$ are N, and M is Ir or Rh.

Metal-assisted delayed fluorescent emitters for devices described herein include emitters of General Formula B:

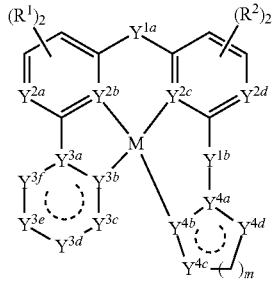

General Formula B wherein:

M is Pt, Pd, or Au;

each of $R^1$ and $R^2$ is independently hydrogen, halogen, hydroxyl, nitro, thiol, or substituted or unsubstituted alkyl, alkenyl, alkynyl, aryl, heteroaryl, cycloalkane, cycloalkane, heterocyclyl, amino, alkoxy, haloalkyl, arylalkane, or arylalkene;

each of $Y^{1a}$ and $Y^{1b}$ is independently O, $NR^3$, $CR^3R^4$, S, $AsR^3$, $BR^3$, $PR^3$, $P(O)R^3$, or $SiR^3R^4$, or a combination thereof, wherein each of $R^3$ and $R^4$ is independently hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, arylalkene, or $R^3$ and $R^4$ together form C=O, wherein each of $R^3$ and $R^4$ is independently optionally linked to an adjacent ring structure, thereby forming a cyclic structure;

each of $Y^{2a}$, $Y^{2b}$, $Y^{2c}$, and $Y^{2d}$ is independently N or $CR^5$, wherein $R^5$ is hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, or arylalkene;

each of $Y^{3a}$, $Y^{3b}$, $Y^{3c}$, $Y^{3d}$, $Y^{3e}$, $Y^{3f}$, $Y^{4a}$, $Y^{4b}$, $Y^{4c}$, and $Y^{4d}$ is independently N, O, S, $NR^6$, $CR^7$, wherein each of $R^6$ and $R^7$ is independently hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, or arylalkene; or $Z(R^8)_2$, wherein Z is C or Si, and wherein each $R^8$ is independently hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, or arylalkene;

m is 1 or 2; and each $\overset{\frown}{\phantom{-}}$ independently represents partial or full unsaturation of the ring with which it is associated.

In some cases, M is Pt or Pd, $Y^{2b}$ $Y^{2c}$ are C, $Y^{3b}$ and $Y^{4b}$ are N, each of $Y^{1a}$ and $Y^{1b}$ is independently O, $NR^3$, $CR^3R^4$, S, $AsR^3$, $BR^3$, $PR^3$, $P(O)R^3$, or $SiR^3R^4$, or a combination thereof, wherein each of $R^3$ and $R^4$ is independently hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, arylalkene, or $R^3$ and $R^4$ together form C=O, wherein each of $R^3$ and $R^4$ is independently optionally linked to an adjacent ring structure, thereby forming a cyclic structure.

In some cases, M is Au, $Y^{2b}$, $Y^{2c}$ and $Y^{4b}$ are C, $Y^{3b}$ is N, each of $Y^{1a}$ and $Y^{1b}$ is independently O, $NR^3$, $CR^3R^4$, S, $AsR^3$, $BR^3$, $PR^3$, $P(O)R^3$, or $SiR^3R^4$, or a combination thereof, wherein each of $R^3$ and $R^4$ is independently hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, arylalkene, or $R^3$ and $R^4$ together form C=O, wherein each of $R^3$ and $R^4$ is independently optionally linked to an adjacent ring structure, thereby forming a cyclic structure.

Metal-assisted delayed fluorescent emitters for devices described herein include emitters of General Formula C:

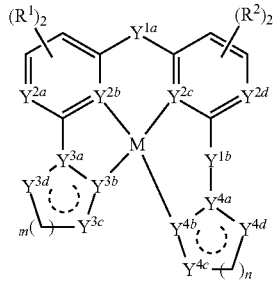

General Formula C wherein:

M is Pt, Pd, Au, or Ag;

each of $R^1$ and $R^2$ is independently hydrogen, halogen, hydroxyl, nitro, thiol, or substituted or unsubstituted alkyl, alkenyl, alkynyl, aryl, heteroaryl, cycloalkane, cycloalkane, heterocyclyl, amino, alkoxy, haloalkyl, arylalkane, or arylalkene;

one of $Y^{1a}$ and $Y^{1b}$ is $B(R^3)_2$ and the other of $Y^{1a}$ and $Y^{1b}$ is O, $NR^3$, $CR^3R^4$, S, $AsR^3$, $BR^3$, $PR^3$, $P(O)R^3$, or $SiR^3R^4$, wherein each of $R^3$ and $R^4$ is independently hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, arylalkene, or $R^3$ and $R^4$ together form C=O, wherein each of $R^3$ and $R^4$ is independently optionally linked to an adjacent ring structure, thereby forming a cyclic structure;

each of $Y^{2a}$, $Y^{2b}$, $Y^{2c}$, and $Y^{2d}$ is independently N or $CR^5$, wherein $R^5$ is hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, or arylalkene;

each of $Y^{3a}$, $Y^{3b}$, $Y^{3c}$, $Y^{3d}$, $Y^{4a}$, $Y^{4b}$, $Y^{4c}$, and $Y^{4d}$ is independently N, O, S, $NR^6$, $CR^7$, wherein each of $R^6$ and $R^7$ independently hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, or arylalkene; or $Z(R^8)_2$, wherein Z is C or Si, and wherein each $R^8$ is independently hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, or arylalkene;

each of m and n is independently 1 or 2; and each $\overset{\frown}{\cdot\cdot}$ independently represents partial or full unsaturation of the ring with which it is associated.

Metal-assisted delayed fluorescent emitters for devices described herein include emitters of General Formula D:

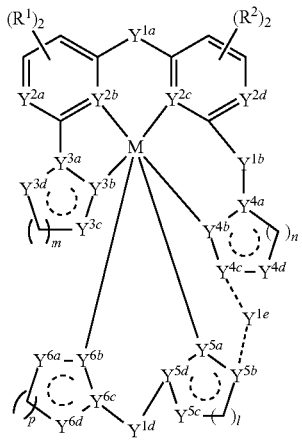

General Formula D wherein:

M is Ir, Rh, Pt, Os, Zr, Co, or Ru;

each of $R^1$ and $R^2$ is independently hydrogen, halogen, hydroxyl, nitro, thiol, or substituted or unsubstituted alkyl, alkenyl, alkynyl, aryl, heteroaryl, cycloalkane, cycloalkane, heterocyclyl, amino, alkoxy, haloalkyl, arylalkane, or arylalkene;

each of $Y^{1a}$, $Y^{1b}$, $Y^{1c}$ and $Y^{1d}$ is independently O, $NR^3$, $CR^3R^4$, S, $AsR^3$, $BR^3$, $PR^3$, $P(O)R^3$, or $SiR^3R^4$, wherein each of $R^3$ and $R^4$ is independently hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, arylalkene, or $R^3$ and $R^4$ together form C=O, wherein each of $R^3$ and $R^4$ is independently optionally linked to an adjacent ring structure, thereby forming a cyclic structure;

$Y^{1e}$, if present, is O, $NR^3$, $CR^3R^4$, S, $AsR^3$, $BR^3$, $PR^3$, $P(O)R^3$, or $SiR^3R^4$, wherein each of $R^3$ and $R^4$ is independently hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, arylalkene, or $R^3$ and $R^4$ together form C=O, wherein each of $R^3$ and $R^4$ is independently optionally linked to an adjacent ring structure, thereby forming a cyclic structure;

each of $Y^{2a}$, $Y^{2b}$, $Y^{2c}$, and $Y^{2d}$ is independently N or $CR^5$, wherein $R^5$ is hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, or arylalkene;

each of $Y^{3a}$, $Y^{3b}$, $Y^{3c}$, $Y^{3d}$, $Y^{3e}$, $Y^{4a}$, $Y^{4b}$, $Y^{4c}$, and $Y^{4d}$ is independently N, O, S, $NR^6$, or $CR^7$, wherein each of $R^6$ and $R^7$ is independently hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, or arylalkene; or $Z(R^8)_2$ wherein Z is C or Si, and wherein each $R^8$ is independently hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, or arylalkene;

each of $Y^{5a}$, $Y^{5b}$, $Y^{5c}$, $Y^{5d}$, $Y^{6a}$, $Y^{6b}$, $Y^{6c}$, and $Y^{6d}$ is independently N, O, S, $NR^5$, or $CR^6$;

each of m, n, l, and p is independently 1 or 2; and each $\overset{\frown}{\cdot\cdot}$ independently represents partial or full unsaturation of the ring with which it is associated.

Metal-assisted delayed fluorescent emitters for devices described herein include emitters of General Formula E:

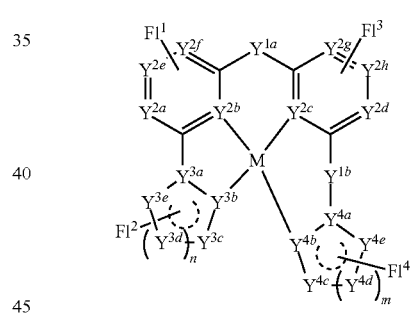

General Formula E wherein:

M is Pt, Pd, Ir, Rh, Au, Co, Mn, Ni, Ag, or Cu;

each of $Y^{1a}$ and $Y^{1b}$ is independently O, $NR^3$, $CR^3R^4$, S, $AsR^3$, $BR^3$, $PR^3$, $P(O)R^3$, or $SiR^3R^4$, wherein each of $R^3$ and $R^4$ is independently hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, arylalkene, or $R^3$ and $R^4$ together form C=O, wherein each of $R^3$ and $R^4$ is independently optionally linked to an adjacent ring structure, thereby forming a cyclic structure;

each of $Y^{2a}$, $Y^{2b}$, $Y^{2c}$, $Y^{2d}$, $Y^{2e}$, $Y^{2f}$, $Y^{2g}$, and $Y^{2h}$ is independently N or $CR^5$, wherein $R^5$ is hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, or arylalkene;

each of $Y^{3a}$, $Y^{3b}$, $Y^{3c}$, $Y^{3d}$, $Y^{3e}$, $Y^{4a}$, $Y^{4b}$, $Y^{4c}$, $Y^{4d}$ and $Y^{4e}$ is independently N, O, S, $NR^6$, or $CR^7$, wherein each of $R^6$ and $R^7$ independently hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, or arylalkene; or $Z(R^8)_2$ wherein Z is C or Si, and wherein each $R^8$ is independently hydrogen, halogen, hydroxyl, thiol, or substituted or unsubstituted alkyl, alkenyl, alkynyl, aryl, heteroaryl, cycloalkane, cycloalkane, heterocyclyl, aminoalkoxy, haloalkyl, arylalkane, or arylalkene;

m is 1 or 2;

n is 1 or 2;

each ⟨⟩ independently represents partial or full unsaturation of the ring with which it is associated; and each of $Fl^1$, $Fl^2$, $Fl^3$ and $Fl^4$ is independently present or absent, with at least one of $Fl^1$, $Fl^2$, $Fl^3$ and $Fl^4$ present, and if present each of $Fl^1$, $Fl^2$, $Fl^3$ and $Fl^4$ is a fluorescent emitter covalently bonded to one of $Y^{2a}$, $Y^{2d}$, $Y^{2e}$, $Y^{2f}$, $Y^{2g}$, $Y^{2h}$, $Y^{3c}$, $Y^{3d}$, $Y^{3e}$, $Y^{4c}$, $Y^{4d}$ and $Y^{4e}$.

In some cases, the energy of the singlet excited state(s) is slightly higher (0.2 eV or less) than the energy of the lowest triplet state, and metal-assisted delayed fluorescent emitter emits simultaneously from the lowest triplet state and the singlet excited state(s) at room temperature or elevated temperature. The metal-assisted delayed fluorescent emitter can harvest both electrogenerated singlet and triplet excitons.

$Fl^1$, $Fl^2$, $Fl^3$, and $Fl^4$ may have one of the following structures. In addition, fluorescent emitters described herein may include one of the following compounds:

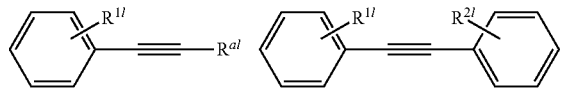

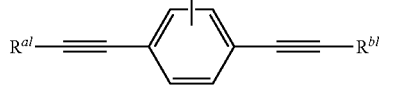

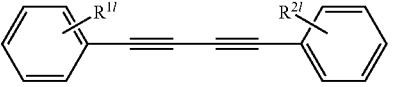

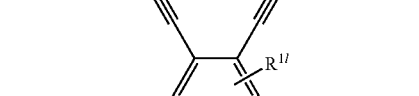

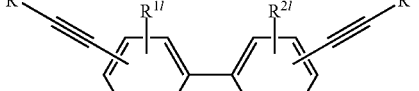

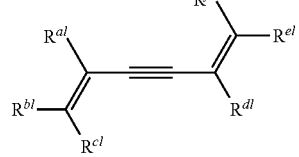

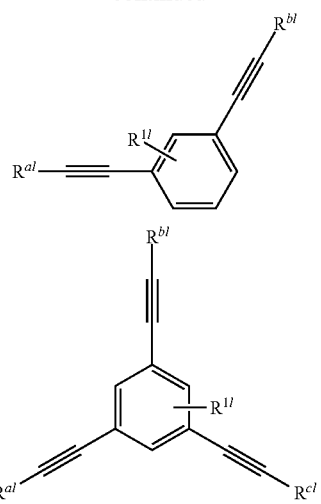

wherein $R^{al}$, $R^{bl}$, $R^{cl}$, $R^{dl}$, $R^{el}$, $R^{fl}$, $R^{gl}$, $R^{hl}$ and $R^{il}$ can be one of the following structure:

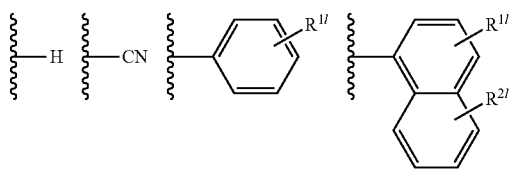

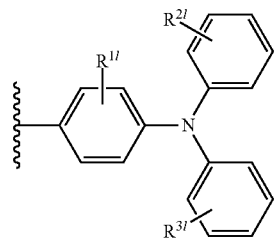

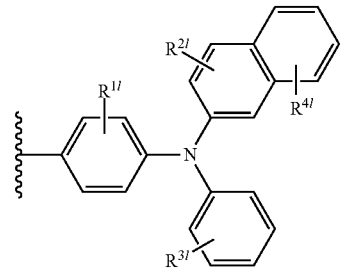

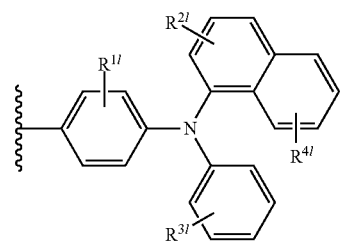

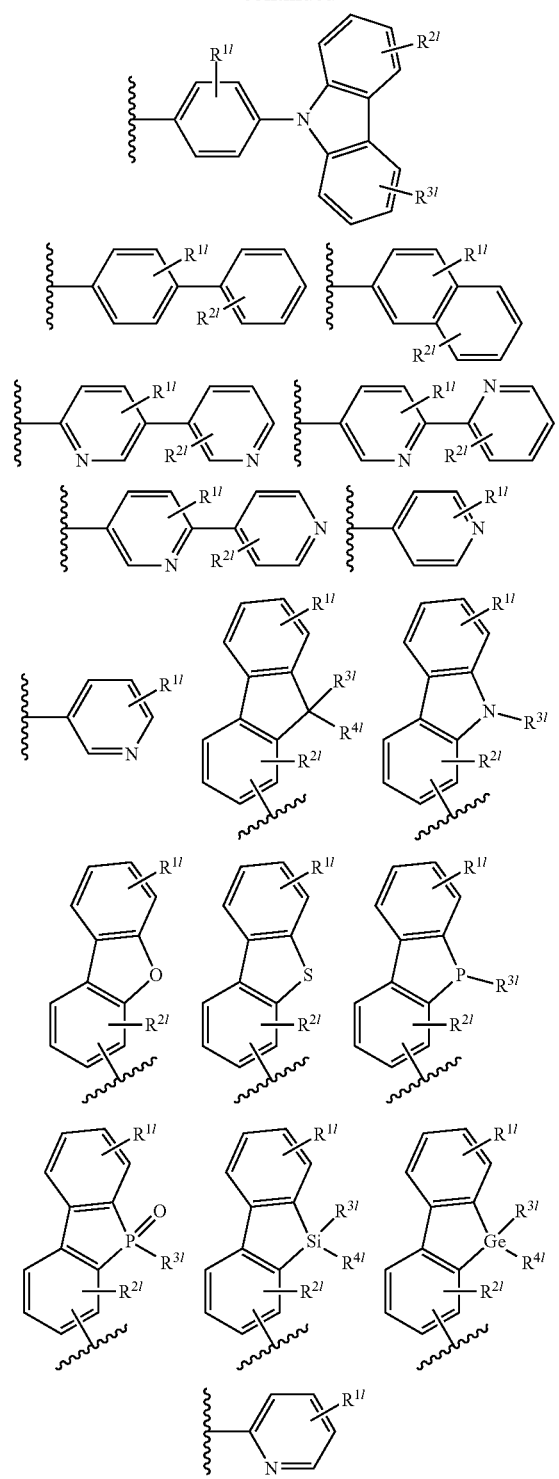
3. Heterocyclic Compounds and their Derivatives
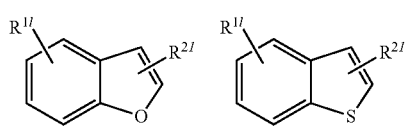
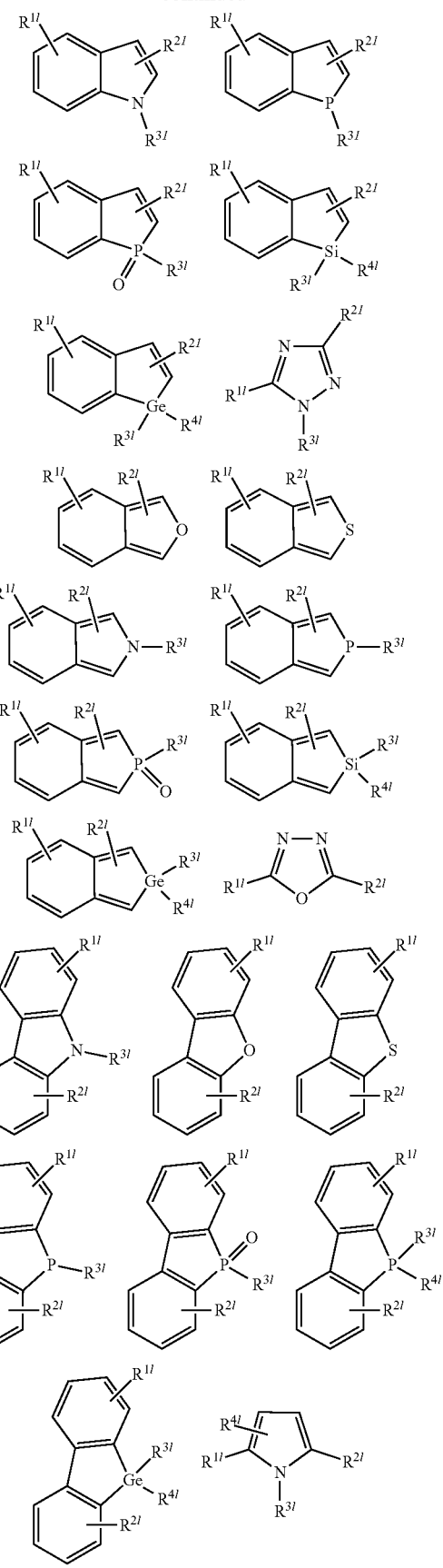

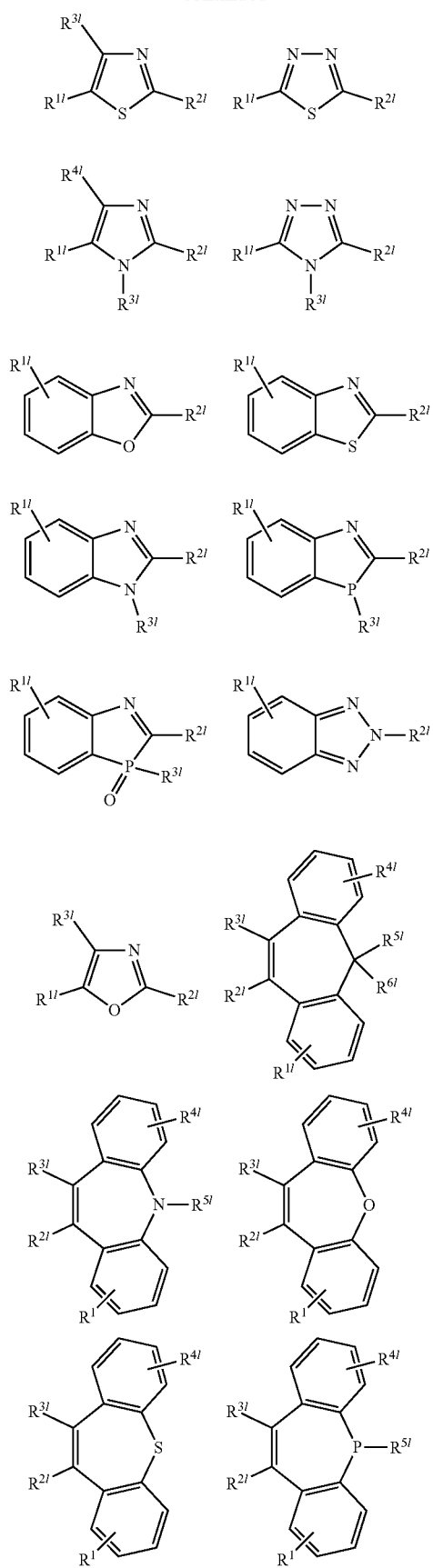
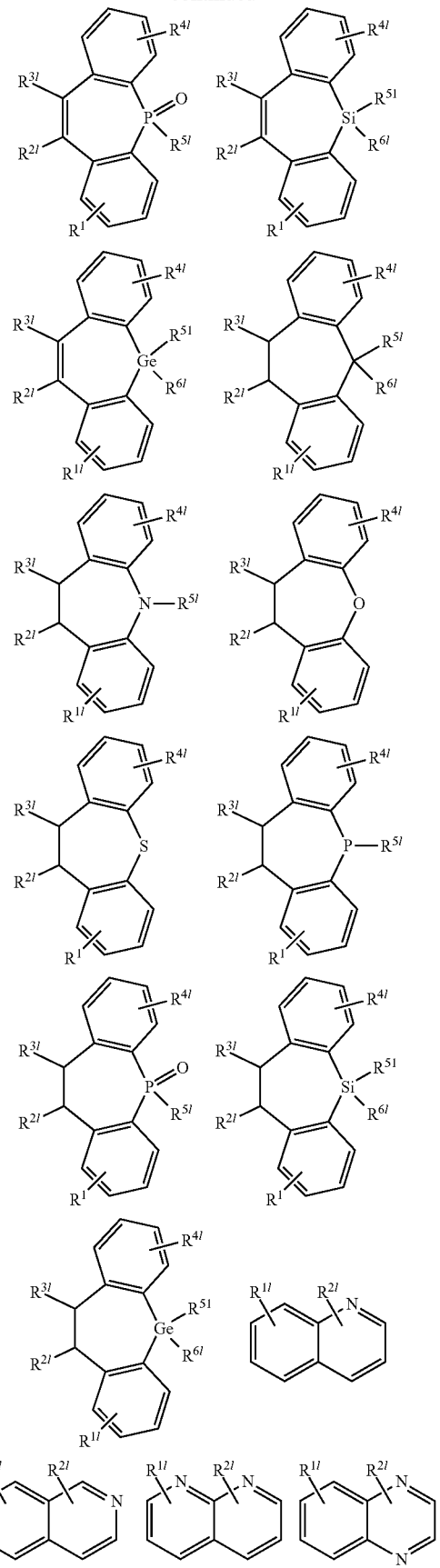

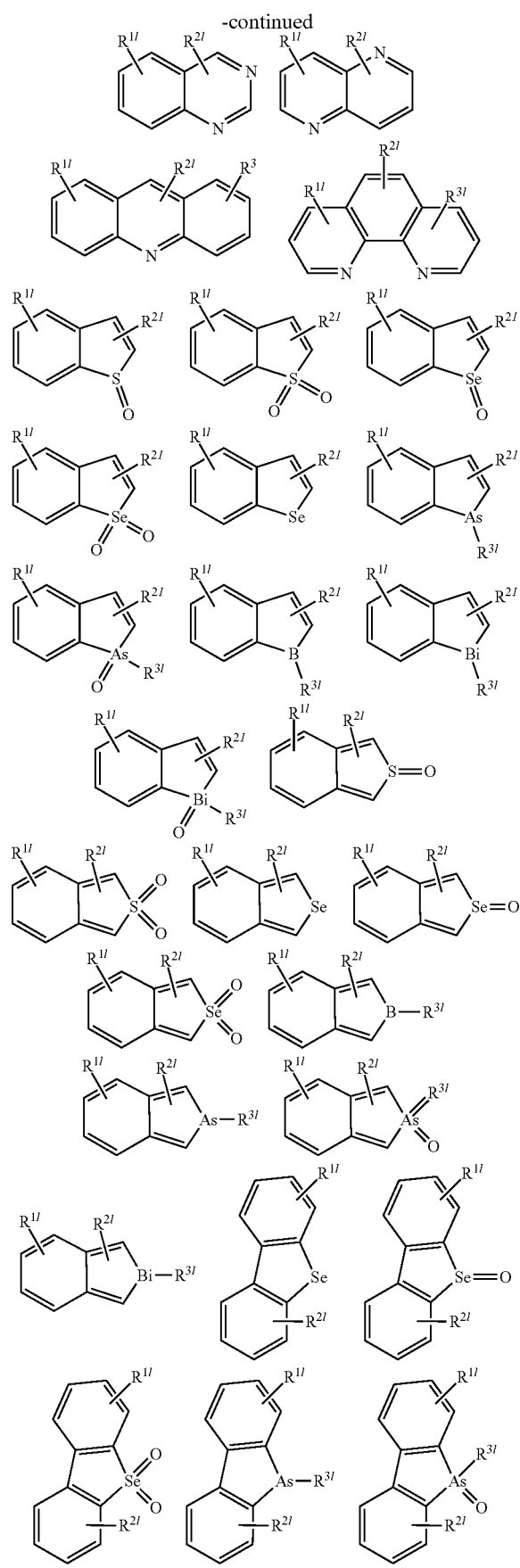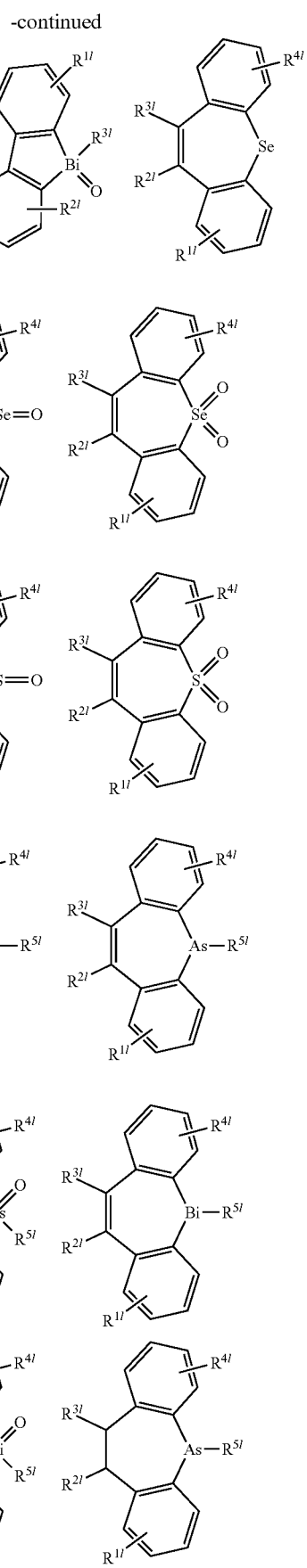

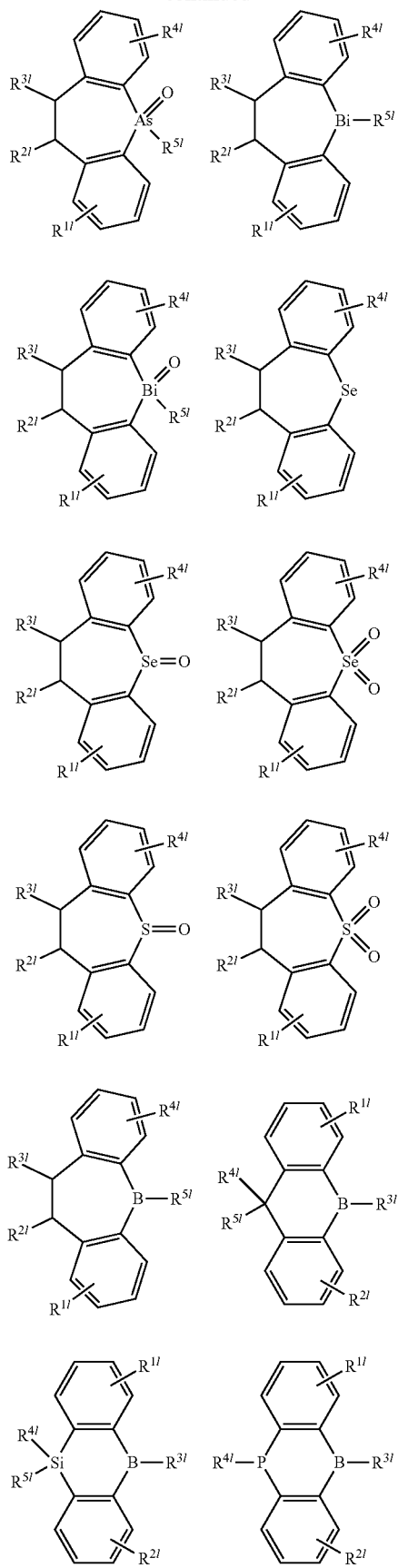
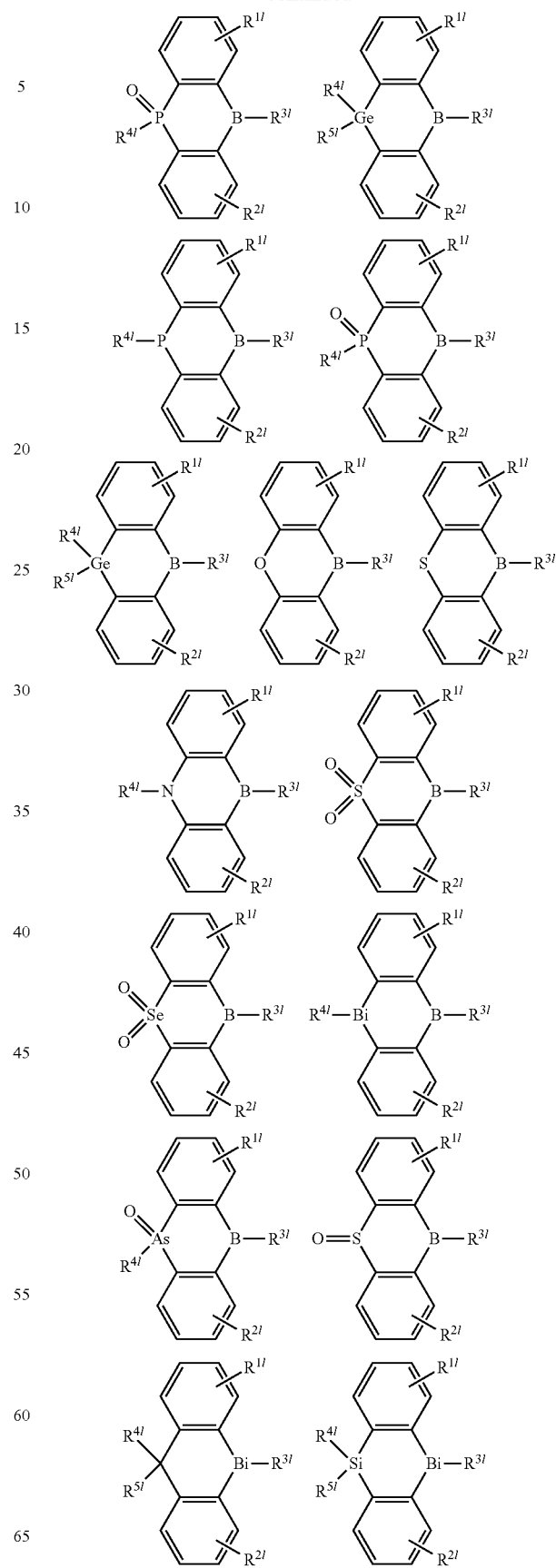

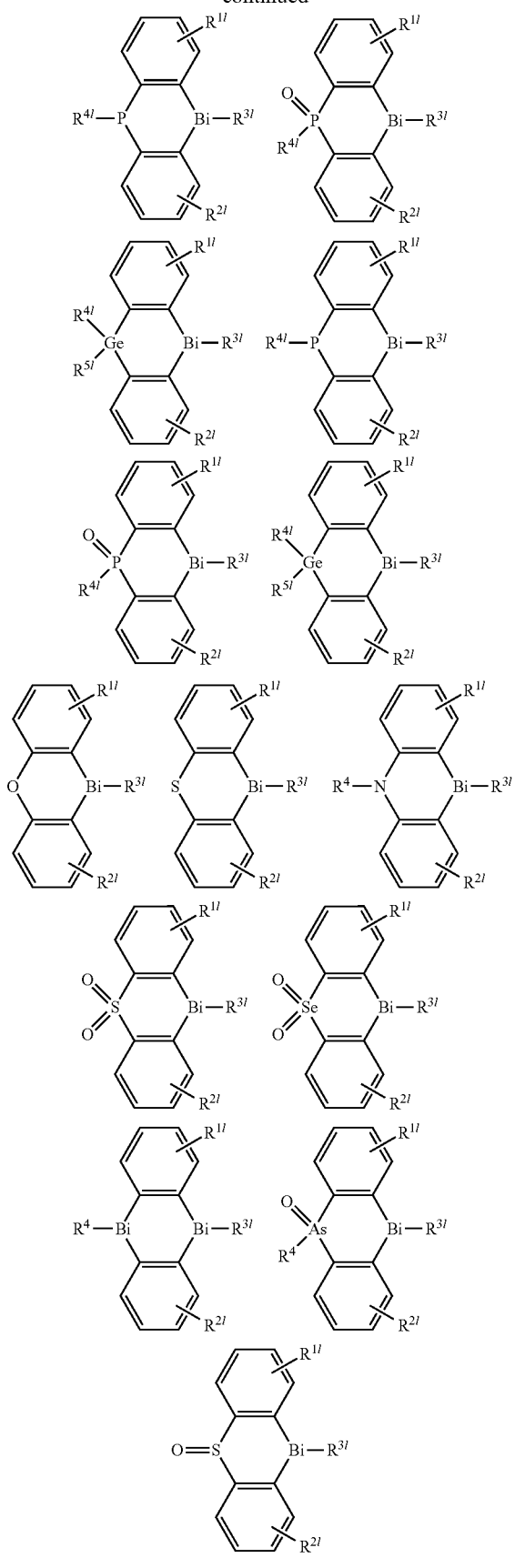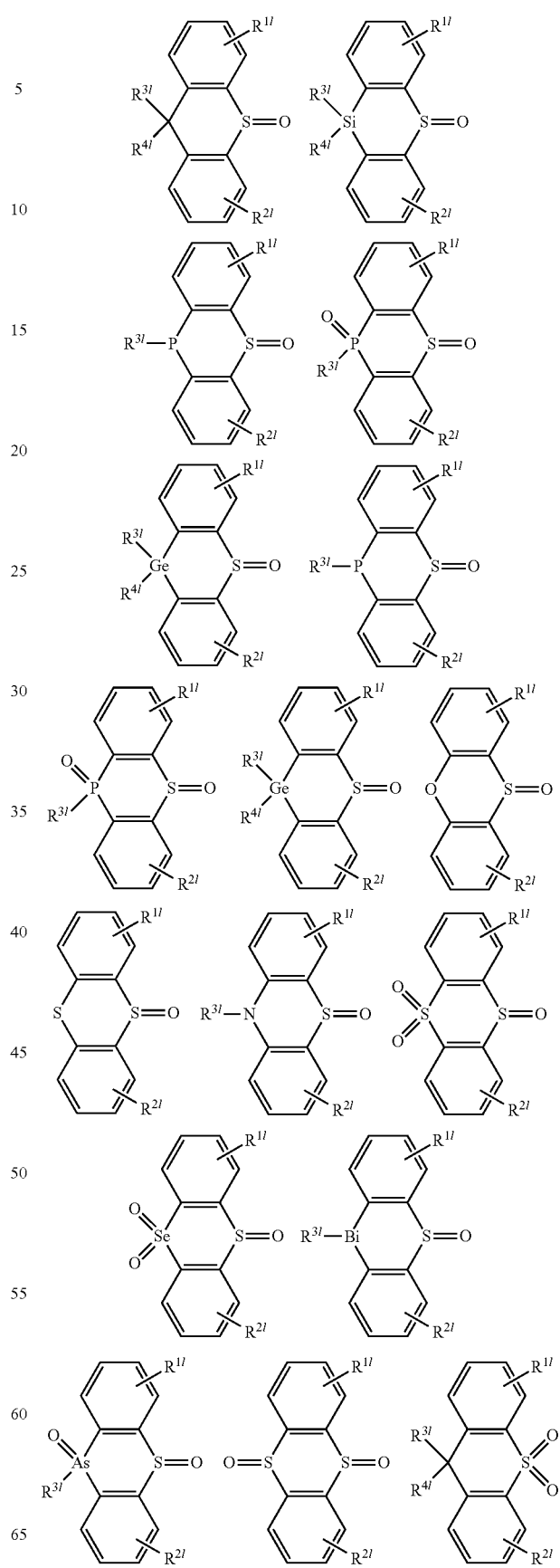

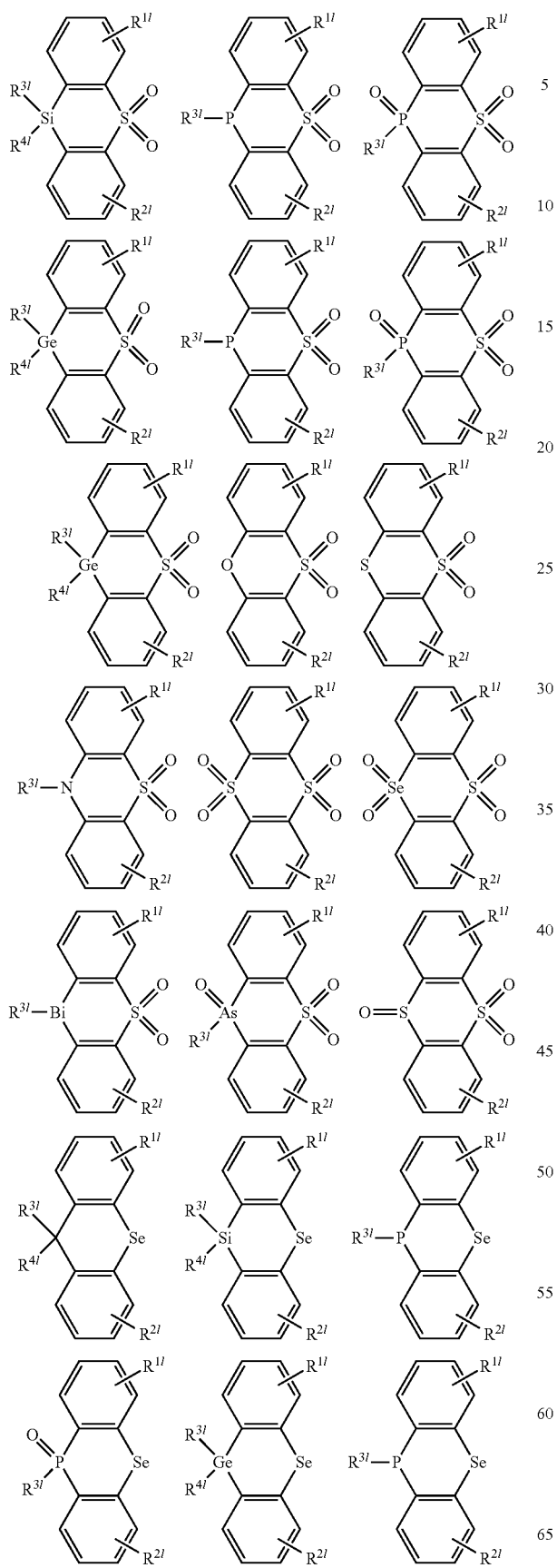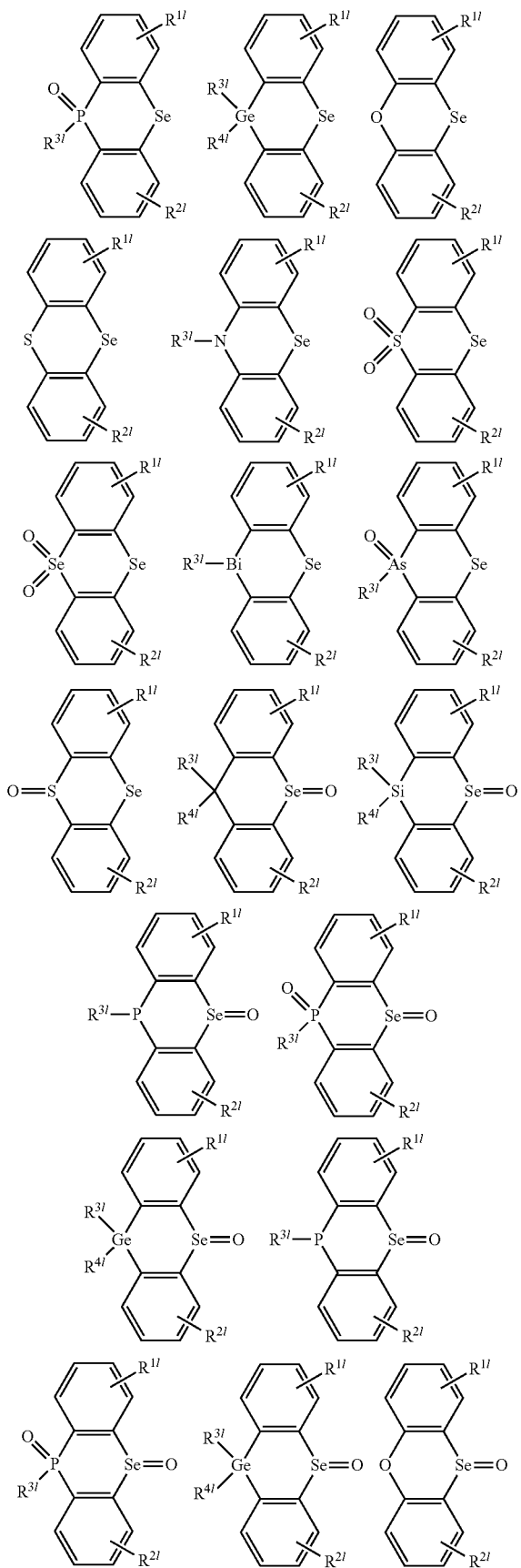

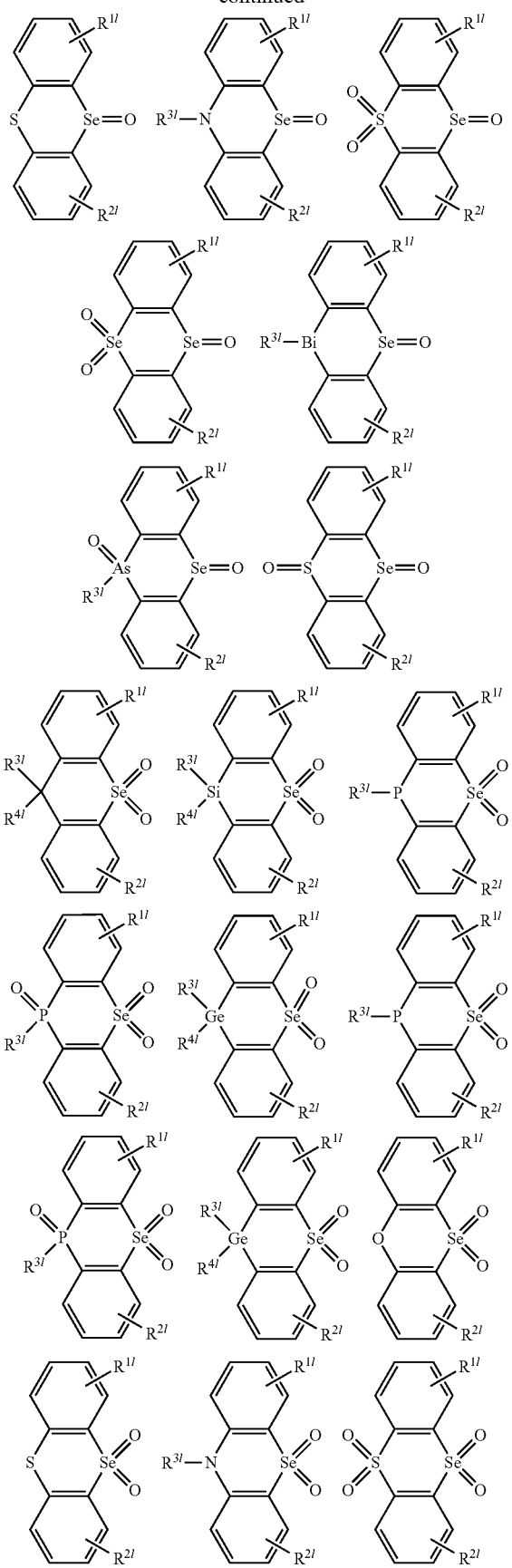
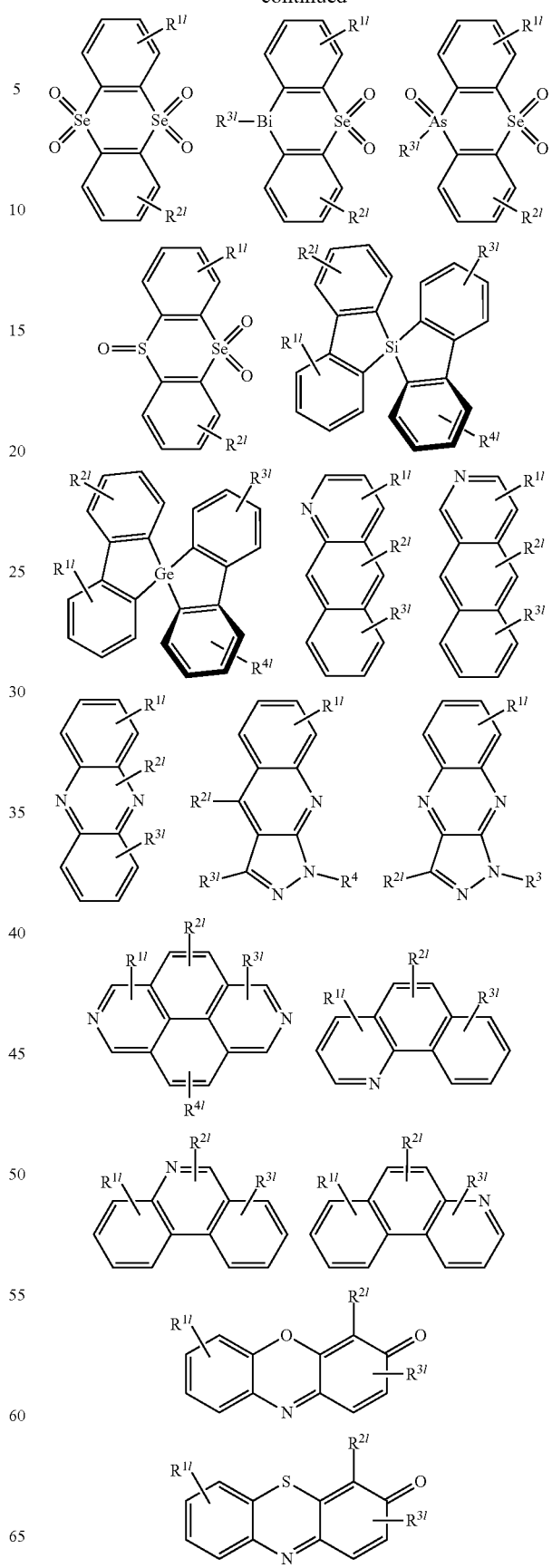

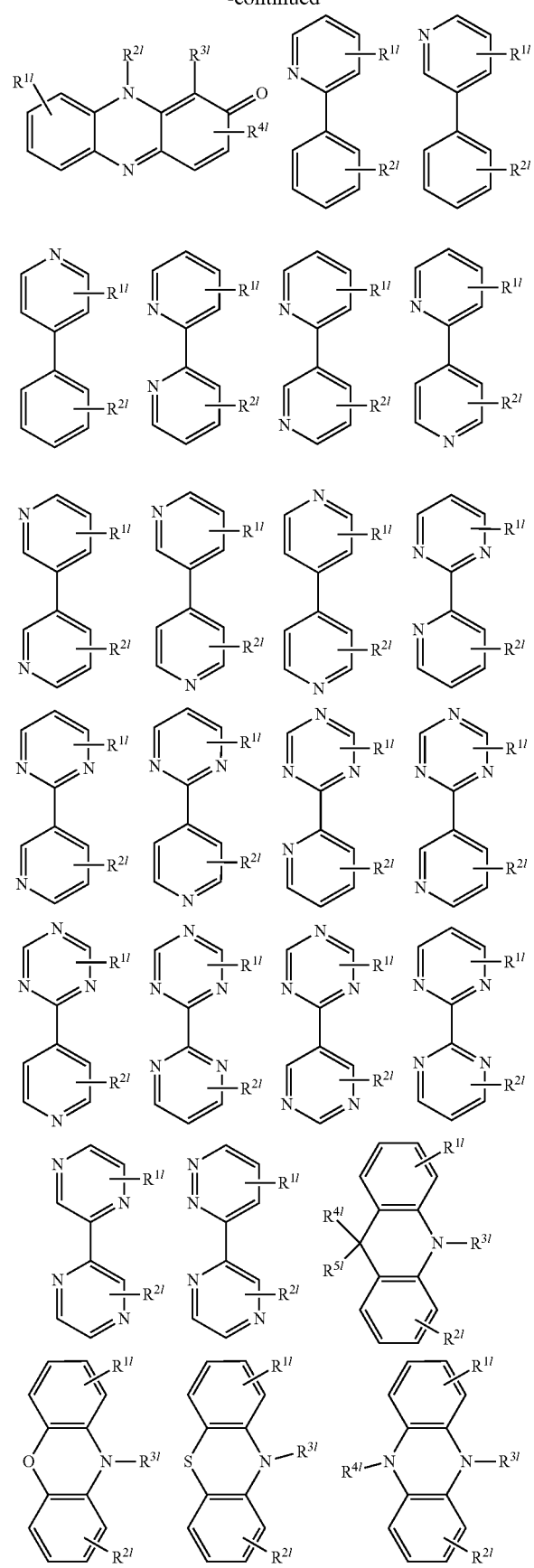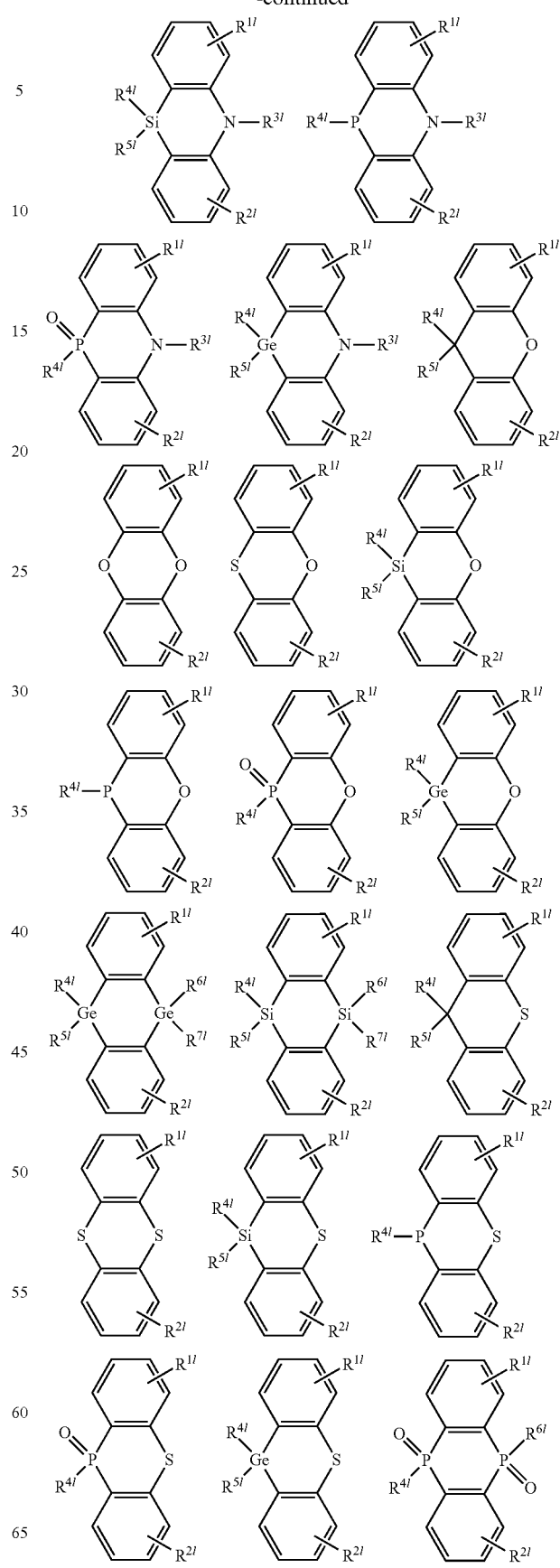

-continued
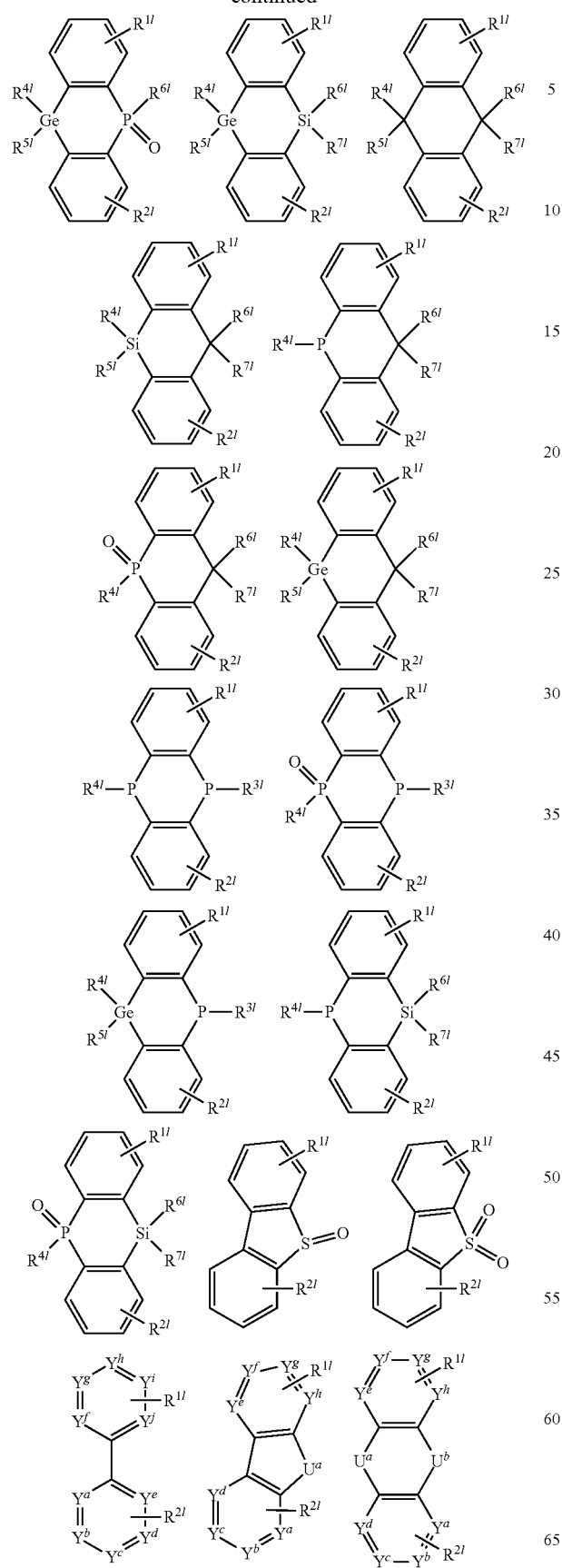
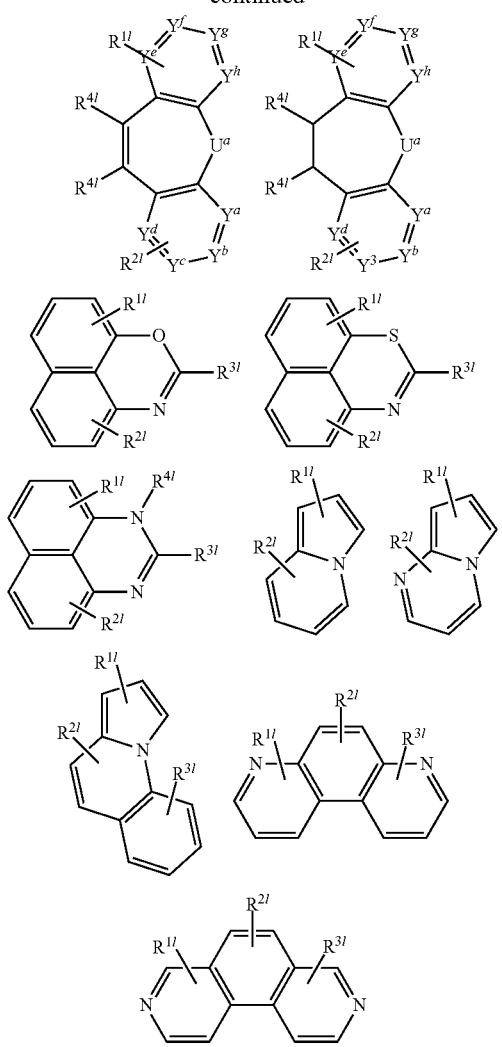
4. Other Fluorescent Luminophors
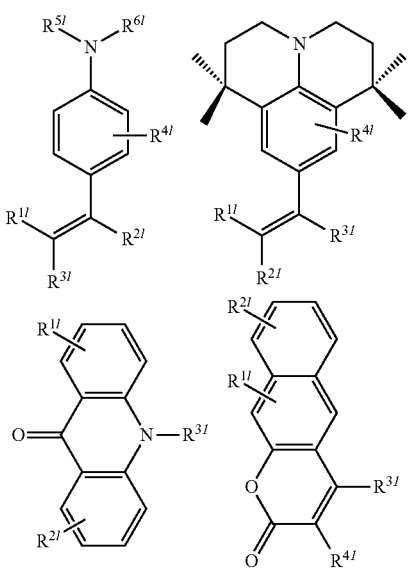

-continued
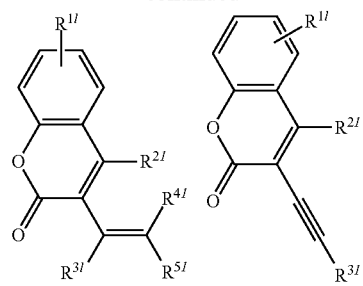
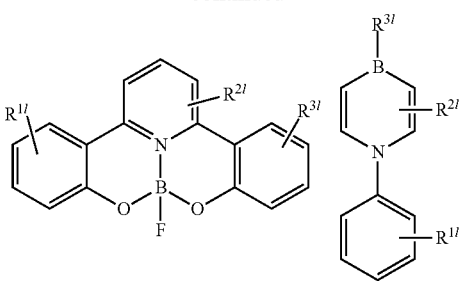
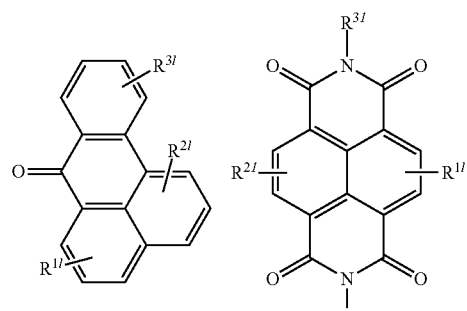
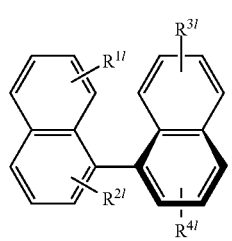
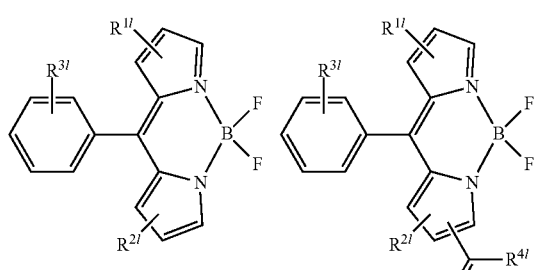
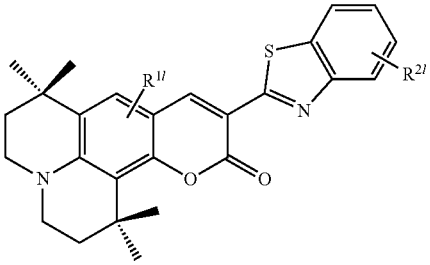
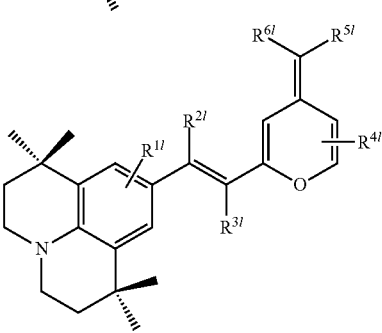
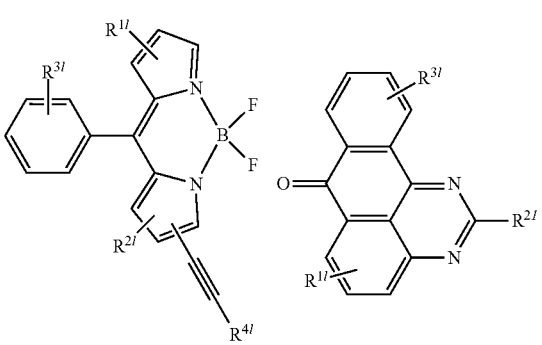
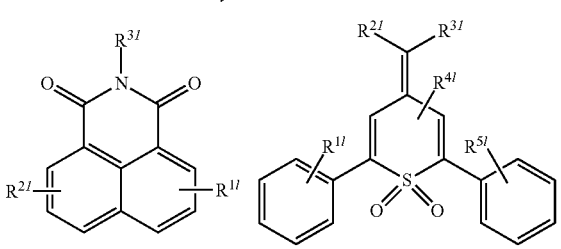
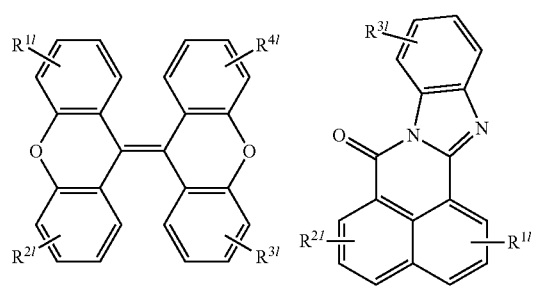
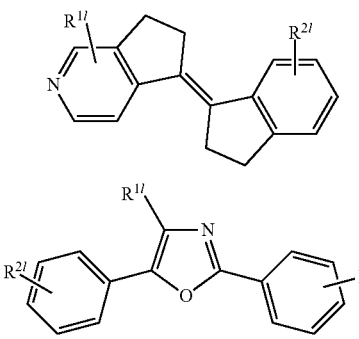

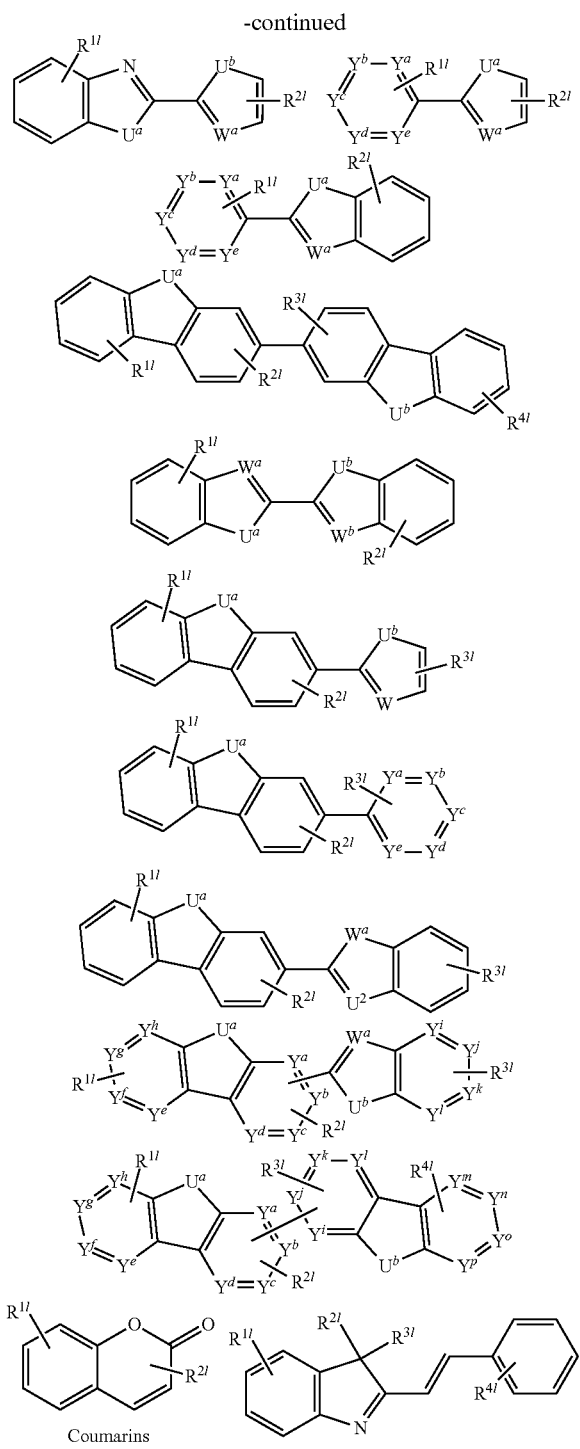

Coumarins wherein:

each of $R^{1l}$, $R^{2l}$, $R^{3l}$, $R^{4l}$, $R^{5l}$, $R^{6l}$, $R^{7l}$ and $R^{8l}$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, carbamoyl, alkylthio, ureido, phosphoramide, silyl, polymeric, or any conjugate or combination thereof, and each of $Y^a$, $Y^b$, $Y^c$, $Y^d$, $Y^e$, $Y^f$, $Y^g$, $Y^h$, $Y^i$, $Y^j$, $Y^k$, $Y^l$, $Y^m$, $Y^n$, $Y^o$ and $Y^p$ is independently C, N or B; and each of $U^a$, $U^b$ and $U^c$ is independently $CH_2$, CRR, C=O, SiRR, $GeH_2$, GeRR, NH, NR, PH, PR, RP=O, AsR, RAs=O, O, S, S=O, $SO_2$, Se, Se=O, $SeO_2$, BH, BR, RBi=O, BiH, or BiR, wherein each R is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric, or any conjugate or combination thereof.

Other emitters suitable for devices described herein are disclosed in WO 2014/109814, entitled "METAL COMPLEXES, METHODS, AND USES THEREOF," and US 2015/0194616, entitled "TETRADENTATE PLATINUM AND PALLADIUM COMPLEX EMITTERS CONTAINING PHENYL-PYRAZOLE AND ITS ANALOGUES," both of which are incorporated by reference herein.

EXAMPLES

Example 1

Figure 5A:
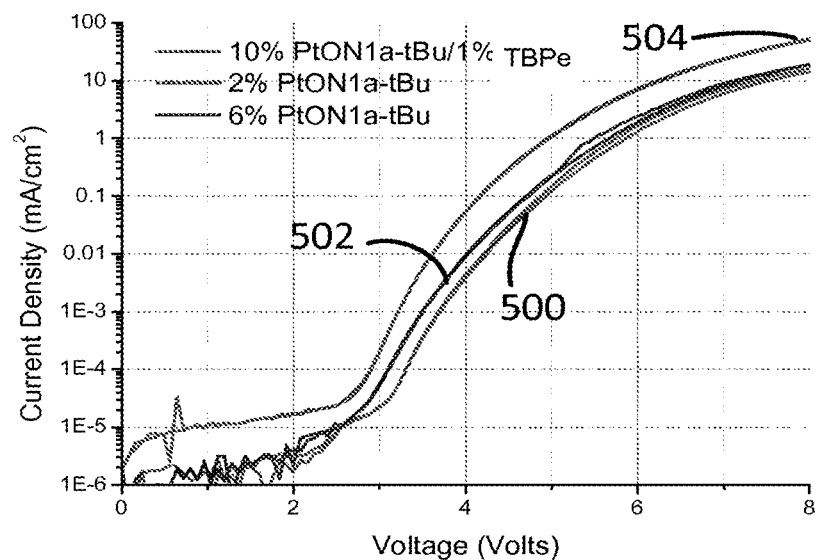
FIG. 5A shows plots of current-voltage characteristics.
Figure 5B:
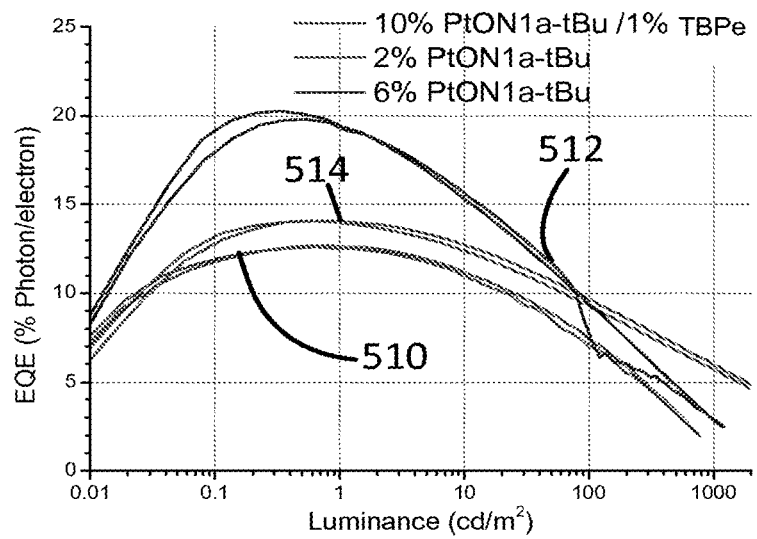
FIG. 5B shows plots of external quantum efficiency vs. brightness.
Figure 5C:
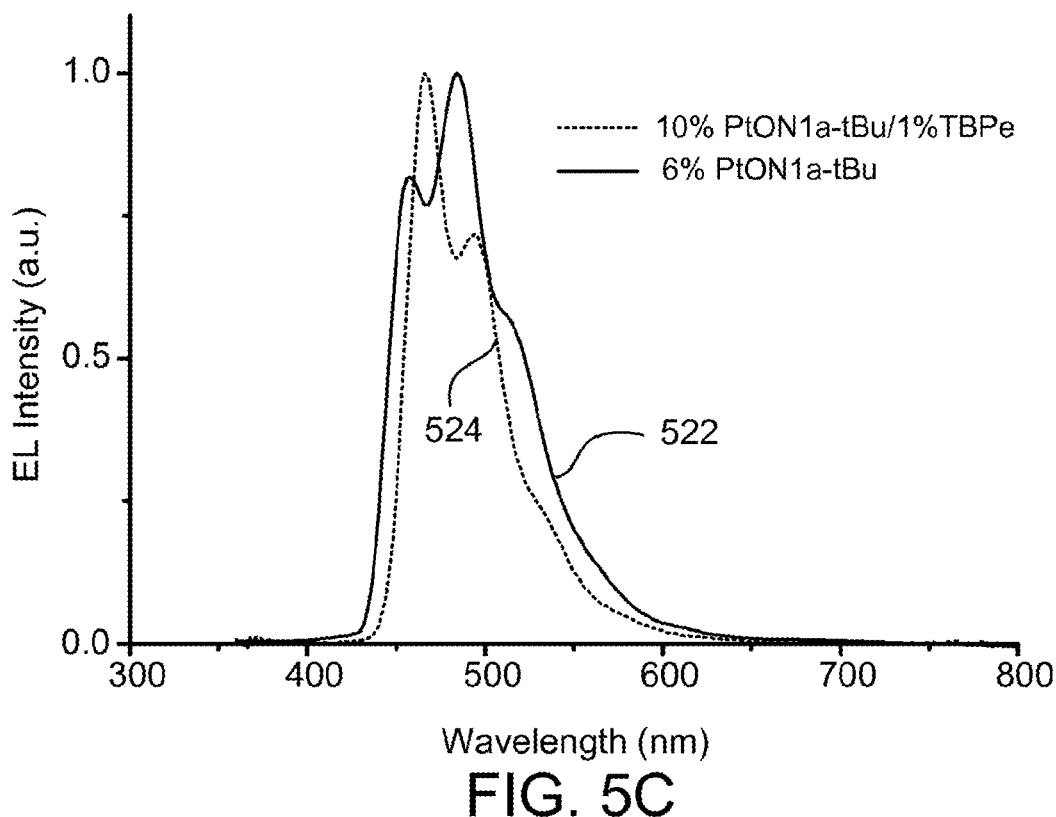
FIG. 5C show electroluminescent spectra of devices with a general device structure of ITO/HATCN/NPD/TAPc/EML/DPPS/BmPyPB/LiF/Al, where EMLs are (1) 2% PtON1a-t-Bu:26mCPy; (2) 6% PtON1a-t-Bu:26mCPy and (3) 10% PtON1a-t-Bu:1% TBPe:26mCPy.

Devices described with respect to FIG. 3 were fabricated in the structure ITO/HATCN (10 nm)/NPD (40 nm)/TAPC (10 nm)/26mCPy:10% PtON1a:x % TBPe (25 nm)/DPPS (10 nm)/BmPyPB (40 nm)/LiF/Al where HATCN is 1,4,5,8,9,11-hexaazatriphenylene-hexacarbonitrile, NPD is N,N'-diphyenyl-N,N'-bis(1-naphthyl)-1,1'-biphenyl-4,4"-di-amine, TAPC is di-[4-(N,N-di-toylyl-amino)-phyenyl] cyclohexane, 26mCPy is 2,6-bis(N-carbazolyl) pyridine, DPPS is diphenyl-bis[4-(pyridin-3-yl)phenyl]silane, and BmPyPB is 1,3-bis[3,5-di(pyridin-3-yl)phenyl]benzene. TBPe (fluorescent emitter perylene derivative) and PtON1a-t-Bu are shown below. FIGS. 5A, 5B, and 5C show current-voltage characteristics, external quantum efficiency vs. brightness, and electroluminescent spectra, respectively of Devices 1-3 with a general device structure of ITO/HATCN/NPD/TAPc/EML/DPPS/BmPyPB/LiF/Al, where plots EMLs are (1) 2% PtON1a-t-Bu:26mCPy; (2) 6% PtON1a-t-Bu:26mCPy and (3) 10% PtON1a-t-Bu:1% TBPe:26mCPy, respectively. Plots 500 and 510 correspond to Device 1; plots 502, 512, and 522 correspond to Device 2, and plots 514 and 524 correspond to Device 3. As shown in FIGS. 5A-5C, MADF emitters have an efficient energy transfer to TBPe and such device structure can efficiently utilize the triplet excitons as well. Device roll-off was also reduced.

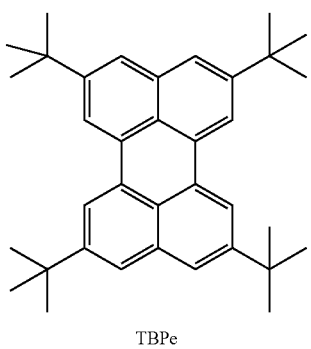

TBPe

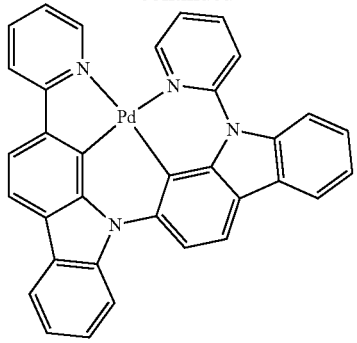

PdN3N

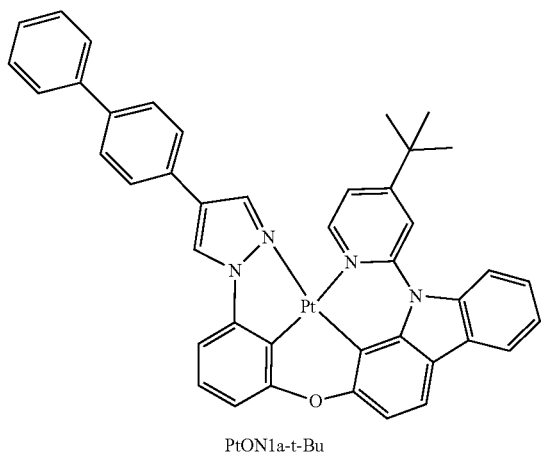

PtON1a-t-Bu

A similar improvement was also achieved when PdN3N was used as a co-host material to improve the device efficiency of red-emitting FLR1-based OLEDs. FLR1 (fluorescent emitter rubrene derivative) and PdN3N are shown below.

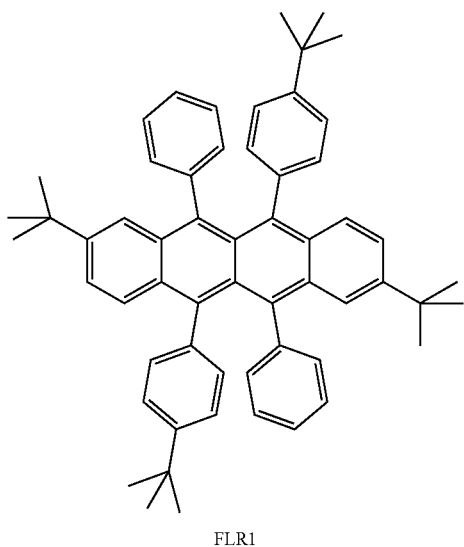

FLR1

Figure 6A:
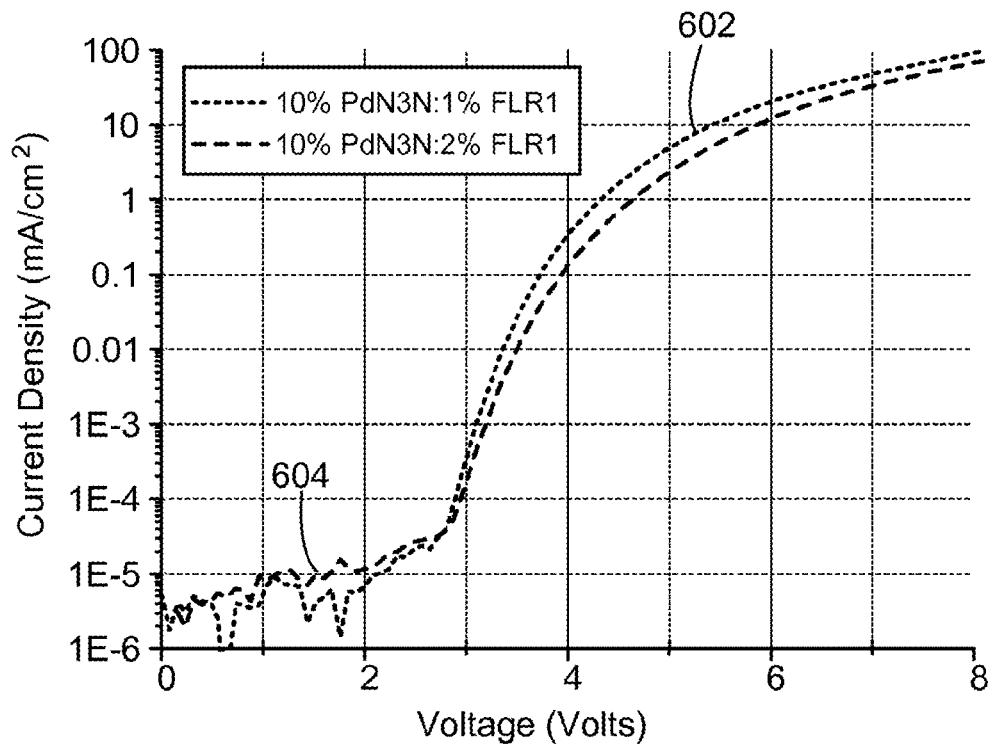
FIG. 6A shows plots of current-voltage characteristics.
Figure 6B:
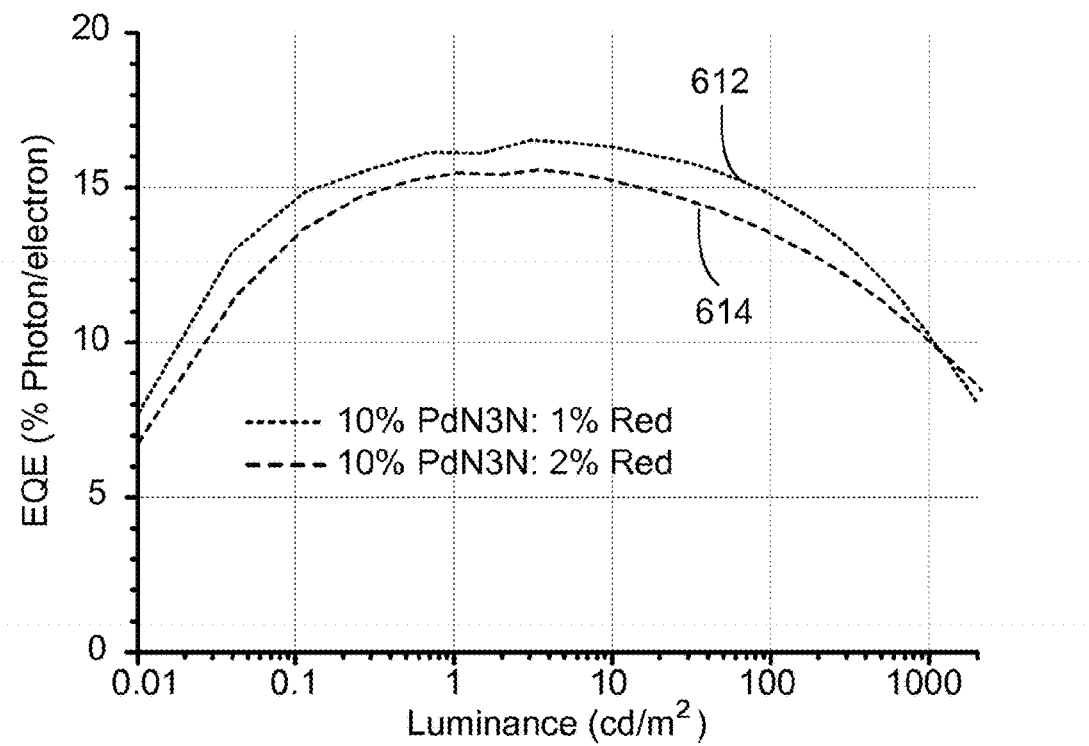
FIG. 6B shows plots of external quantum efficiency vs. brightness.
Figure 6C:
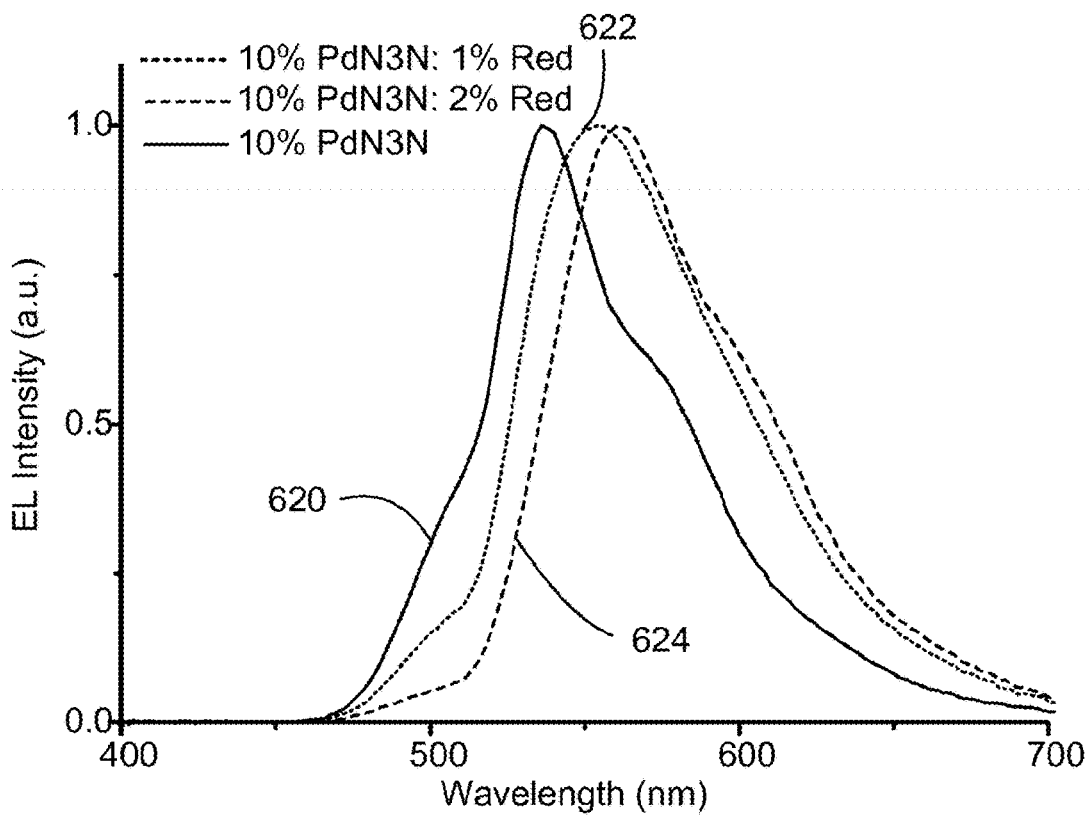
FIG. 6C shows electroluminescent spectra of devices with a general device structure of ITO/HATCN/NPD/TAPc/EML/DPPS/BmPyPB/LiF/Al, where EMLs are (1) 10% PdN3N:26mCPy; (2) 10% PdN3N:1% FLR1:26mCPy and (3) 10% PdN3N:2% FLR1:26mCPy.

FIGS. 6A, 6B, and 6C show plots of current-voltage characteristics, external quantum efficiency vs. brightness, and electroluminescent spectra, respectively, of Devices 4-6 with a general device structure of ITO/HATCN/NPD/TAPc/EML/DPPS/BmPyPB/LiF/Al, where EMLs are (1) 10% PdN3N:26mCPy; (2) 10% PdN3N:1% FLR1:26mCPy and (3) 10% PdN3N:2% FLR1:26mCPy, respectively. Plot 620 corresponds to Device 4; plots 602, 612, and 622 correspond to Device 5; and plots 604, 614, and 624 correspond to Device 6.

Figure 7A:
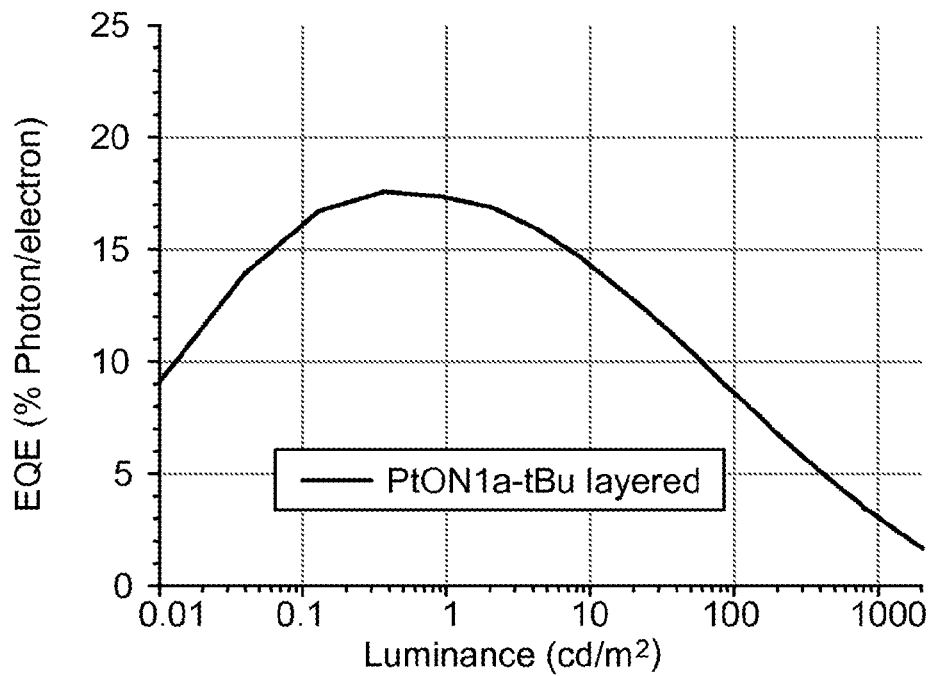
FIG. 7A shows a plot of external quantum efficiency vs. brightness.
Figure 7B:
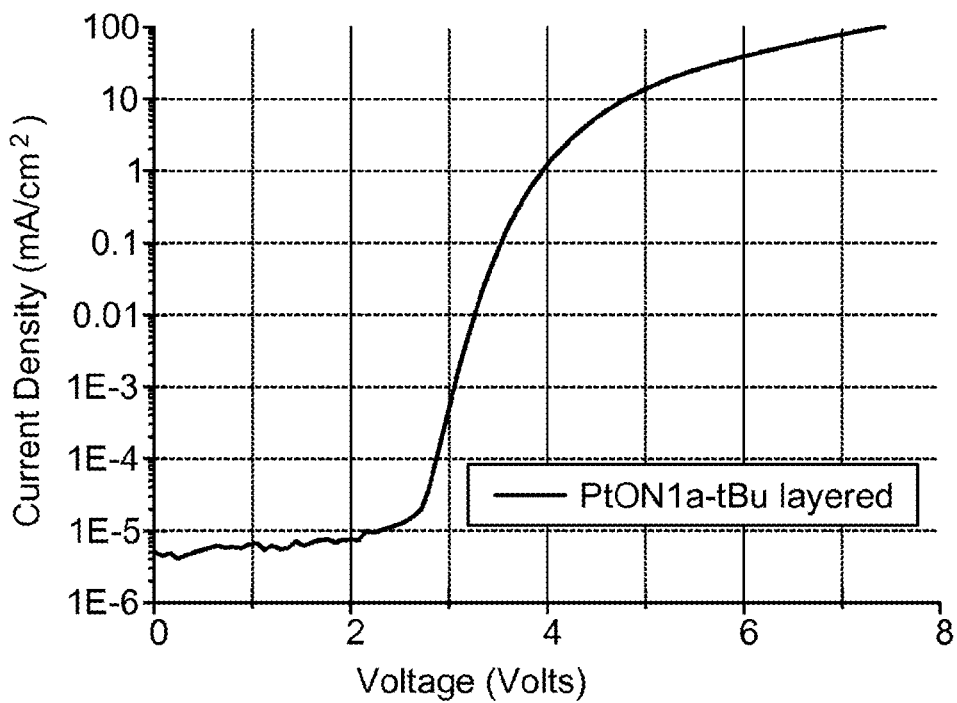
FIG. 7B shows a plot of current-voltage characteristics.
Figure 7C:
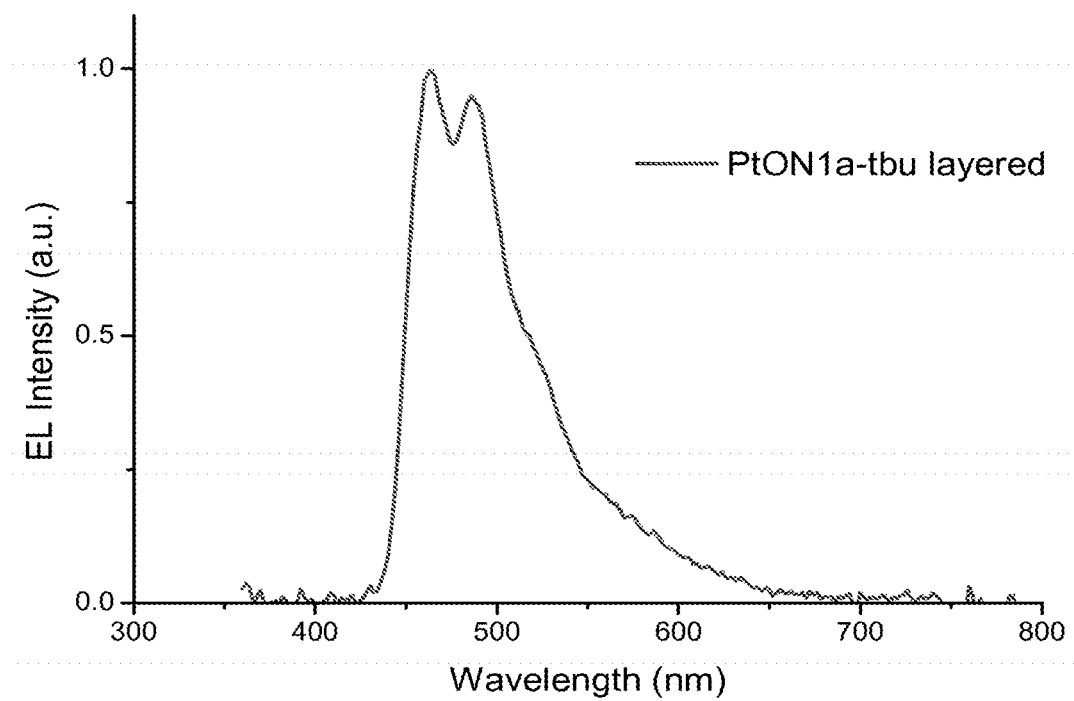
FIG. 7C shows an electroluminescent spectrum of a device with a general device structure of ITO/HATCN/NPD/TAPc/EML/DPPS/BmPyPB/LiF/Al, where alternative EMLs are (1) 10% PtON1a:26mCPy and (2) 2% TBPe:26mCPy.

To circumvent the potential tradeoff between high FRET efficiency and efficiency losses from direct exciton formation on TBPe molecules, the device depicted in FIG. 4 was implemented. Devices were fabricated in the structure ITO/HATCN (10 nm)/NPD (40 nm)/TAPC (10 nm)/26mCPy:10% PtON1a (4 nm)/26mCPy:2% TBPe (2 nm)/26mCPy:10% PtON1a (4 nm)/26mCPy:2% TBPe (2 nm)/26mCPy:10% PtON1a (4 nm)/DPPS (10 nm)/BmPyPB (40 nm)/LiF/Al. In this structure, alternating MADF and fluorescent doped layers were used. This order was selected so that the recombination zone, which typically resides near one of the charge blocking layers due to potential charge imbalances, was located on the PtON1a doped layer so that the majority of the excitons are formed on the PdON1a molecules which can harvest 100% of the electrogenerated excitons. The layer thicknesses were also kept low so that there was a sufficiently small distance between the phosphorescent material and the fluorescent emitters so that rapid FRET could occur. FIGS. 7A, 7B, and 7C show external quantum efficiency vs. brightness, current-voltage characteristics, and electroluminescent spectra for this device. As shown in FIGS. 7A-7C, this device demonstrated a much higher efficiency (close to 20%) while still exhibiting emission primarily originating from the fluorescent emitter, indicating the capability to manipulate the emission spectrum and emit nearly exclusively from fluorescent emitters while maintaining a high efficiency.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description. Changes may be made in the elements described herein without departing from the spirit and scope as described in the following claims.

What is claimed is:

1. A light emitting device comprising:
   a first electrode;
   a hole transporting layer in contact with the first electrode;
   a second electrode;
   an electron transporting layer in contact with the second electrode; and
   an emissive layer between the hole transporting layer and the electron transporting layer, the emissive layer comprising a metal-assisted delayed fluorescent (MADF) emitter, a fluorescent emitter, and a host, wherein the MADF emitter harvests electrogenerated singlet and triplet excitons and transfers energy to the fluorescent emitter.

2. The light emitting device of claim 1, wherein the energy transfer is from a triplet of the MADF emitter to a singlet of the fluorescent emitter.

3. The light emitting device of claim 1, wherein the energy transfer is from a singlet of the MADF emitter to a singlet of the fluorescent emitter.

4. A light emitting device comprising:
   a first electrode;
   a hole transporting layer in contact with the first electrode;
   a second electrode;
   an electron transporting layer in contact with the second electrode; and
   an emissive layer between the hole transporting layer and the electron transporting layer;
   wherein the emissive layer comprises:
   n emitter layers comprising a host and a fluorescent emitter; and
   m donor layers comprising a host and a metal-assisted delayed fluorescent (MADF) emitter,
   wherein n and m are integers ≥1;
   wherein n=m+1;
   wherein each emitter layer is adjacent to at least one donor layer; and
   wherein the MADF emitter harvests electrogenerated singlet and triplet excitons and transfers energy to the fluorescent emitter.

5. The light emitting device of claim 1, wherein the fluorescent emitter comprises one of the following compounds:

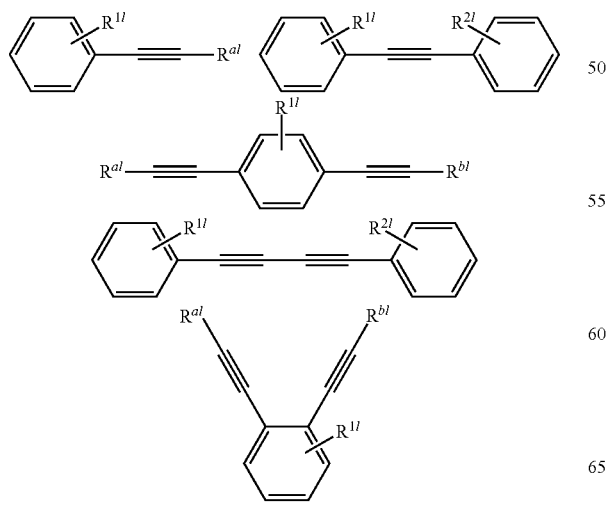

-continued

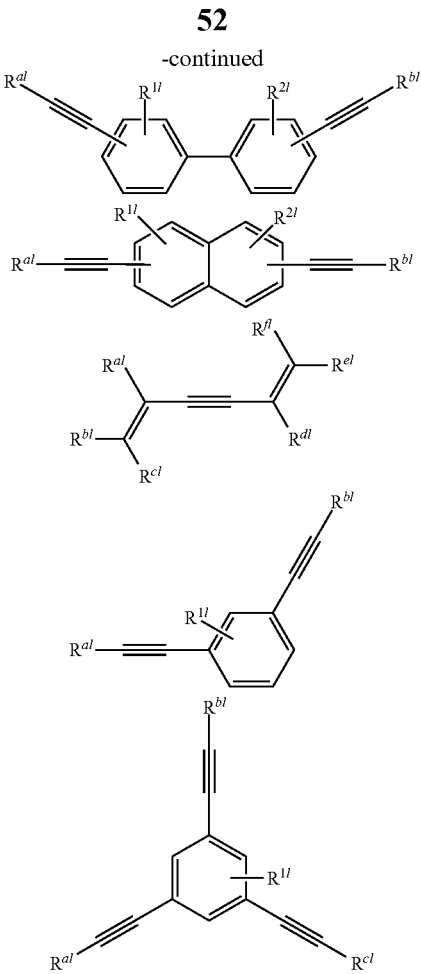

wherein $R^{al}$, $R^{bl}$, $R^{cl}$, $R^{dl}$, $R^{el}$, $R^{fl}$, $R^{gl}$, $R^{hl}$ and $R^{il}$ can be one of the following structure:

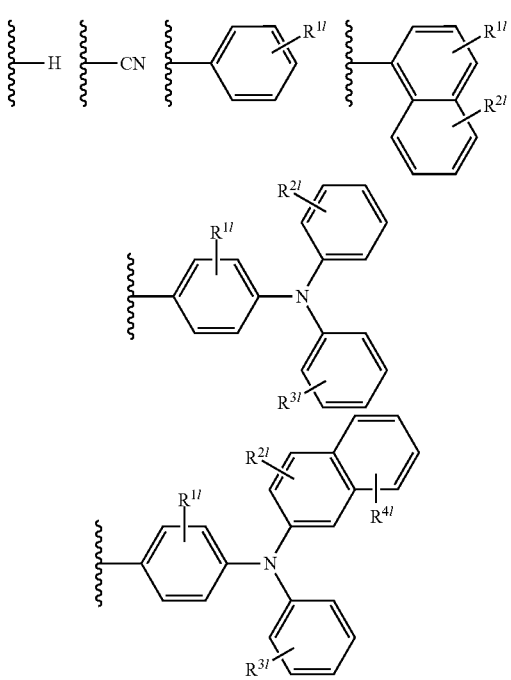

3. Heterocyclic Compounds and Their Derivatives
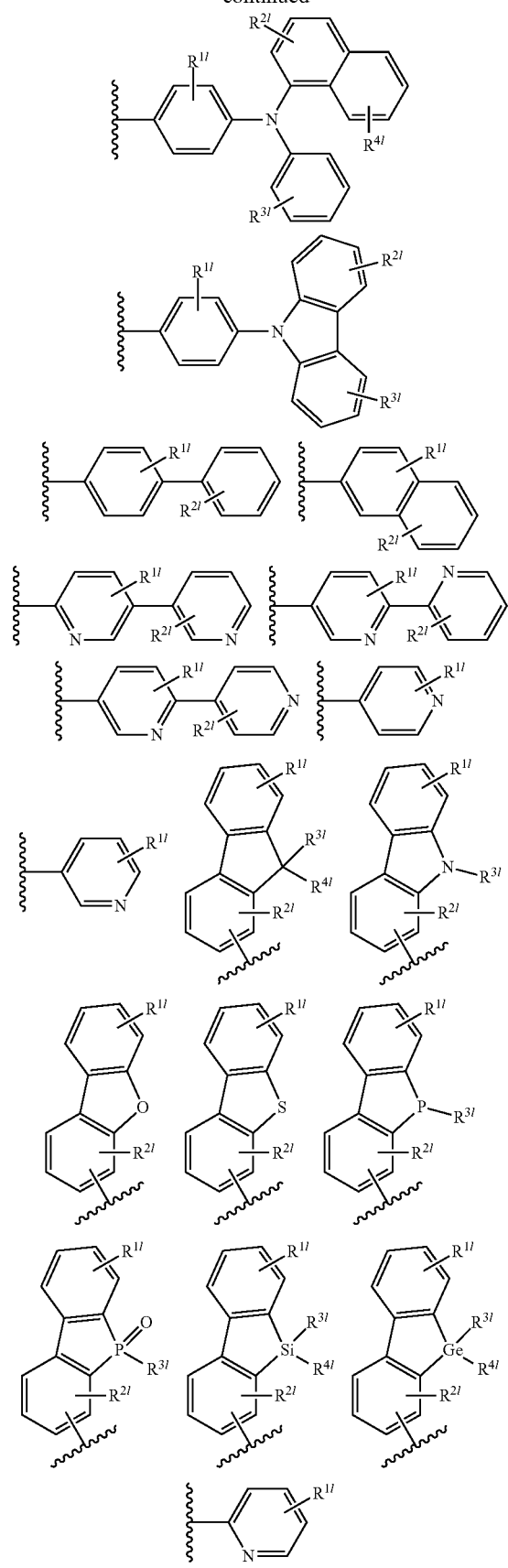
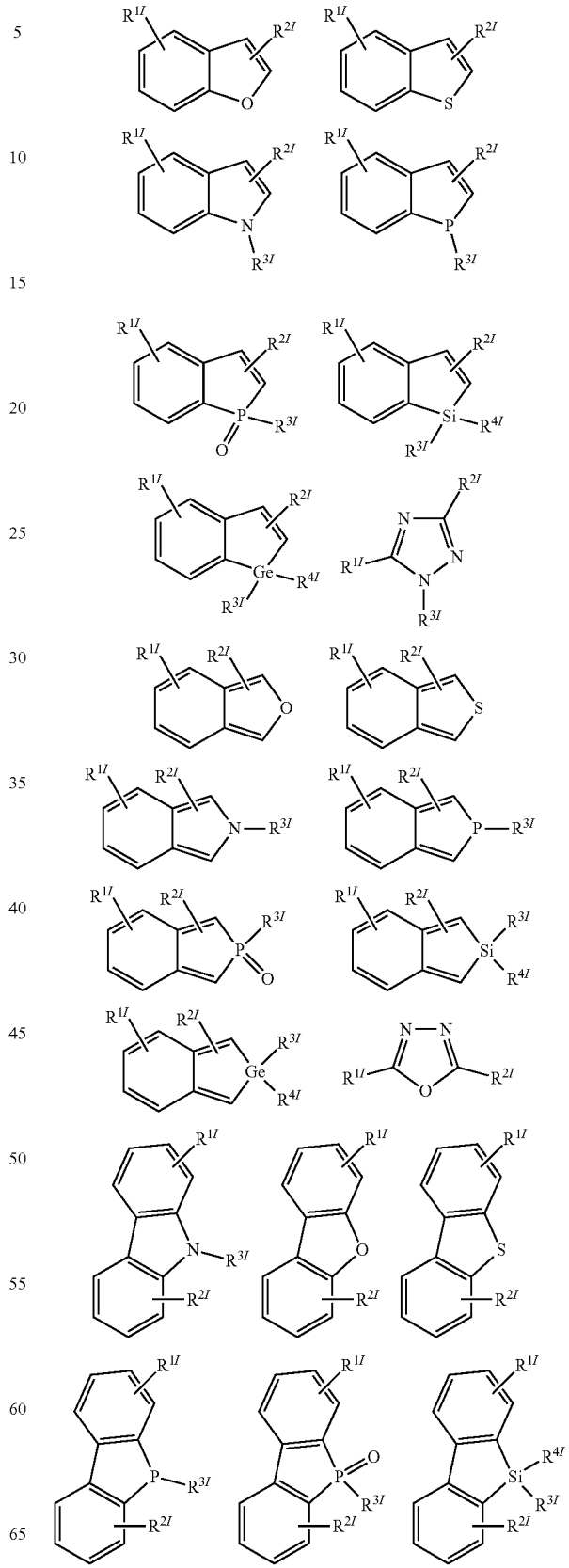

-continued
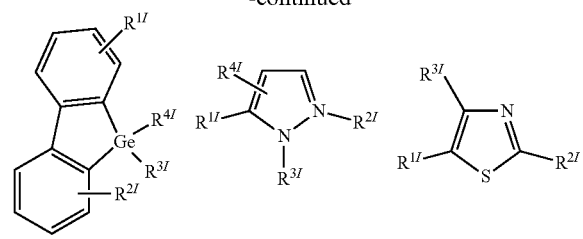
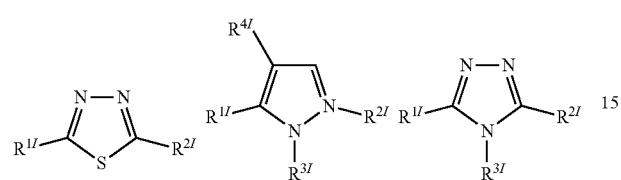
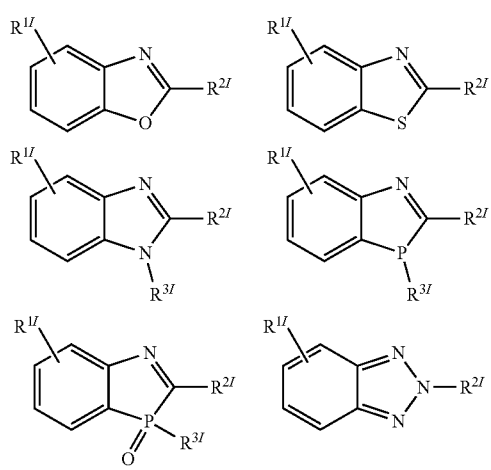
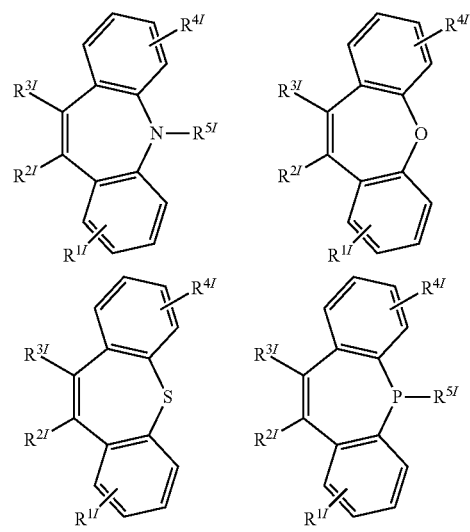
-continued
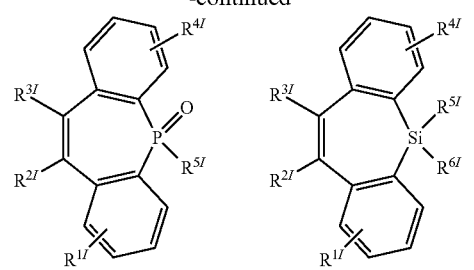
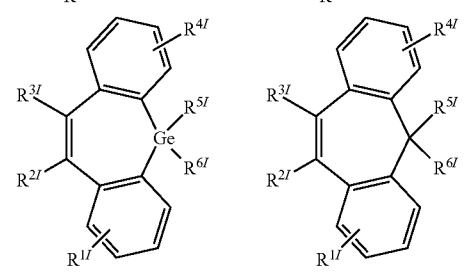
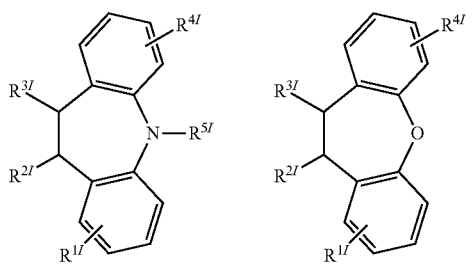
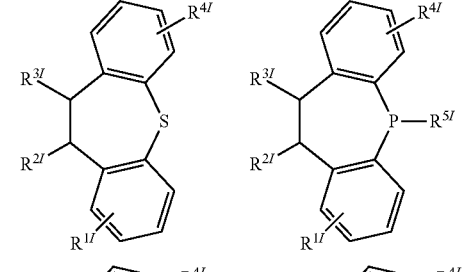
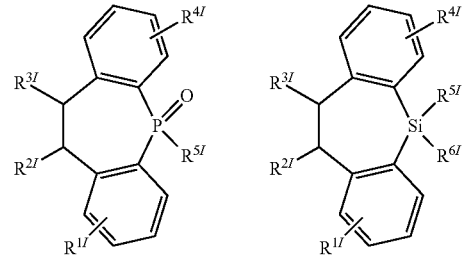
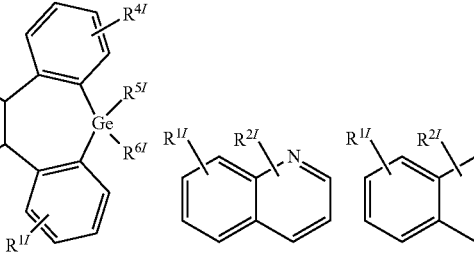
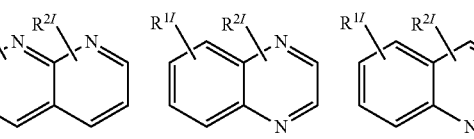

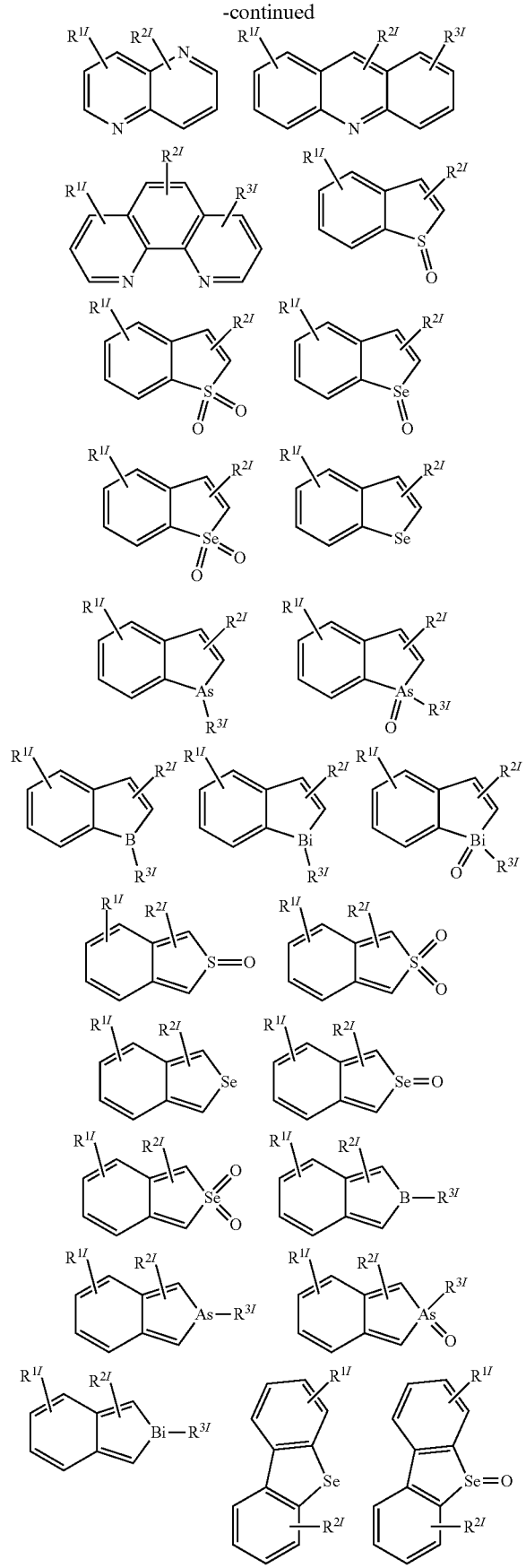
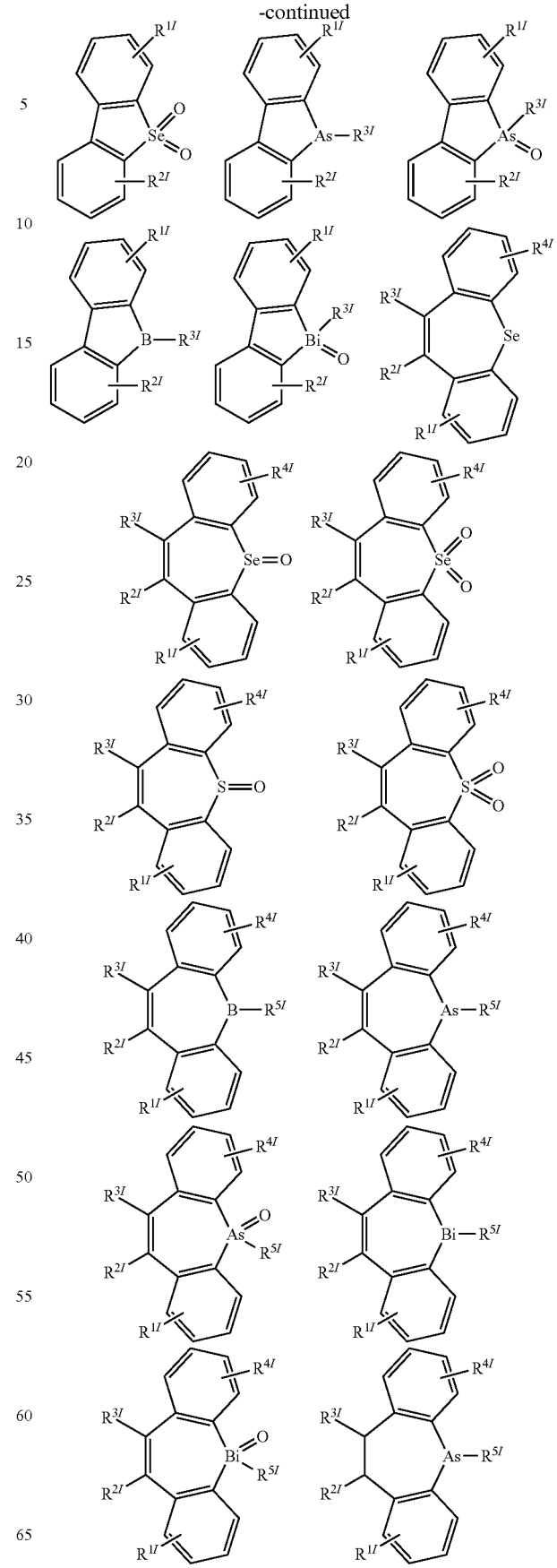

-continued
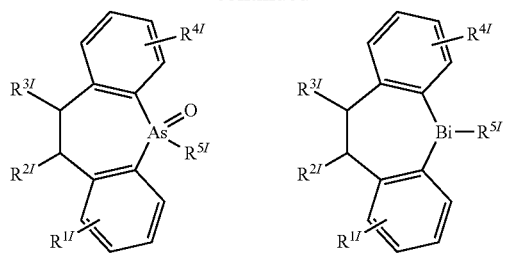
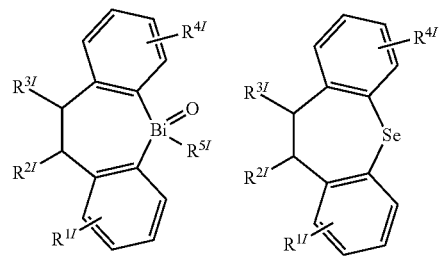
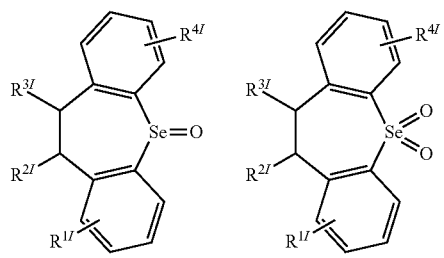
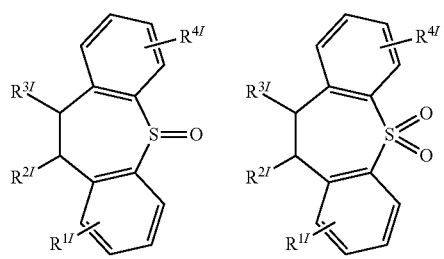
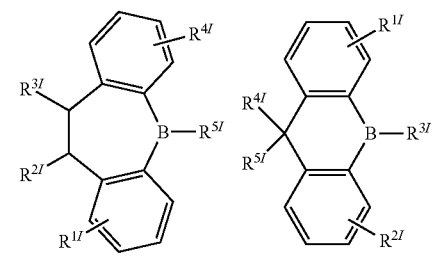
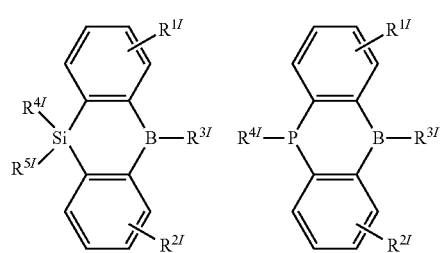
-continued
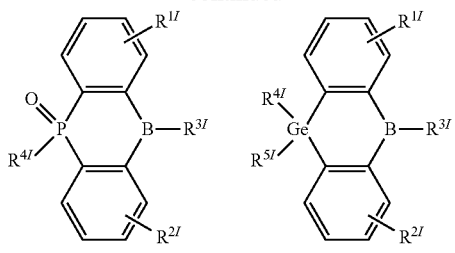
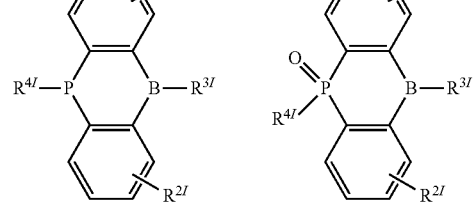
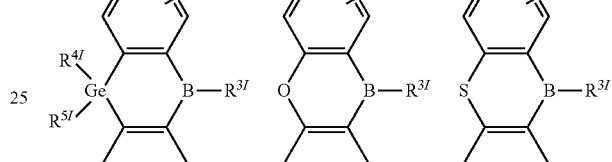
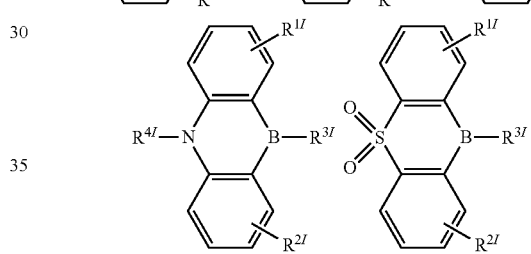
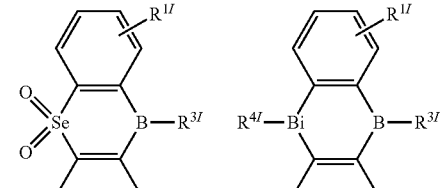
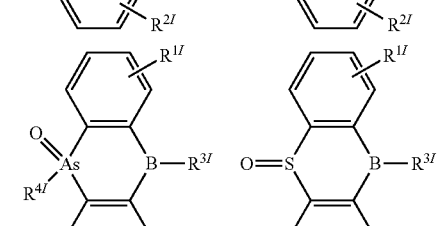
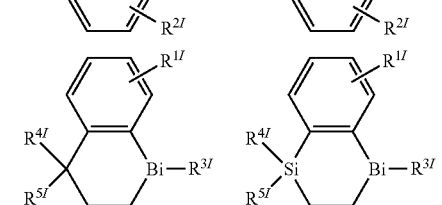
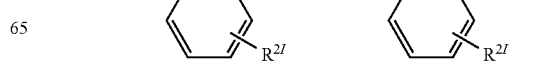

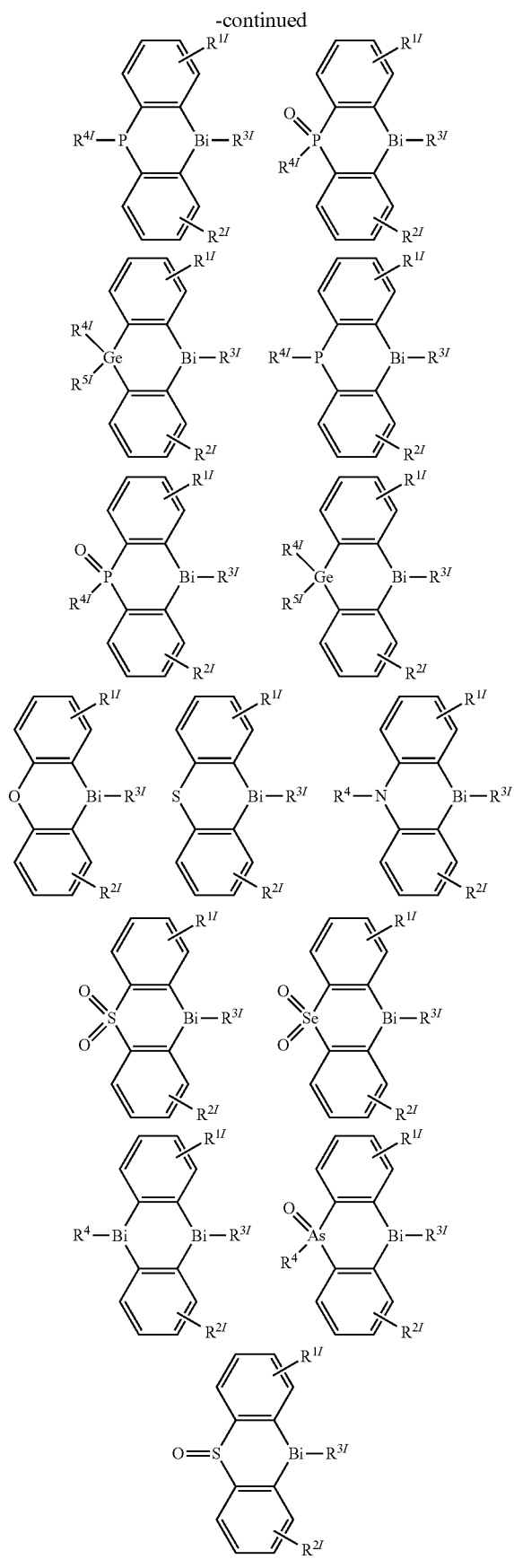
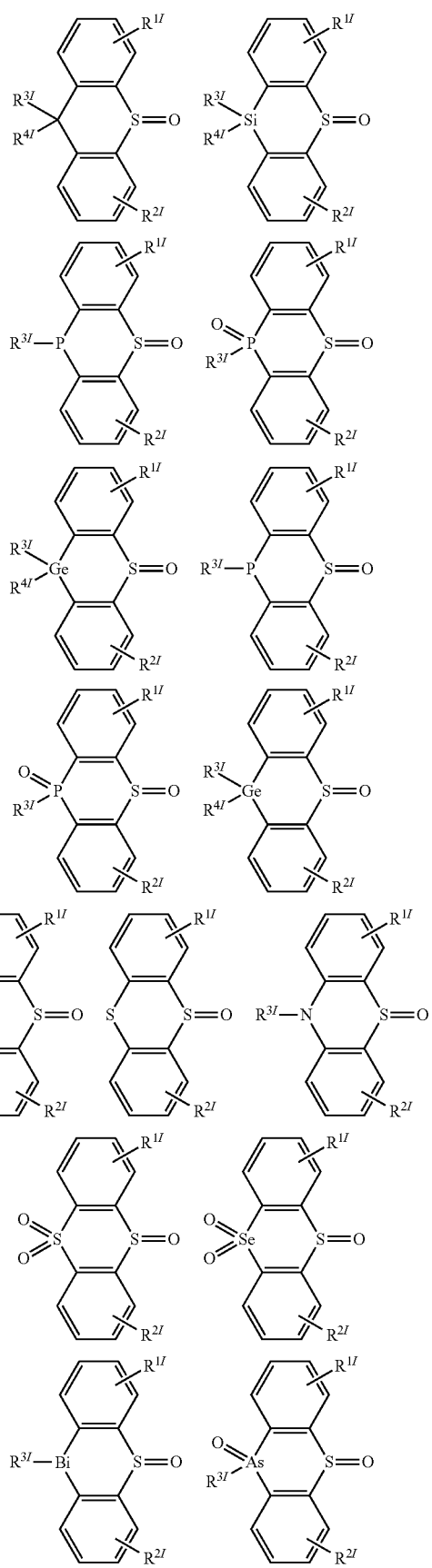

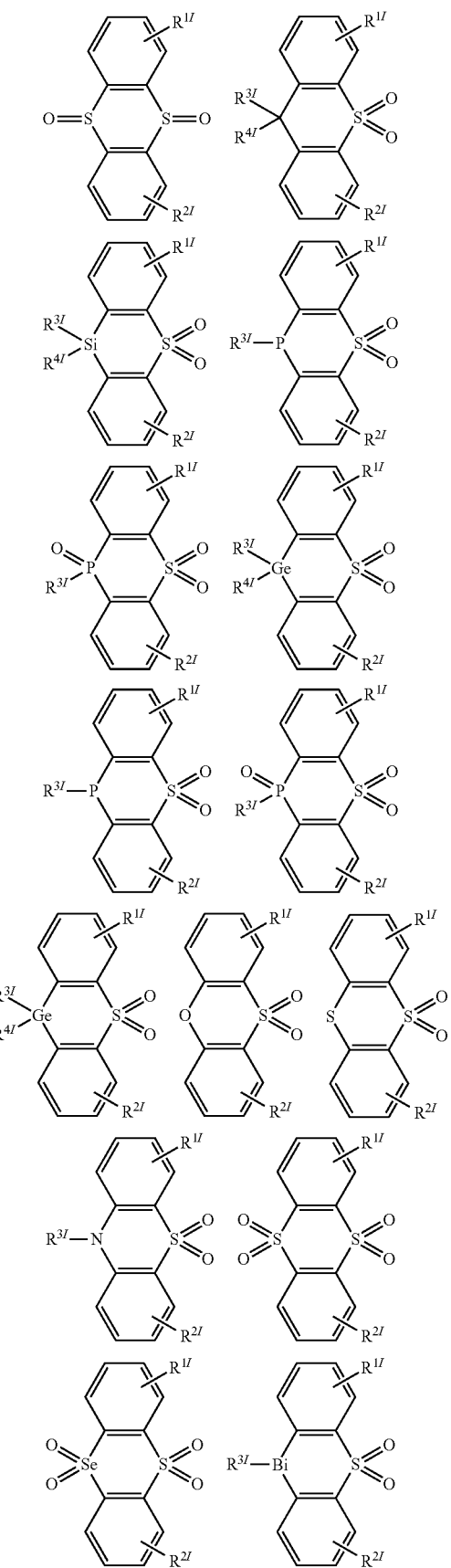
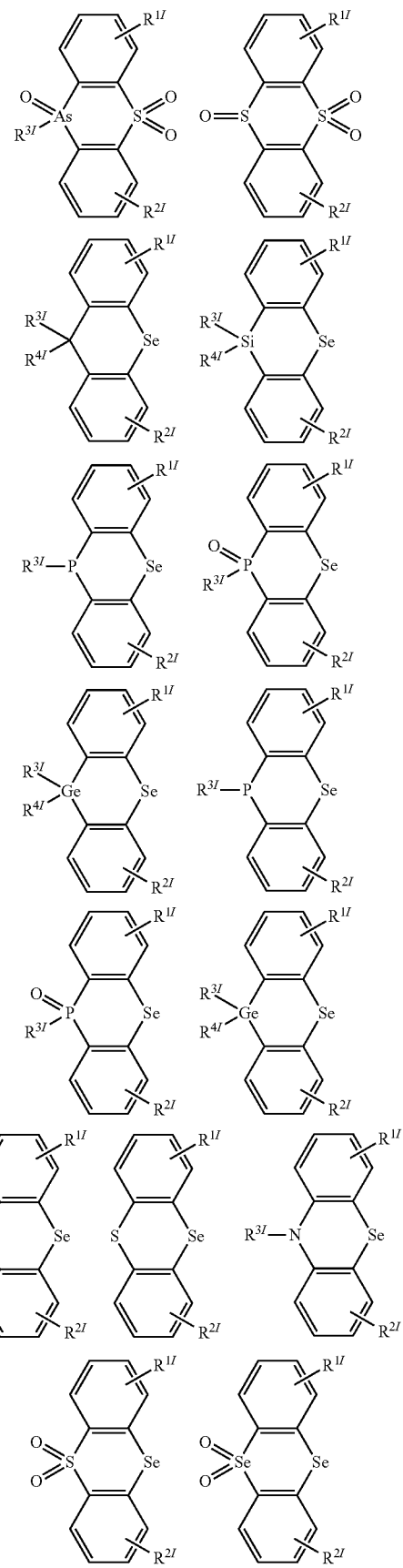

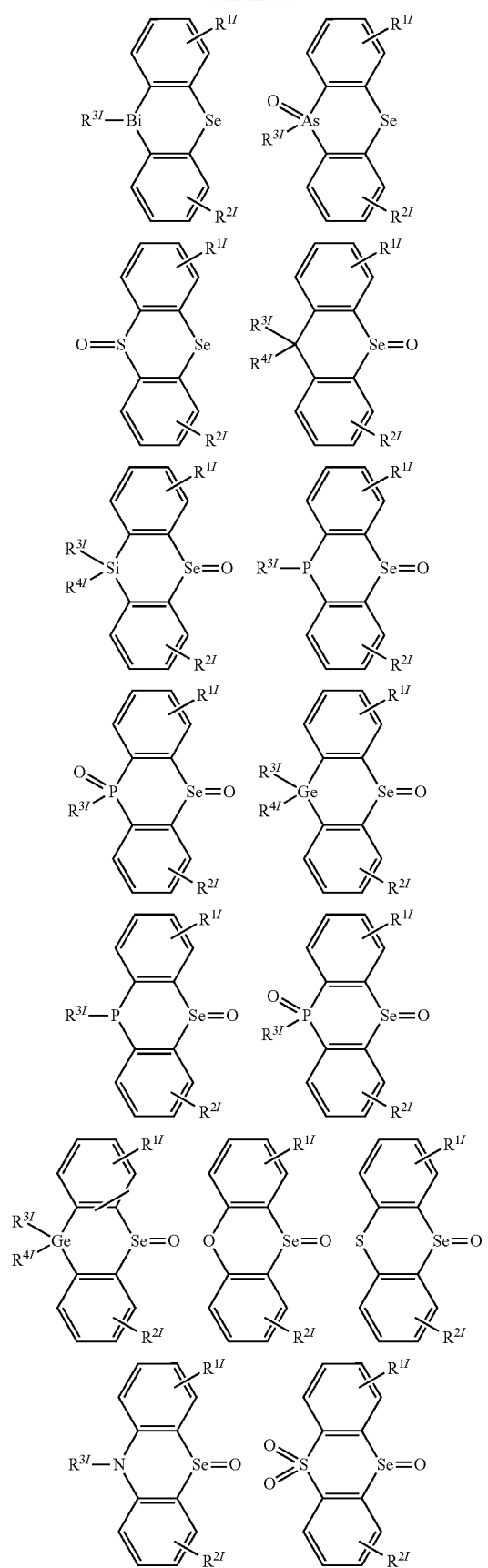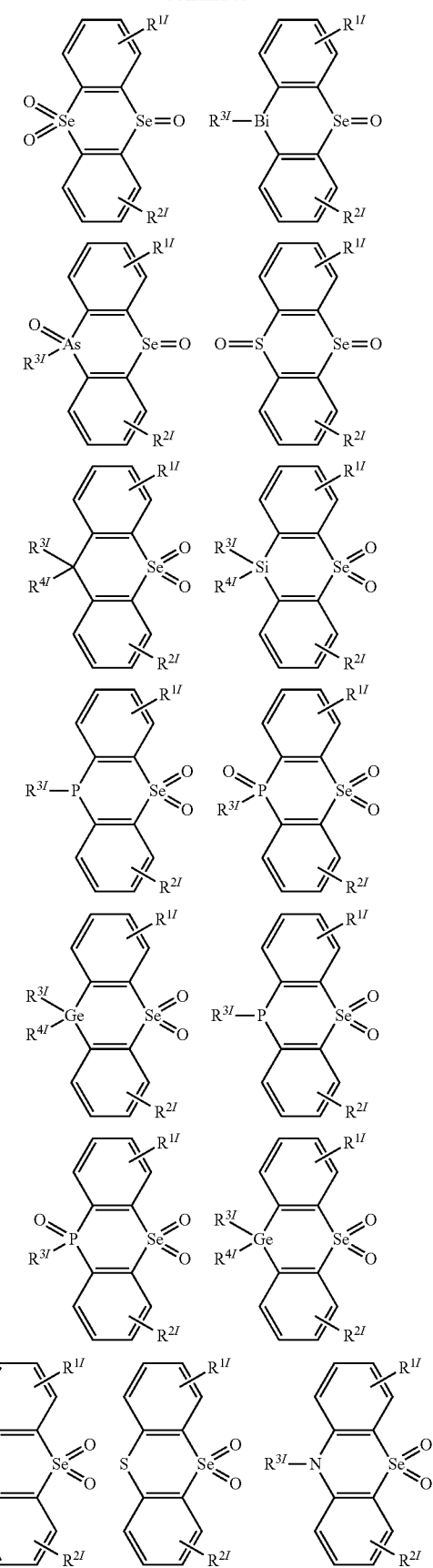

-continued
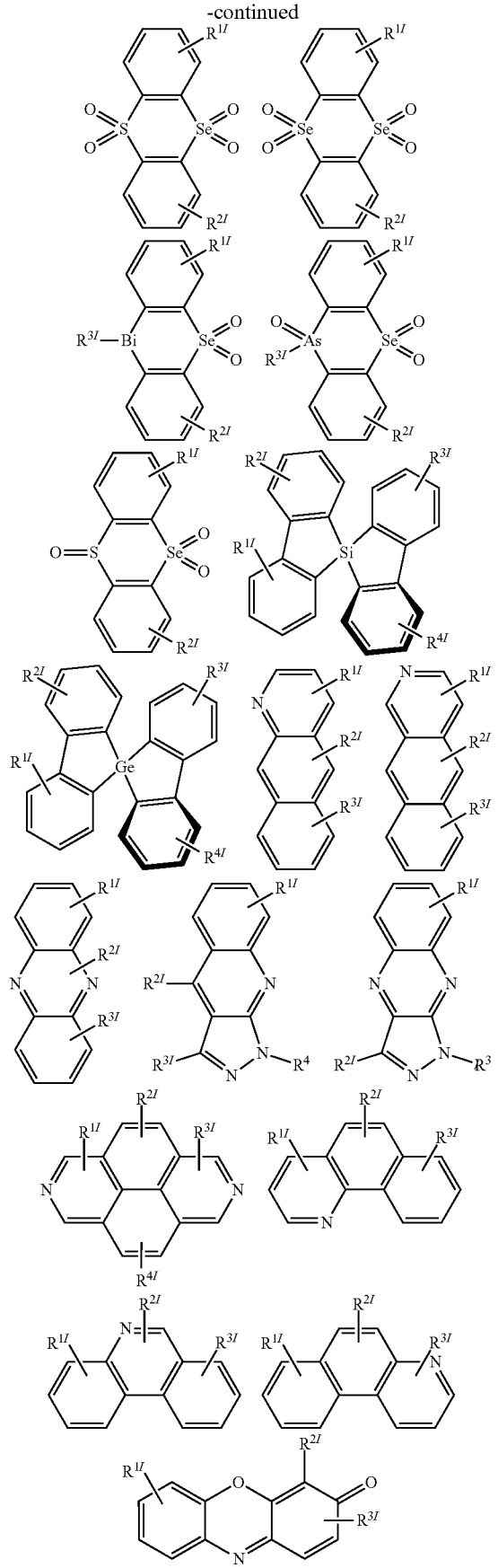
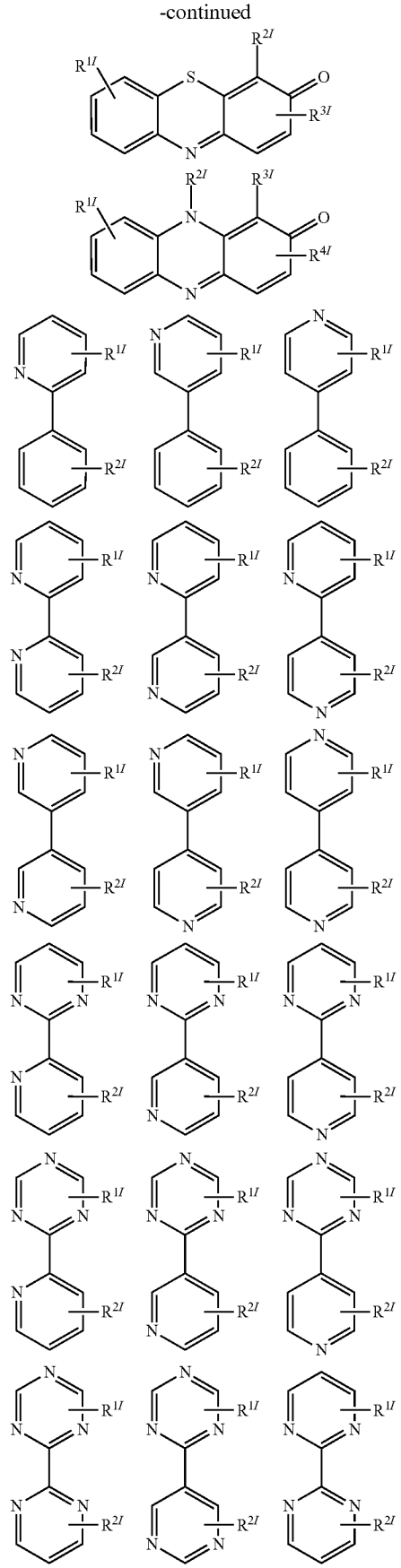

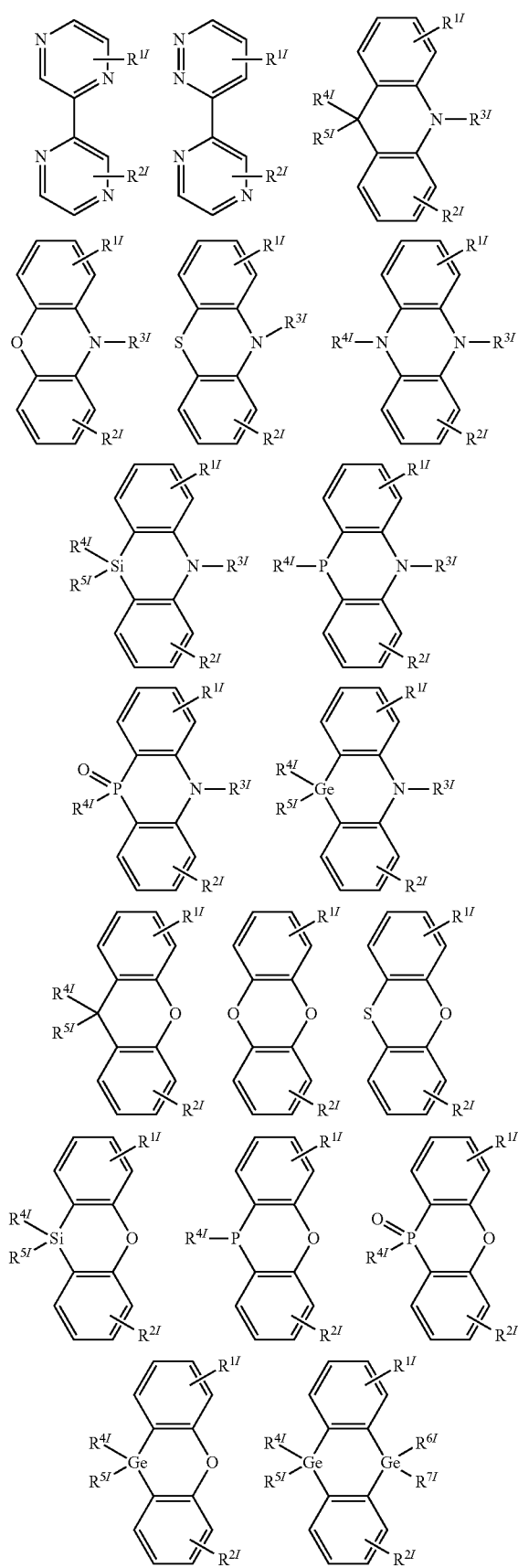
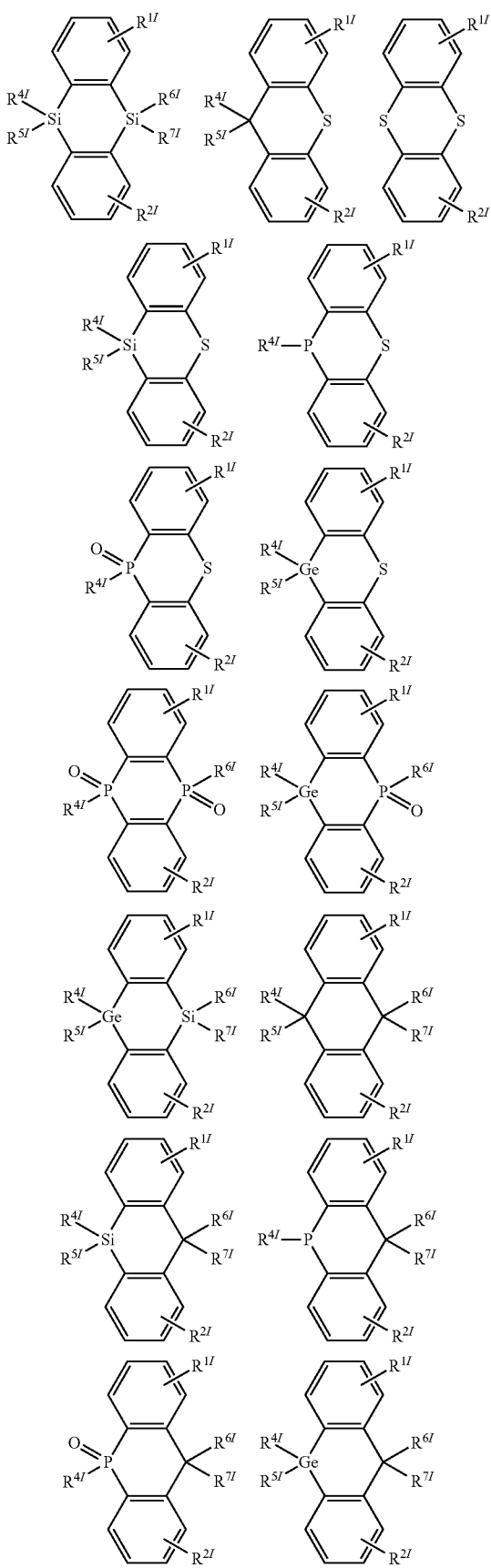

-continued
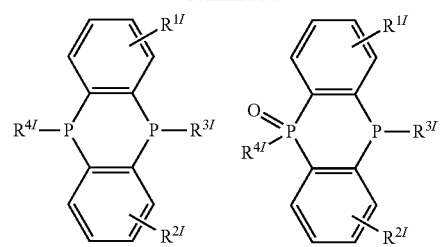
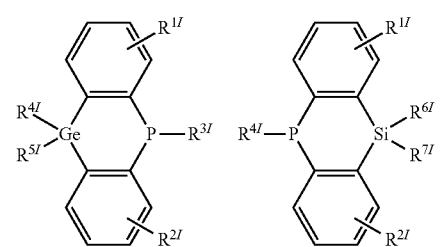
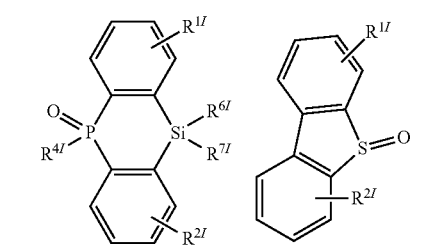
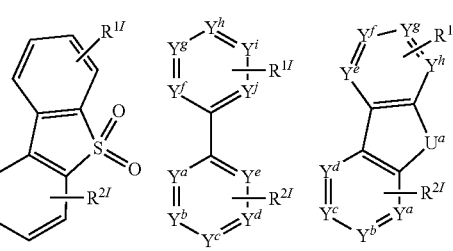
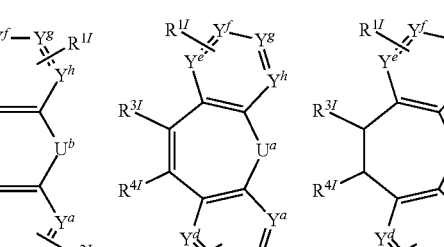
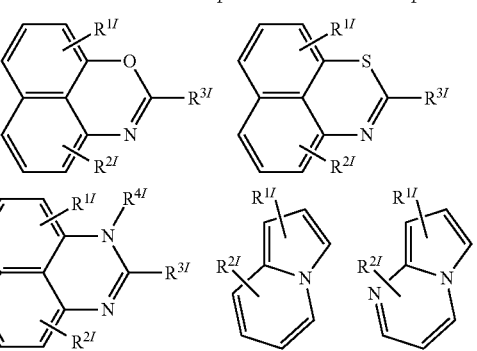
-continued
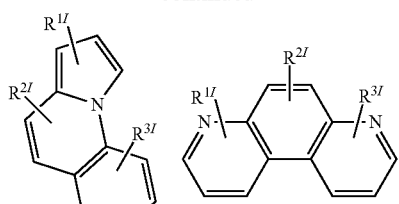
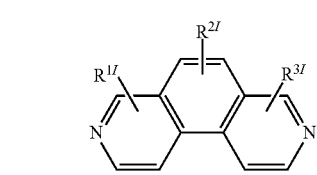
4. Other fluorescent luminophors
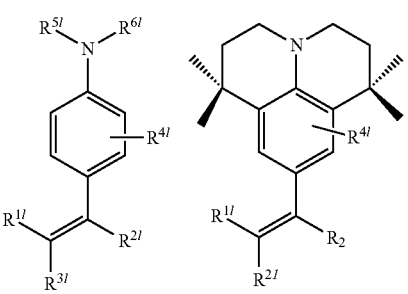
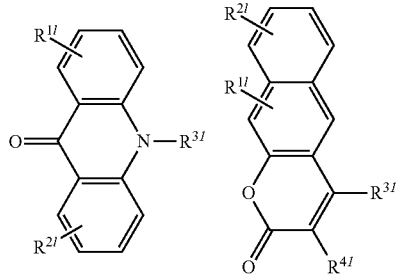
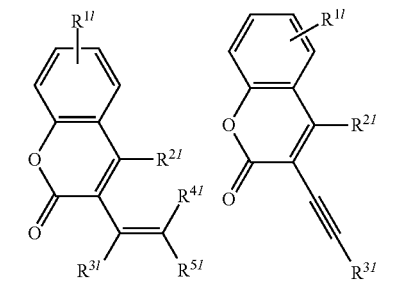
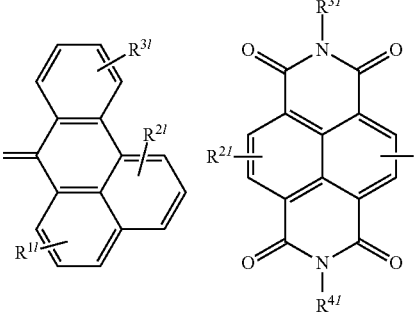

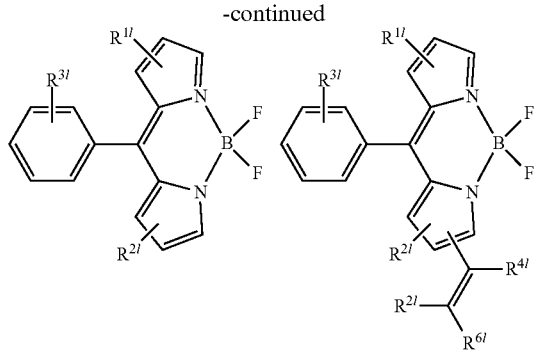
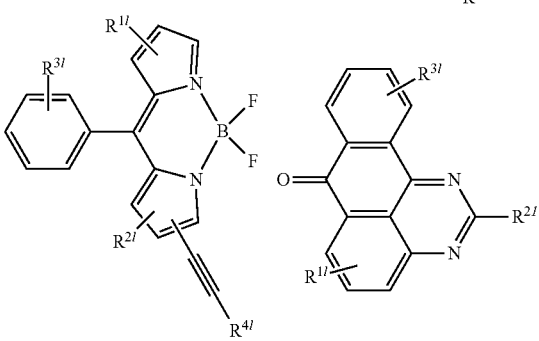
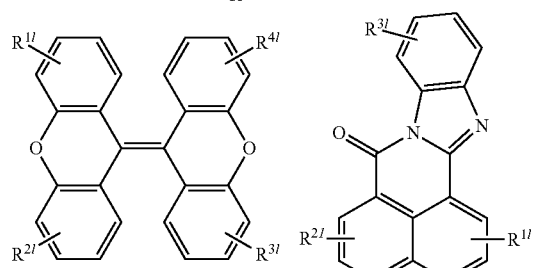
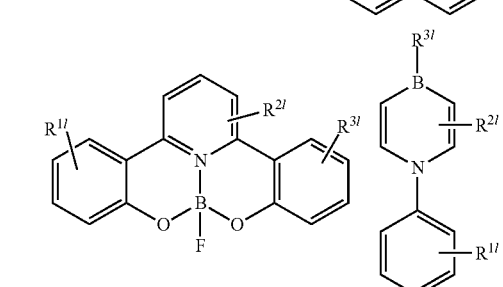
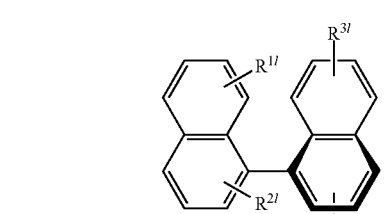
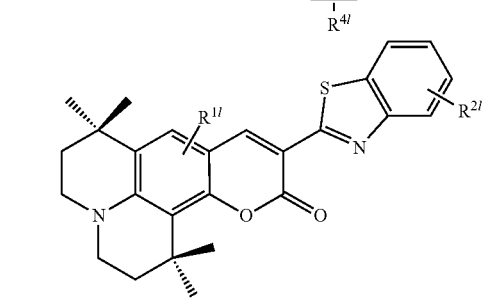
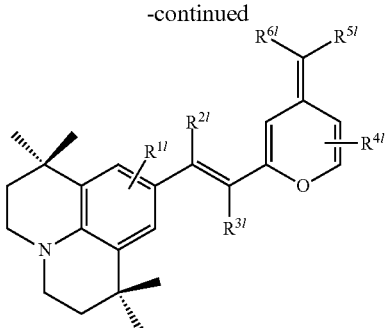
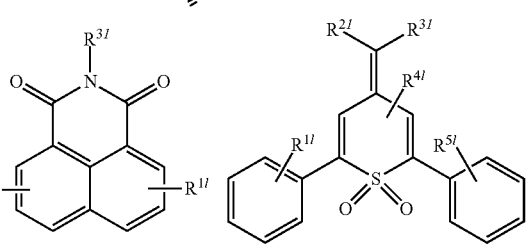
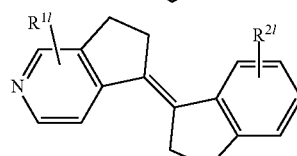
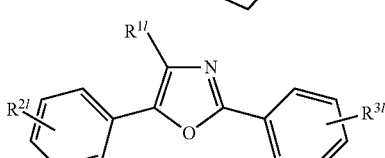
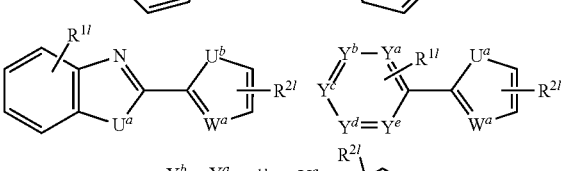
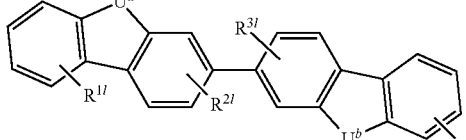
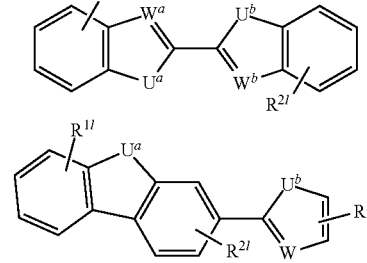
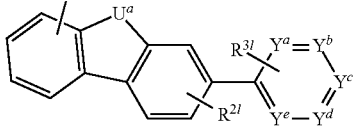

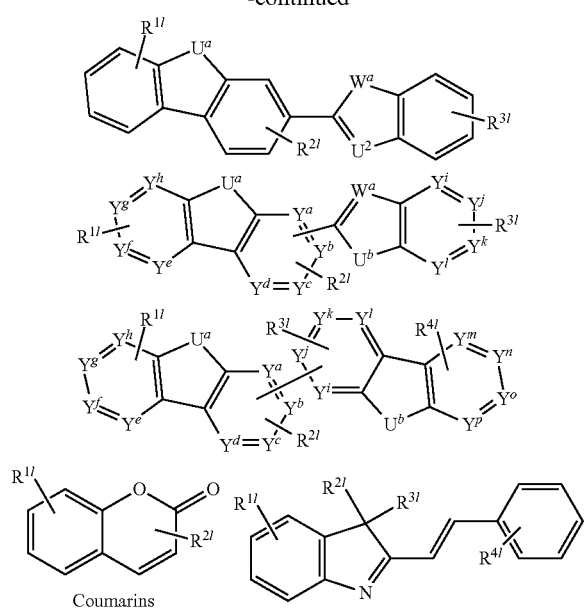

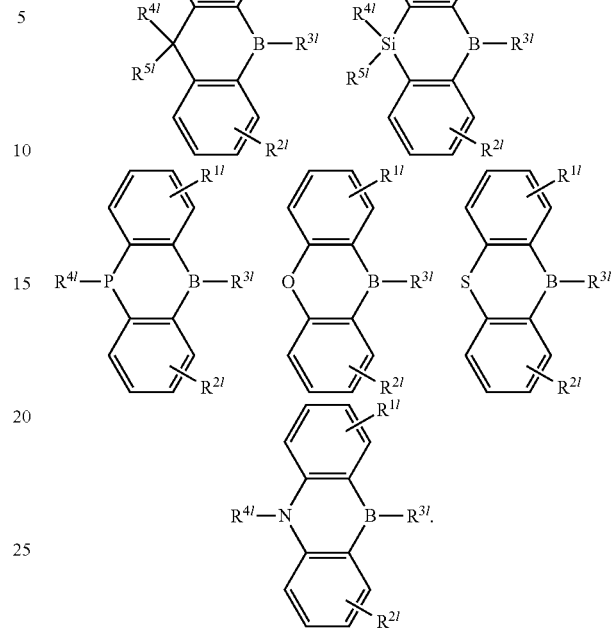

wherein:
each of $R^{1l}$, $R^{2l}$, $R^{3l}$, $R^{4l}$, $R^{5l}$, $R^{6l}$, $R^{7l}$ and $R^{8l}$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric, or any conjugate or combination thereof, and each of $Y^a$, $Y^b$, $Y^c$, $Y^d$, $Y^e$, $Y^f$, $Y^g$, $Y^h$, $Y^i$, $Y^j$, $Y^k$, $Y^l$, $Y^m$, $Y^n$, $Y^o$, and $Y^p$ is independently C, N or B; and each of $U^a$, $U^b$ and $U^c$ is independently $CH_2$, CRR, C=O, SiRR, $GeH_2$, $GeRR^2$, NH, NR, PH, PR, RP=O, AsR, RAs=O, O, S, S=O, $SO_2$, Se, Se=O, $SeO_2$, BH, BR, RBi=O, BiH or BiR, wherein each R is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric, or any conjugate or combination thereof.

6. The light emitting device of claim 5, wherein the fluorescent emitter comprises one of the following structures:

7. The light-emitting device of claim 1, wherein light emission from the light-emitting device is primarily from the fluorescent emitter.

8. The light emitting device of claim 1, wherein the MADF emitter is a compound of structure (a) or (b):

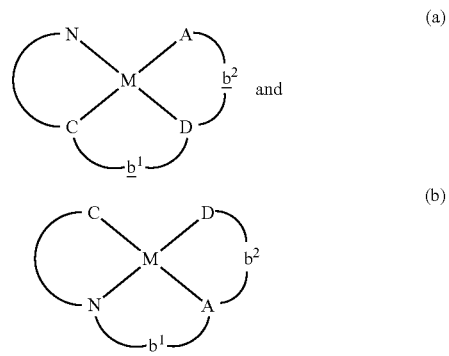

wherein:
M is platinum (II), palladium (II), nickel (II), manganese (II), zinc (II), gold (III), silver (III), copper (III), iridium (I), rhodium (I), or cobalt (I);
A is an accepting group having one of the following structures, which can optionally be substituted:

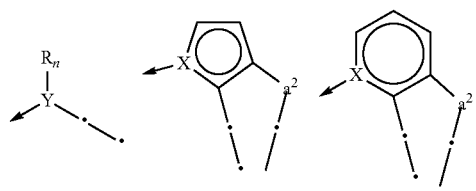

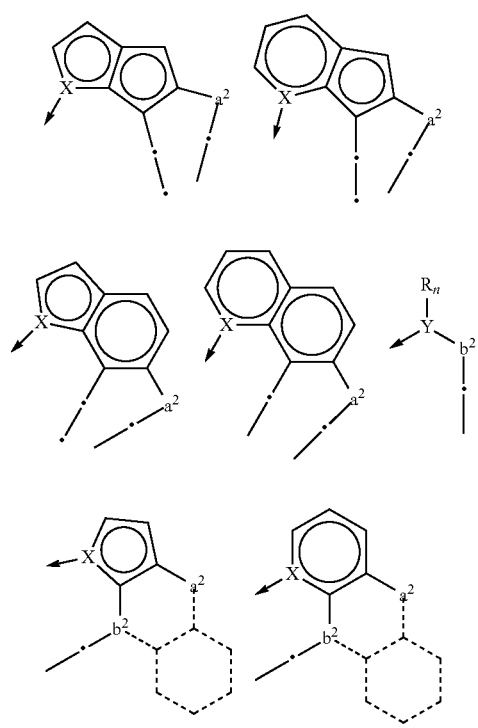
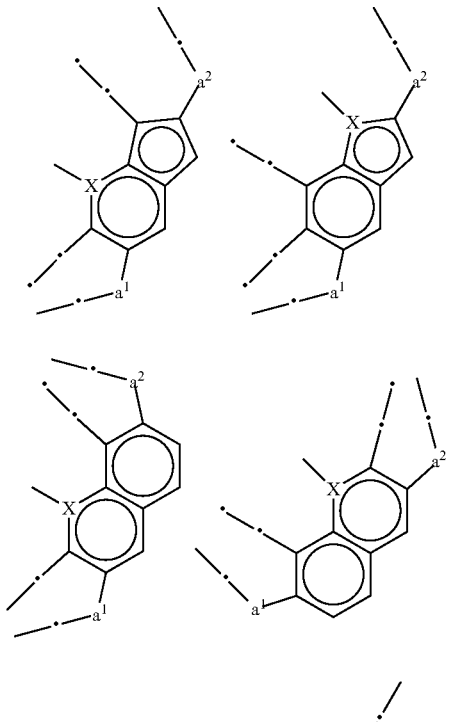
D is a donor group having one of the following structures, which can optionally be substituted:
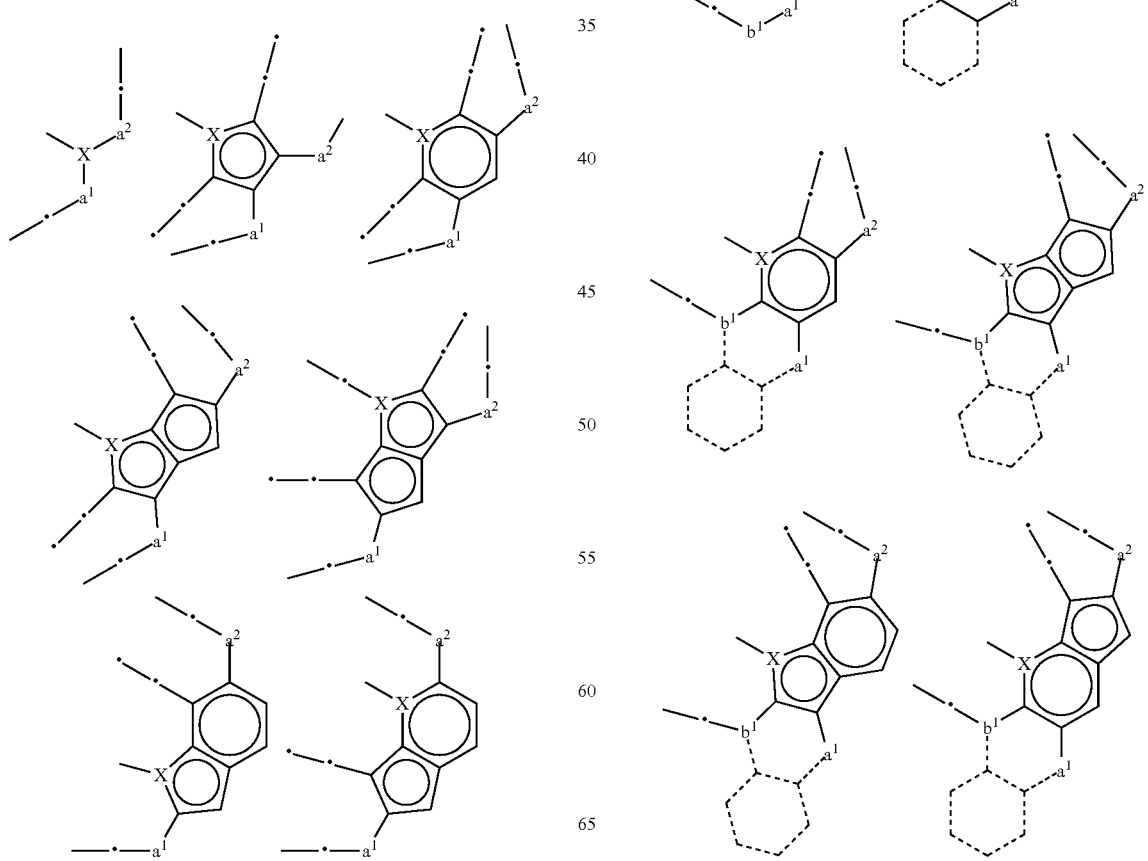

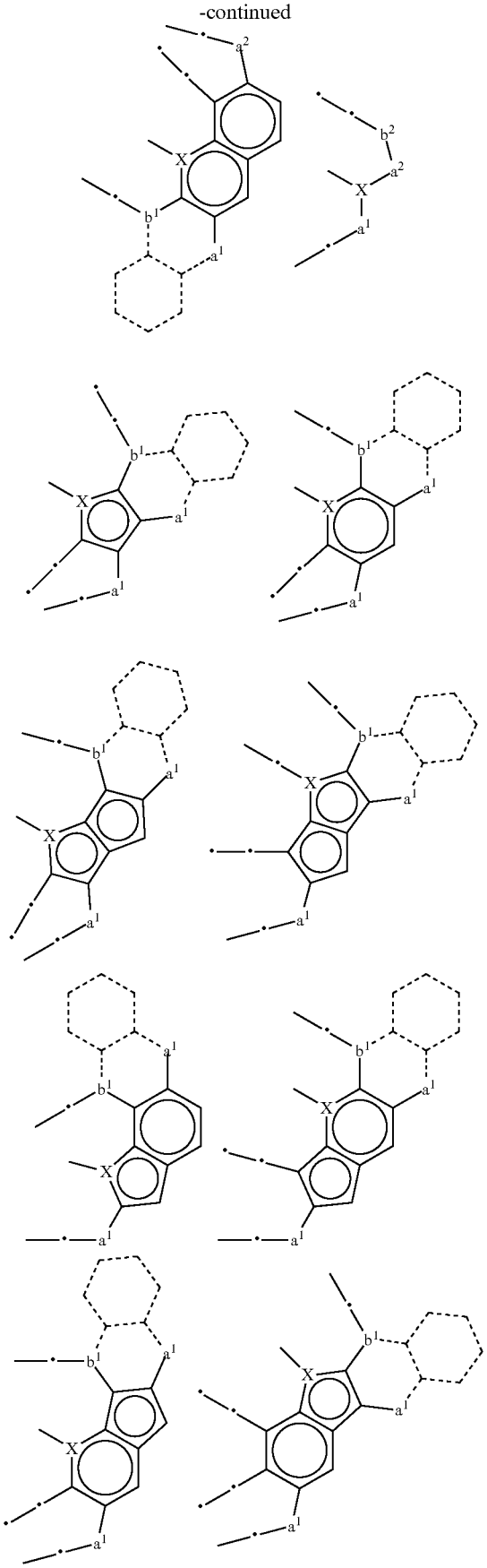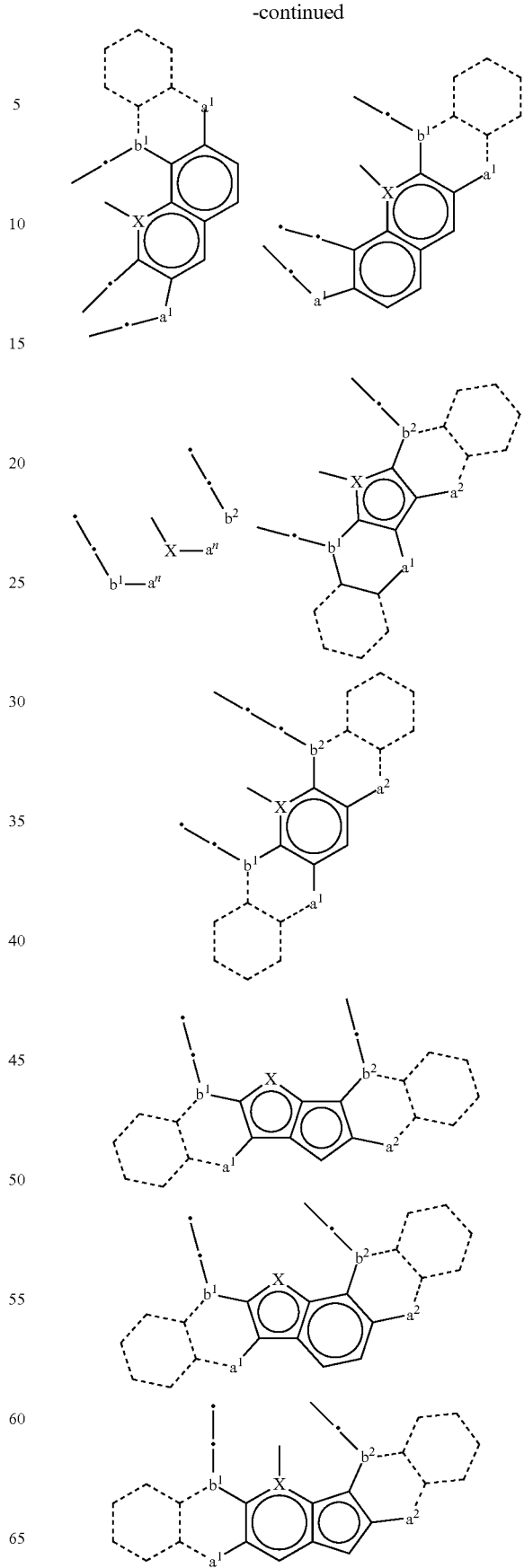

-continued
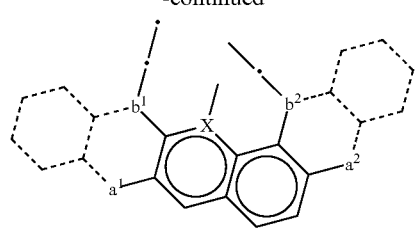
C has one of the following structures, which can optionally be substituted:
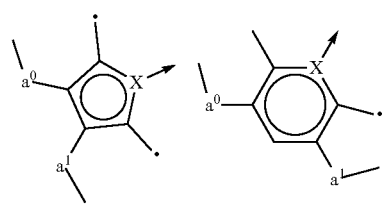
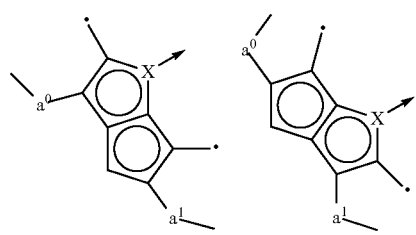
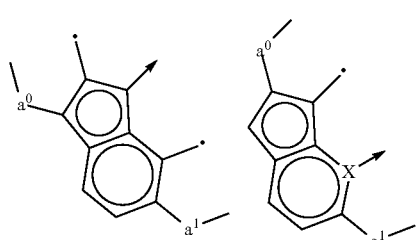
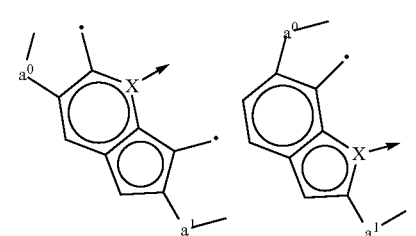
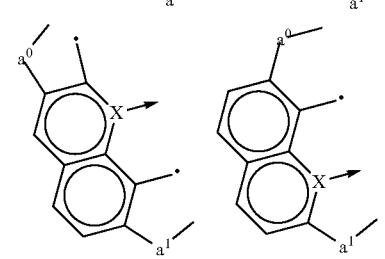
-continued
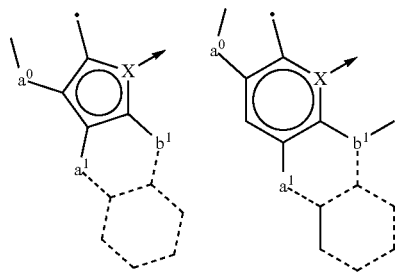
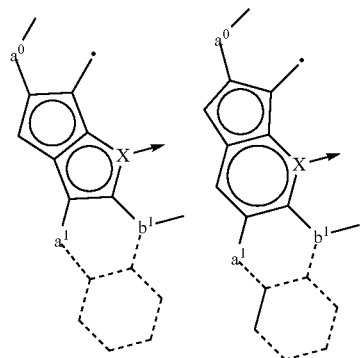
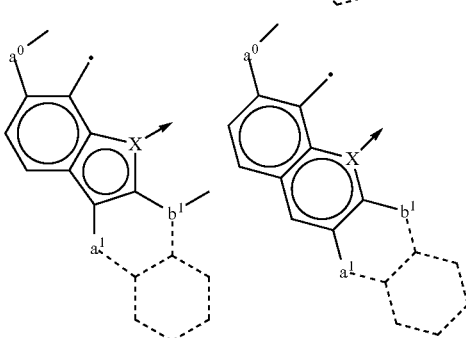
N has one of the following structures, which can optionally be substituted:
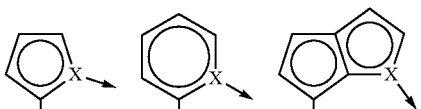
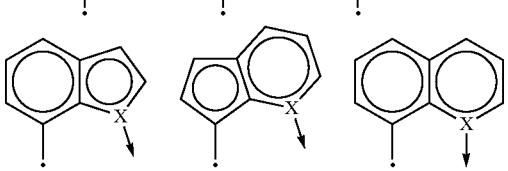
each of $a^0$, $a^1$, and $a^2$ is independently present or absent, and if present, is a direct bond or linking group having one of the following structures:
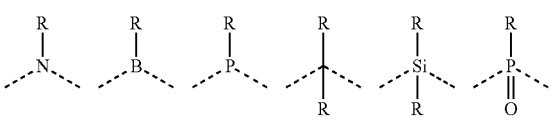

-continued

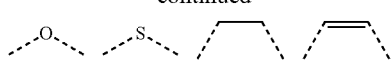

each of b¹ and b² is independently present or absent, and if present, comprises a linking group comprising one or more of the following structures:

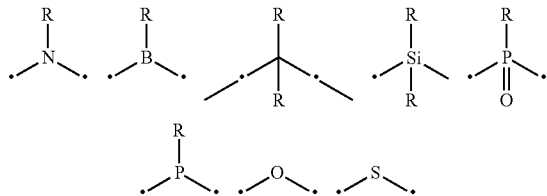

X is B, C, N, O, Si, P, S, Ge, As, Se, Sn, Sb, or Te,

Y is N, P, P=O, As, As=O, CH, CR, SiH, SiR, GeH, GeR, each R is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxy carbonylamino, aryloxycarbonylamino, sulfonylamino, sulfamoyl, carbamoyl, alkylthio, ureido, phosphoramide, silyl, polymeric, or any conjugate or combination thereof, and n is an integer that satisfies the valency of Y.

9. The light emitting device of claim 8, wherein a² is absent.

10. The light emitting device of claim 8, wherein a² and b² are absent.

11. The light emitting device of claim 8, wherein X is N.

12. The light emitting device of claim 8, wherein A is

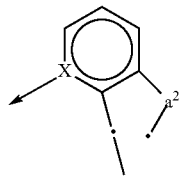

a² is absent, b² is absent, and D is

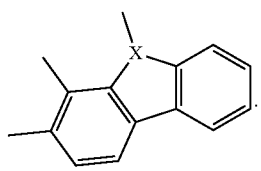

13. The light emitting device of claim 8, wherein C in structure (a) or (b) is

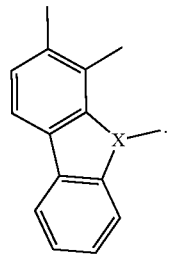

14. The light emitting device of claim 8, wherein N in structure (a) or (b) is

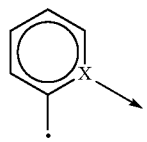

or substituted

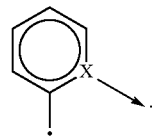

15. The light emitting device of claim 8, wherein M is platinum (II) or palladium (II).

16. The light emitting device of claim 1, wherein the fluorescent emitter has the following structure:

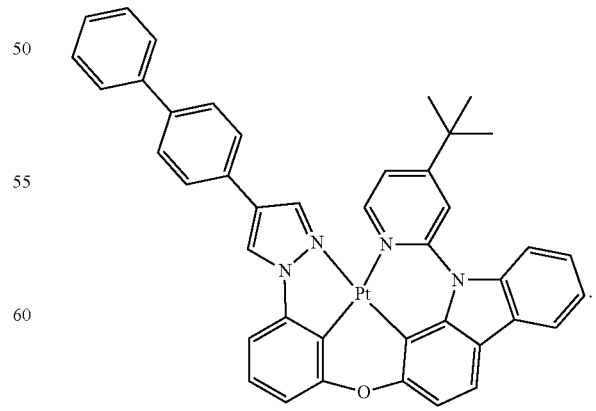

17. The light emitting device of claim 8, wherein the MADF emitter is a compound of General Formula A:

General Formula A

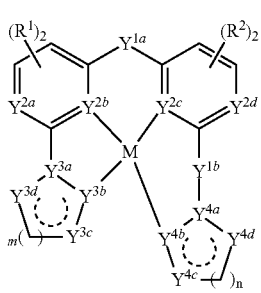

wherein:

M is Pt, Pd, Au, Ir, Rh, Mn, Ni, Cu, or Ag;

each $R^1$ and $R^2$ is independently hydrogen, halogen, hydroxyl, nitro, thiol, or substituted or unsubstituted alkyl, alkenyl, alkynyl, aryl, heteroaryl, cycloalkane, cycloalkane, heterocyclyl, amino, alkoxy, haloalkyl, arylalkane, or arylalkene;

each of $Y^{1a}$ and $Y^{1b}$ is independently O, $NR^3$, $CR^3R^4$, S, $AsR^3$, $BR^3$, $B(R^3)_2$, $PR^3$, $P(O)R^3$, or $SiR^3R^4$, or a combination thereof, wherein each of $R^3$ and $R^4$ is independently hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, arylalkene, or $R^3$ and $R^4$ together form C=O, wherein each of $R^3$ and $R^4$ is independently optionally linked to an adjacent ring structure, thereby forming a cyclic structure;

each of $Y^{2a}$, $Y^{2b}$, $Y^{2c}$, and $Y^{2d}$ is independently N or $CR^5$, wherein $R^5$ is hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, or arylalkene;

each of $Y^{3a}$, $Y^{3b}$, $Y^{3c}$, $Y^{3d}$, $Y^{4a}$, $Y^{4b}$, $Y^{4c}$, and $Y^{4d}$ is independently N, O, S, $NR^6$, or $CR^7$, wherein each of $R^6$ and $R^7$ is independently hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, or arylalkene; or $Z(R^8)_2$, wherein Z is C or Si, and wherein each $R^8$ is independently hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, or arylalkene;

each of m and n is independently 1 or 2; and each ⌒ independently represents partial or full unsaturation of the ring with which it is associated.

18. The light emitting device of claim 8, wherein the MADF emitter is a compound of General Formula D:

General Formula D

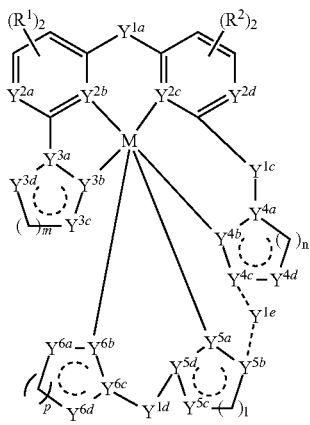

wherein:

M is Ir, Rh, Pt, Os, Zr, Co, or Ru;

each of $R^1$ and $R^2$ is independently hydrogen, halogen, hydroxyl, nitro, thiol, or substituted or unsubstituted alkyl, alkenyl, alkynyl, aryl, heteroaryl, cycloalkane, cycloalkane, heterocyclyl, amino, alkoxy, haloalkyl, arylalkane, or arylalkene;

each of $Y^{1a}$, $Y^{1b}$, $Y^{1c}$ and $Y^{1d}$ is independently O, $NR^3$, $CR^3R^4$, S, $AsR^3$, $BR^3$, $PR^3$, $P(O)R^3$, or $SiR^3R^4$, wherein each of $R^3$ and $R^4$ is independently hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, arylalkene, or $R^3$ and $R^4$ together form C=O, wherein each of $R^3$ and $R^4$ is independently optionally linked to an adjacent ring structure, thereby forming a cyclic structure;

$Y^{1e}$, if present, is O, $NR^3$, $CR^3R^4$, S, $AsR^3$, $BR^3$, $PR^3$, $P(O)R^3$, or $SiR^3R^4$, wherein each of $R^3$ and $R^4$ is independently hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, arylalkene, or $R^3$ and $R^4$ together form C=O, wherein each of $R^3$ and $R^4$ is independently optionally linked to an adjacent ring structure, thereby forming a cyclic structure;

each of $Y^{2a}$, $Y^{2b}$, $Y^{2c}$, and $Y^{2d}$ is independently N or $CR^5$, wherein $R^5$ is hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, or arylalkene;

each of $Y^{3a}$, $Y^{3b}$, $Y^{3c}$, $Y^{3d}$, $Y^{3e}$, $Y^{4a}$, $Y^{4b}$, $Y^{4c}$, and $Y^{4d}$ is independently N, O, S, $NR^6$, or $CR^7$, wherein each of $R^6$ and $R^7$ is independently hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, or arylalkene; or $Z(R^8)_2$, wherein Z is C or Si, and wherein each $R^8$ is independently hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, or arylalkene;

each of $Y^{5a}$, $Y^{5b}$, $Y^{5c}$, $Y^{5d}$, $Y^{6a}$, $Y^{6b}$, $Y^{6c}$, and $Y^{6d}$ is independently N, O, S, $NR^5$, or $CR^6$; each of m, n, I, and p is independently 1 or 2; and each ⌒ independently represents partial or full unsaturation of the ring with which it is associated.

19. The light emitting device of claim 8, wherein the MADF emitter is a compound of General Formula E:

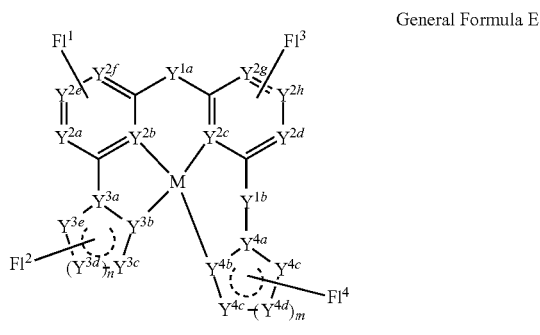

General Formula E wherein:

M is Pt, Pd, Ir, Rh, Au, Co, Mn, Ni, Ag, or Cu;

each of $Y^{1a}$ and $Y^{1b}$ is independently O, $NR^3$, $CR^3R^4$, S, $AsR^3$, $BR^3$, $PR^3$, $P(O)R^3$, or $SiR^3R^4$, wherein each of $R^3$ and $R^4$ is independently hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, arylalkene, or $R^3$ and $R^4$ together form C=O, wherein each of $R^3$ and $R^4$ is independently optionally linked to an adjacent ring structure, thereby forming a cyclic structure;

each of $Y^{2a}$, $Y^{2b}$, $Y^{2c}$, $Y^{2d}$, $Y^{2e}$, $Y^{2f}$, $Y^{2g}$, and $Y^{2h}$ is independently N or $CR^5$, wherein $R^5$ is hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, or arylalkene;

each of $Y^{3a}$, $Y^{3b}$, $Y^{3c}$, $Y^{3d}$, $Y^{3e}$, $Y^{4a}$, $Y^{4b}$, $Y^{4c}$, $Y^{4d}$ and $Y^{4e}$ is independently N, O, S, $NR^6$, or $CR^7$, wherein each of $R^6$ and $R^7$ independently hydrogen, halogen, hydroxyl, thiol, or substituted or unsubstituted alkyl, alkenyl, alkynyl, aryl, heteroaryl, cycloalkane, cycloalkane, heterocyclyl, amino, alkoxy, haloalkyl, arylalkane, or arylalkene; or $Z(R^8)_2$, wherein Z is C or Si, and wherein each $R^8$ is independently hydrogen, halogen, hydroxyl, thiol, or substituted or unsubstituted alkyl, alkenyl, alkynyl, aryl, heteroaryl, cycloalkane, cycloalkane, heterocyclyl, aminoalkoxy, haloalkyl, arylalkane, or arylalkene;

m is 1 or 2;

n is 1 or 2;

each ⌒ independently represents partial or full unsaturation of the ring with which it is associated; and each of $Fl^1$, $Fl^2$, $Fl^3$ and $Fl^4$ is independently present or absent, with at least one of $Fl^1$, $Fl^2$, $Fl^3$ and $Fl^4$ present, and if present each of $Fl^1$, $Fl^2$, $Fl^3$ and $Fl^4$ is a fluorescent emitter covalently bonded to one of $Y^{2a}$, $Y^{2d}$, $Y^{2e}$, $Y^{2f}$, $Y^{2g}$, $Y^{2h}$, $Y^{3c}$, $Y^{3d}$, $Y^{3e}$ $Y^{4c}$, $Y^{4d}$ and $Y^{4e}$.

20. The light emitting device of claim 19, wherein each of $Fl^1$, $Fl^2$, $Fl^3$, $Fl^4$, if present, has one of the following structures 1. Aromatic Hydrocarbons and Their Derivatives

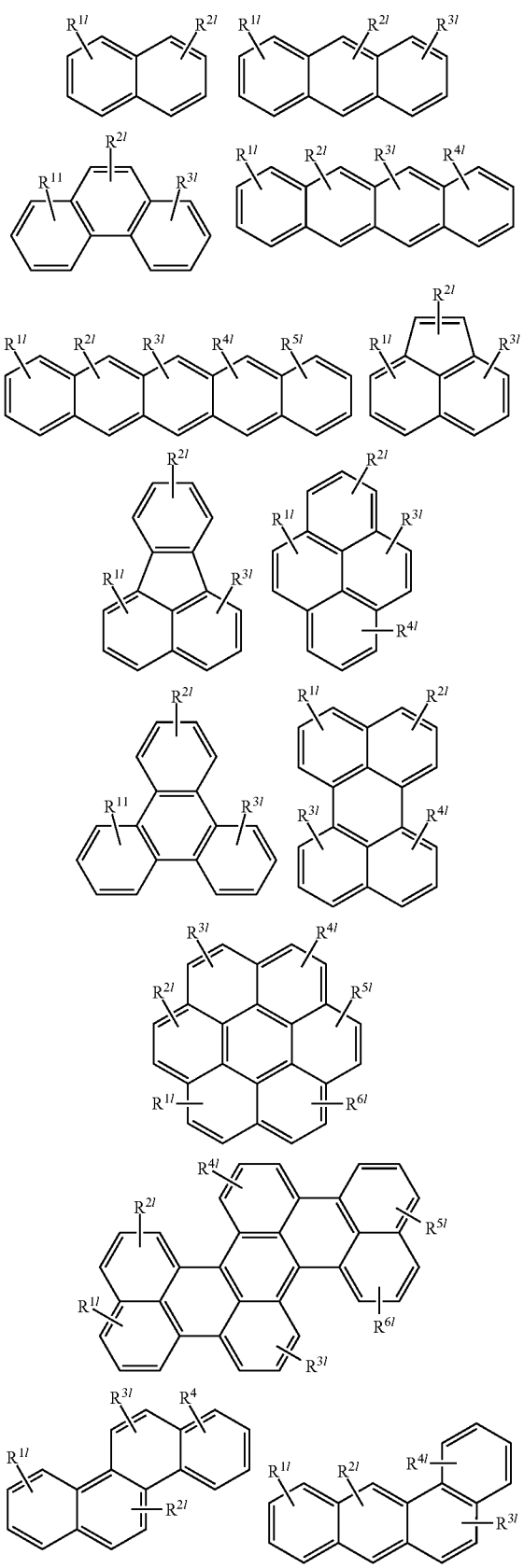

-continued
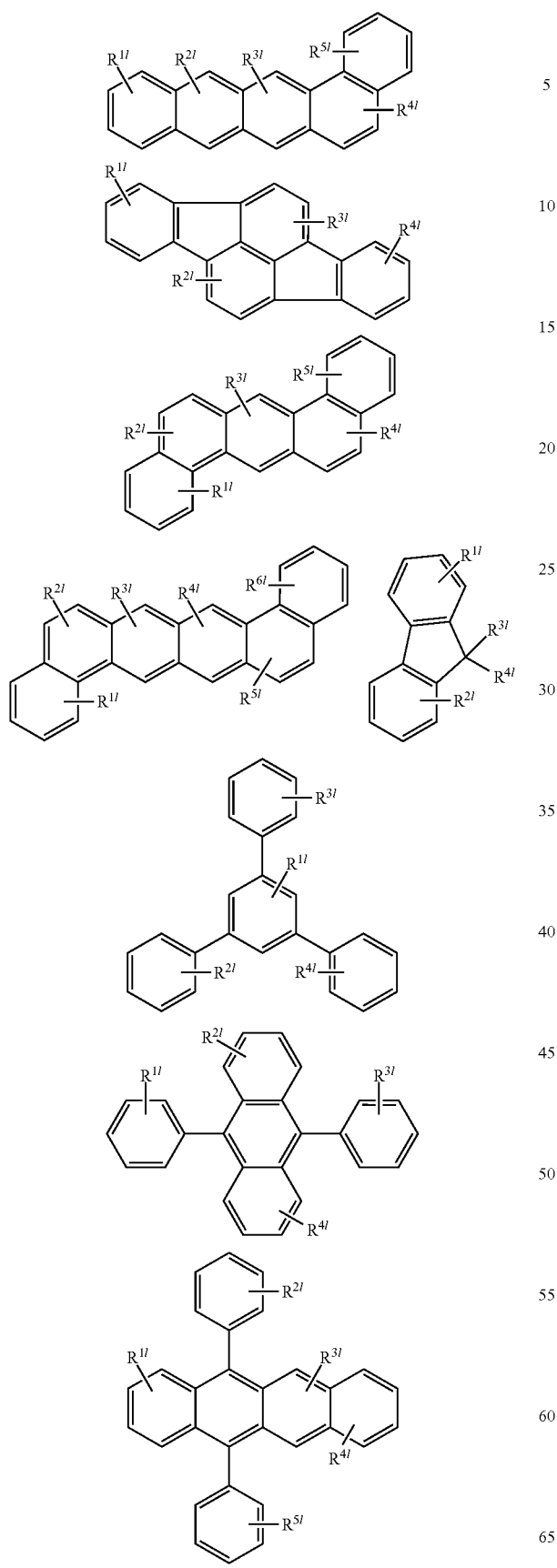
-continued
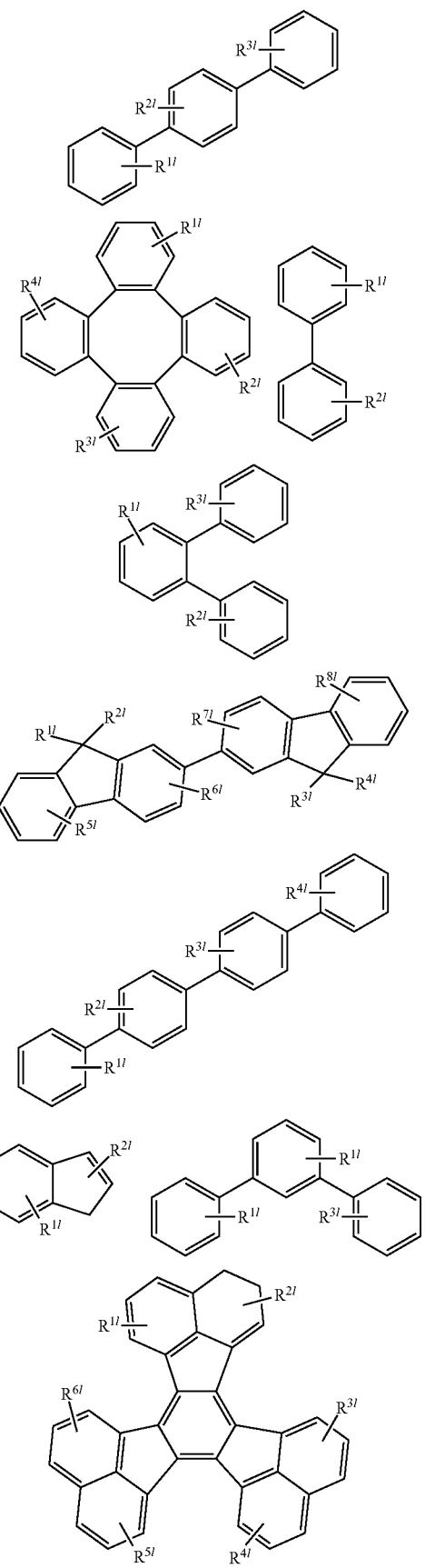

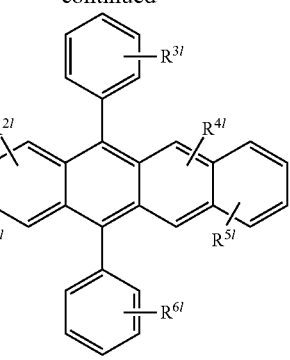
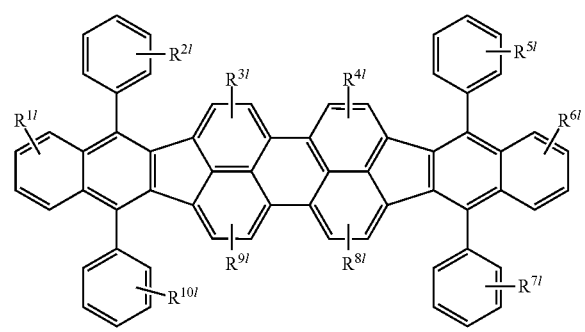
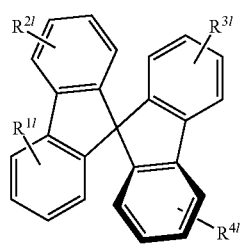
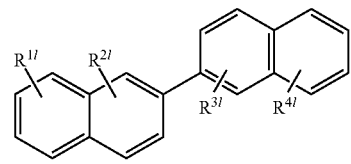
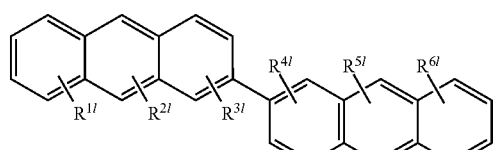
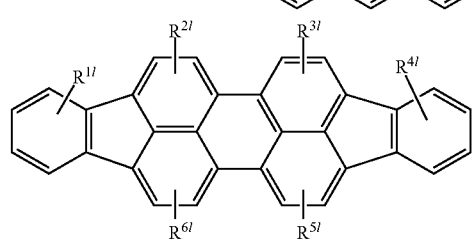
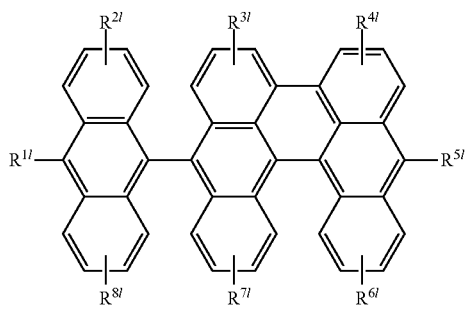
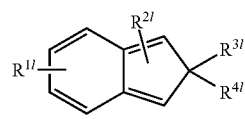
2. Arylethylene, Arylacetylene and Their Derivatives
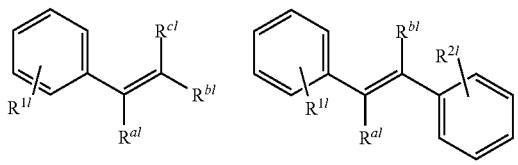
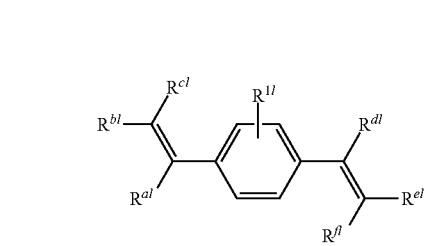
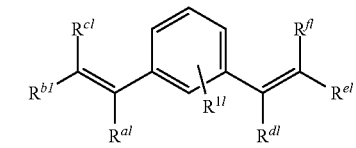
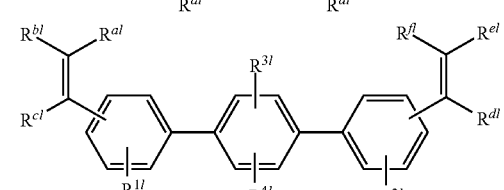
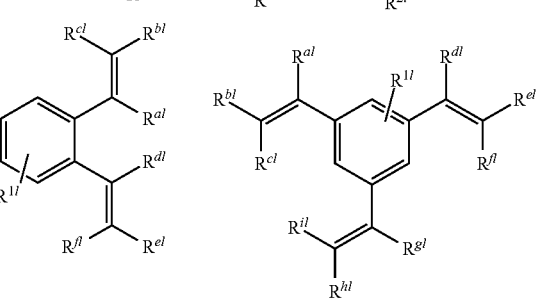

-continued
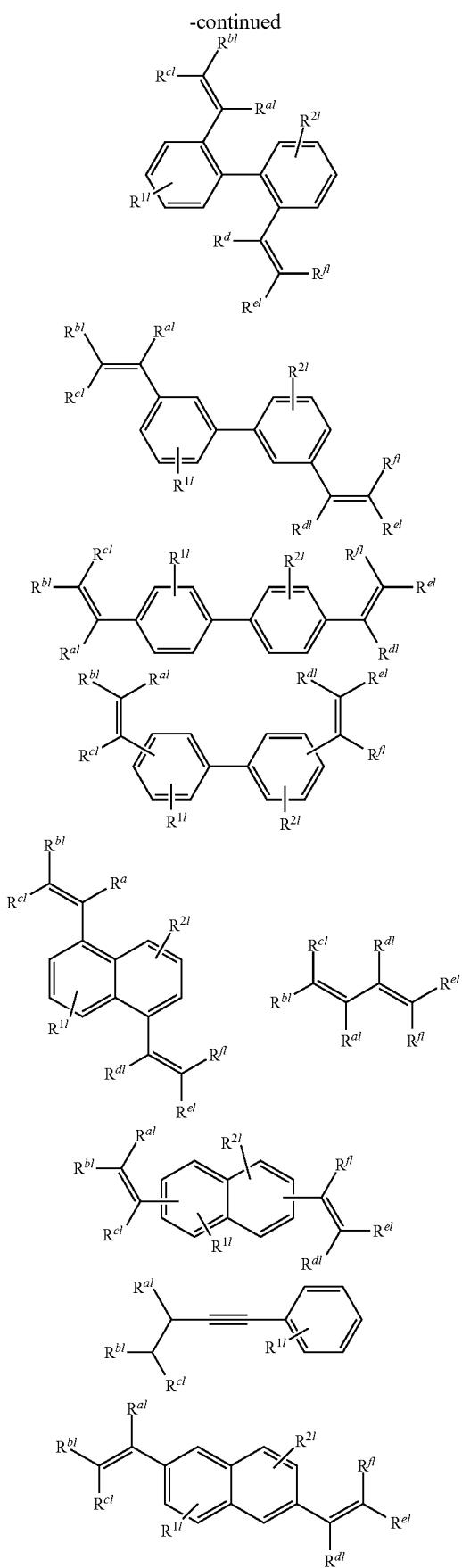
-continued
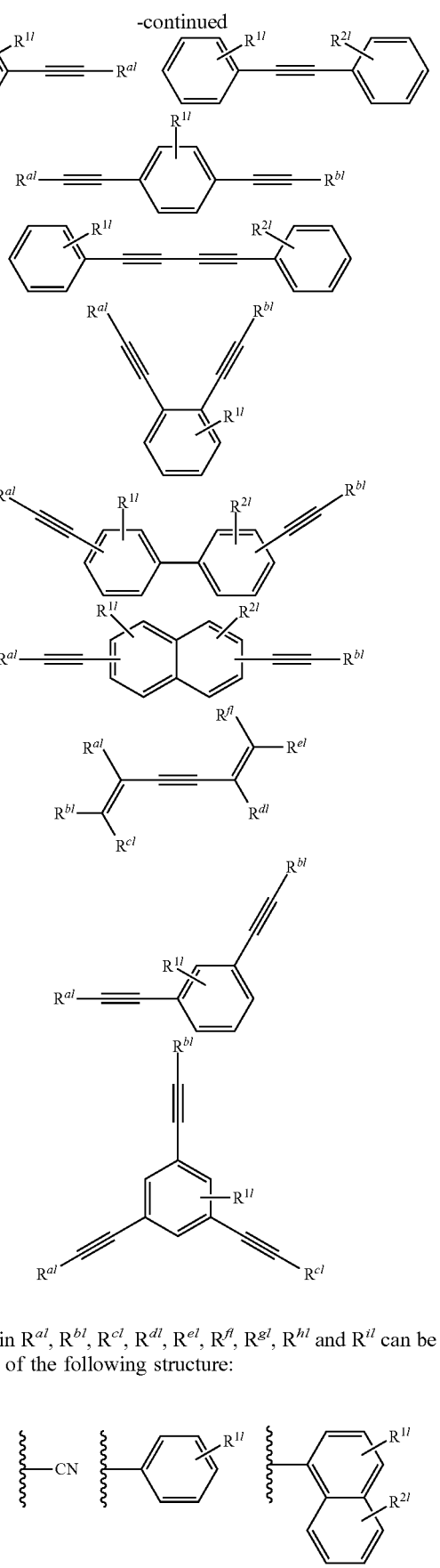
wherein $R^{al}$, $R^{bl}$, $R^{cl}$, $R^{dl}$, $R^{el}$, $R^{fl}$, $R^{gl}$, $R^{hl}$ and $R^{il}$ can be one of the following structure:
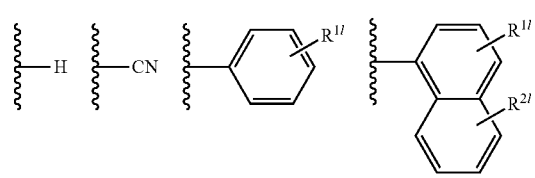

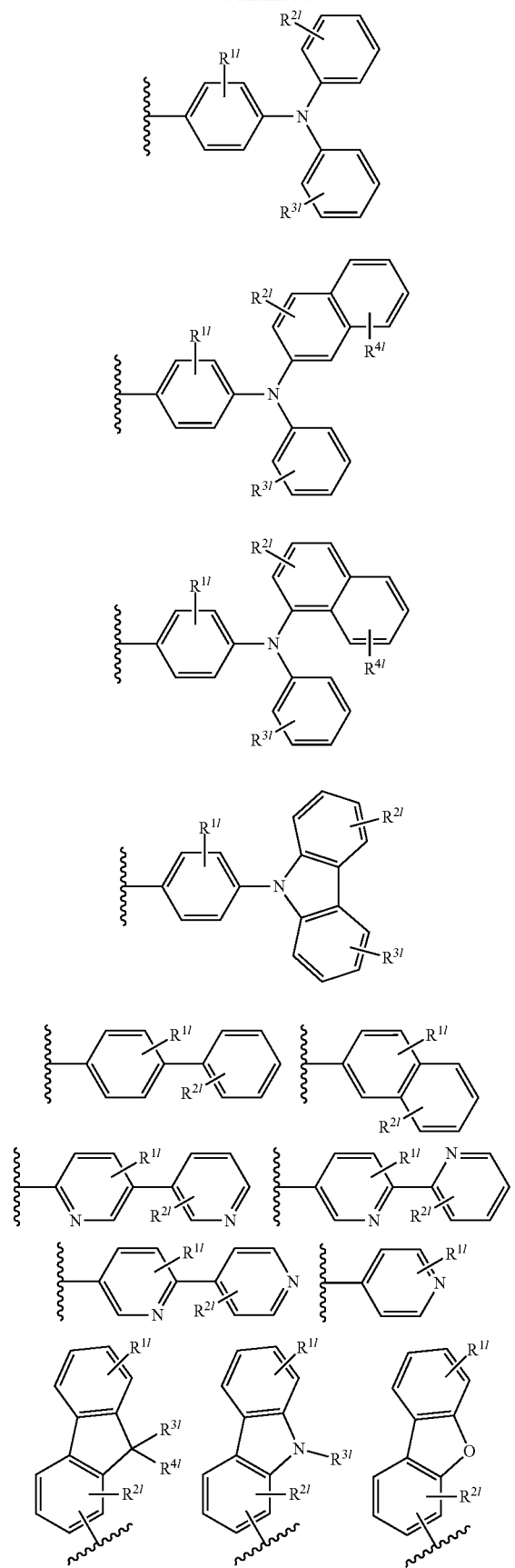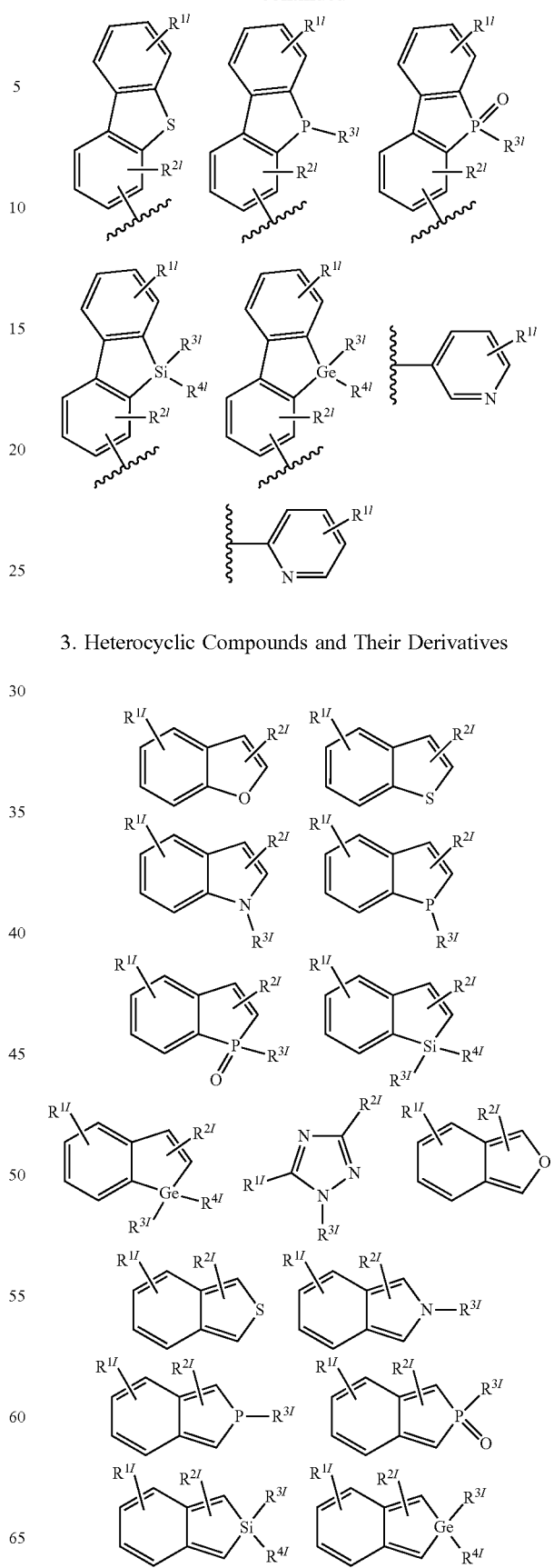
3. Heterocyclic Compounds and Their Derivatives

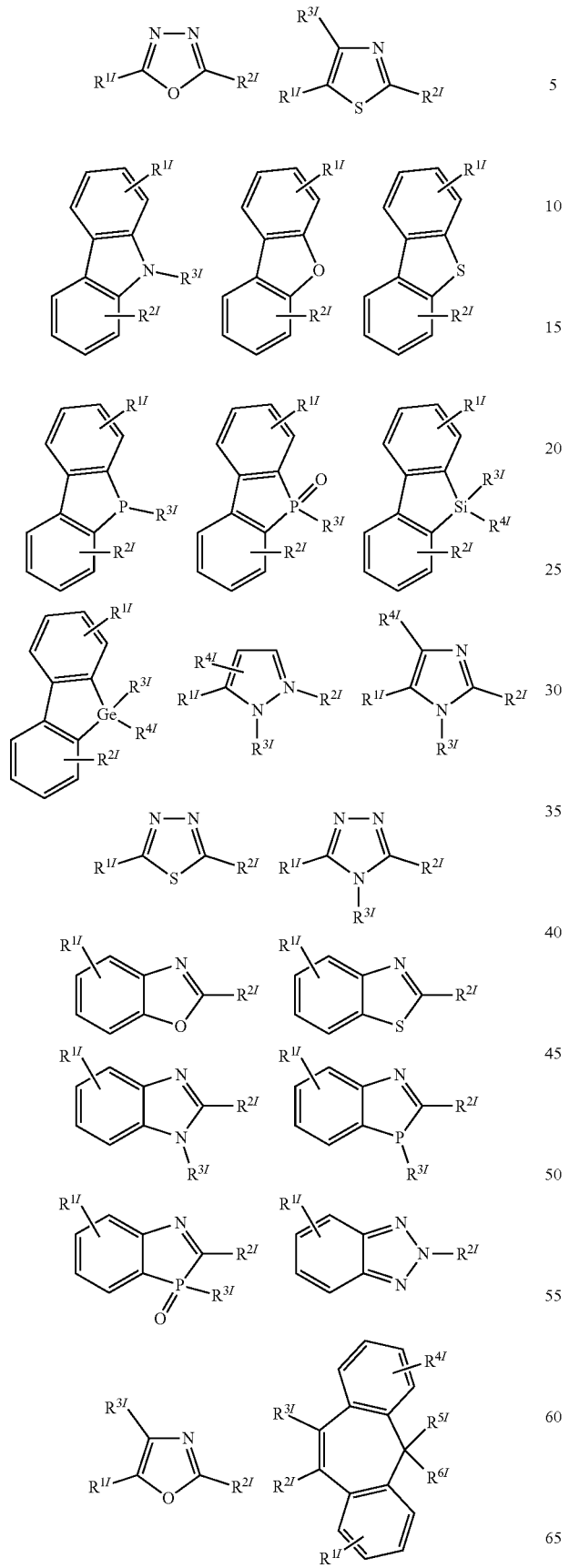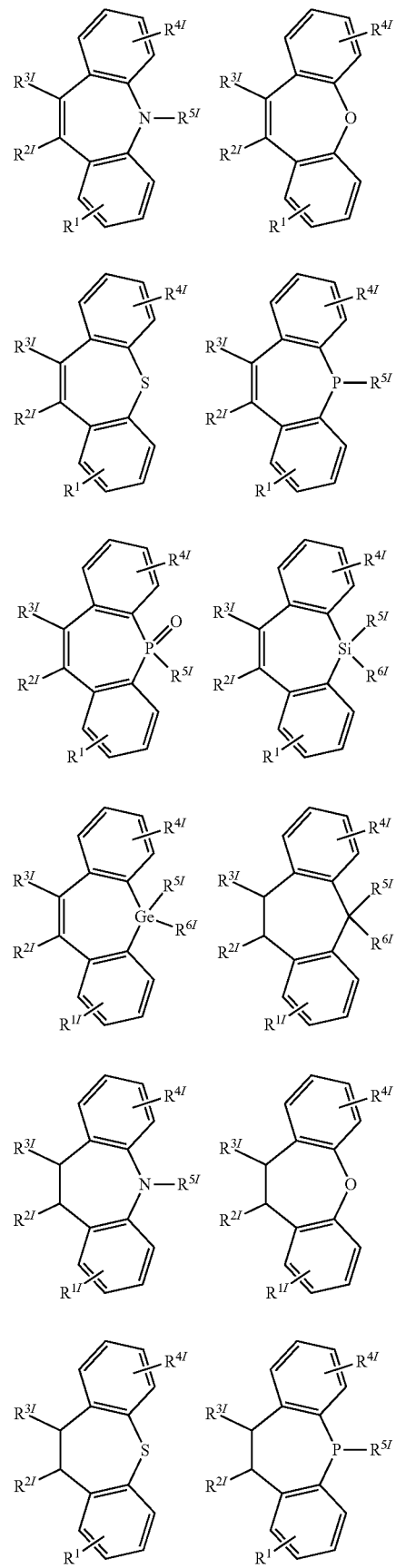

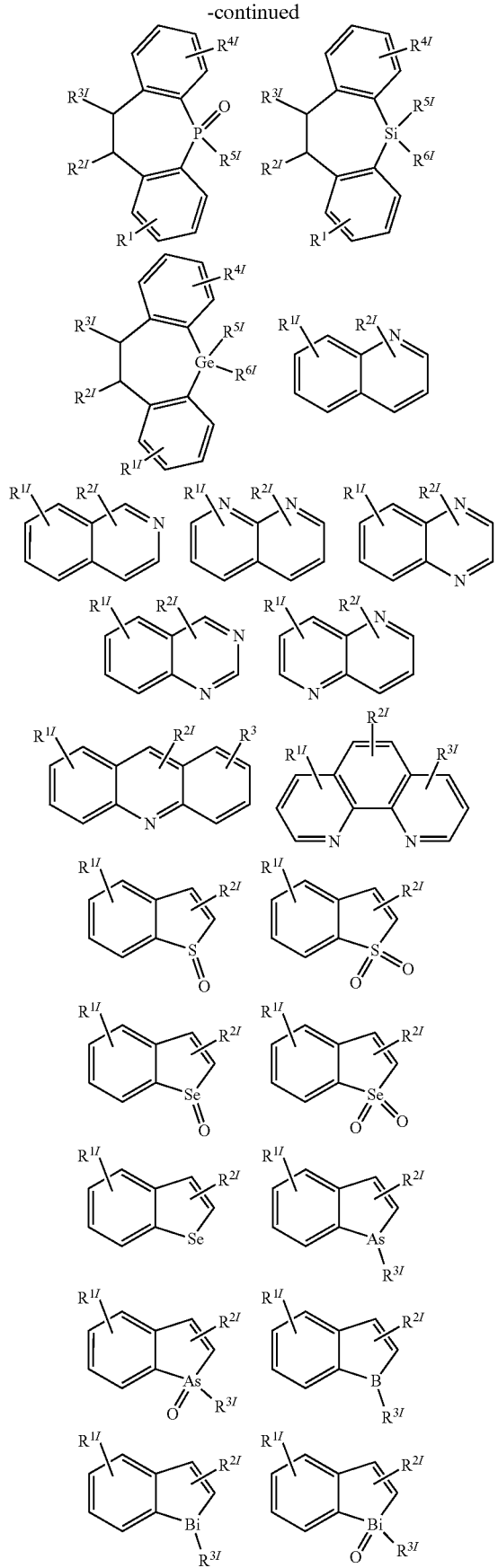
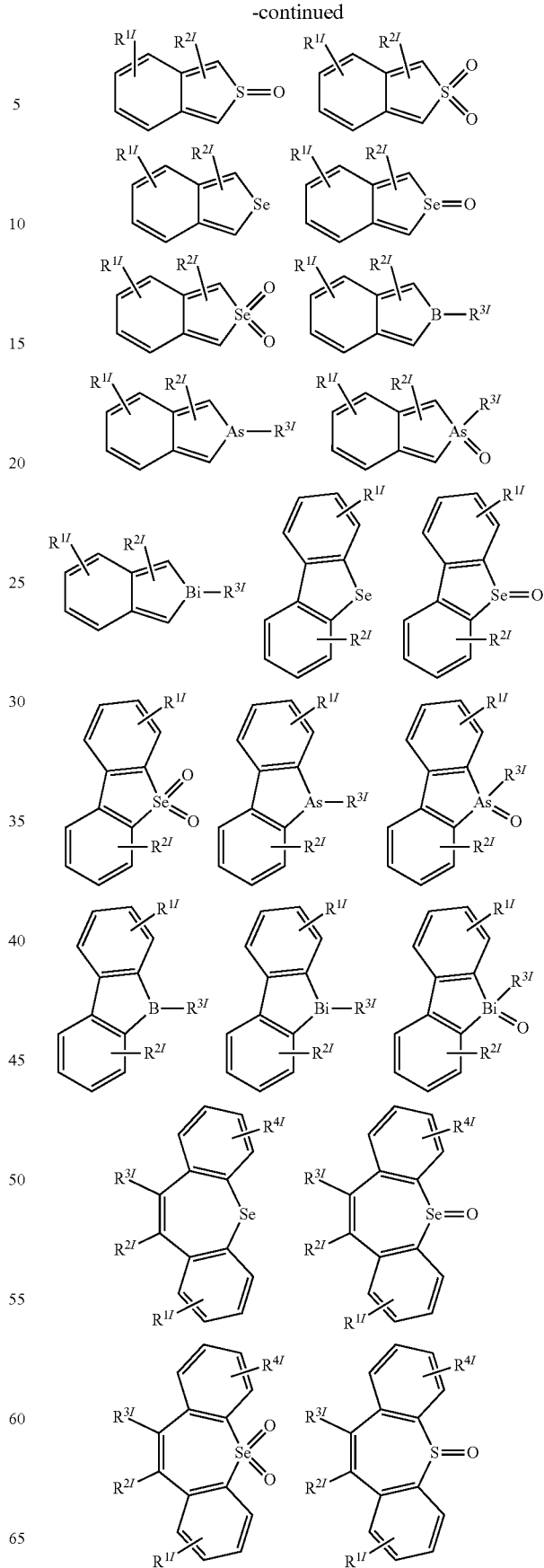

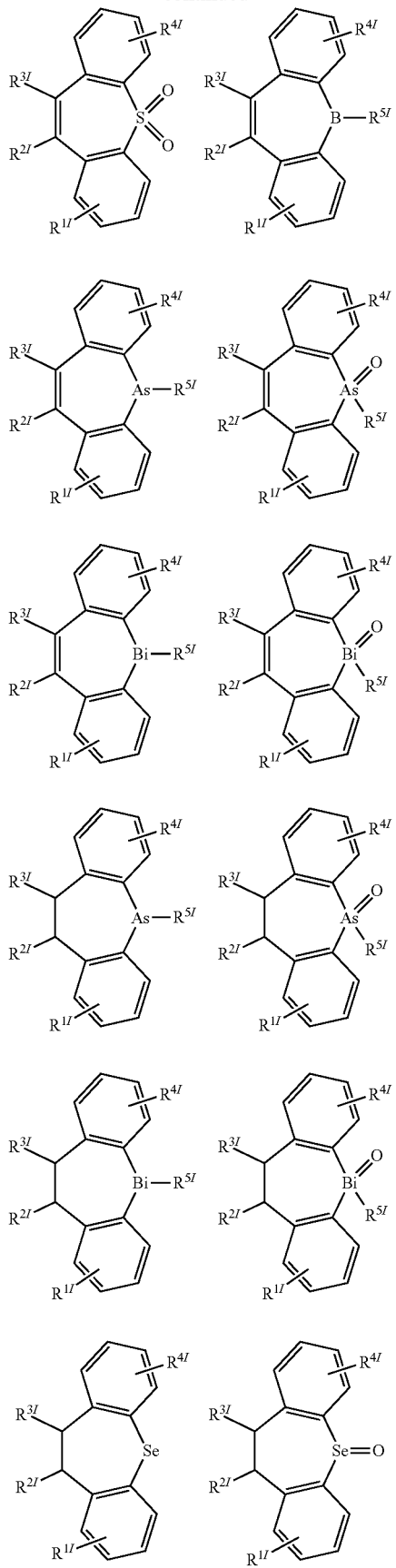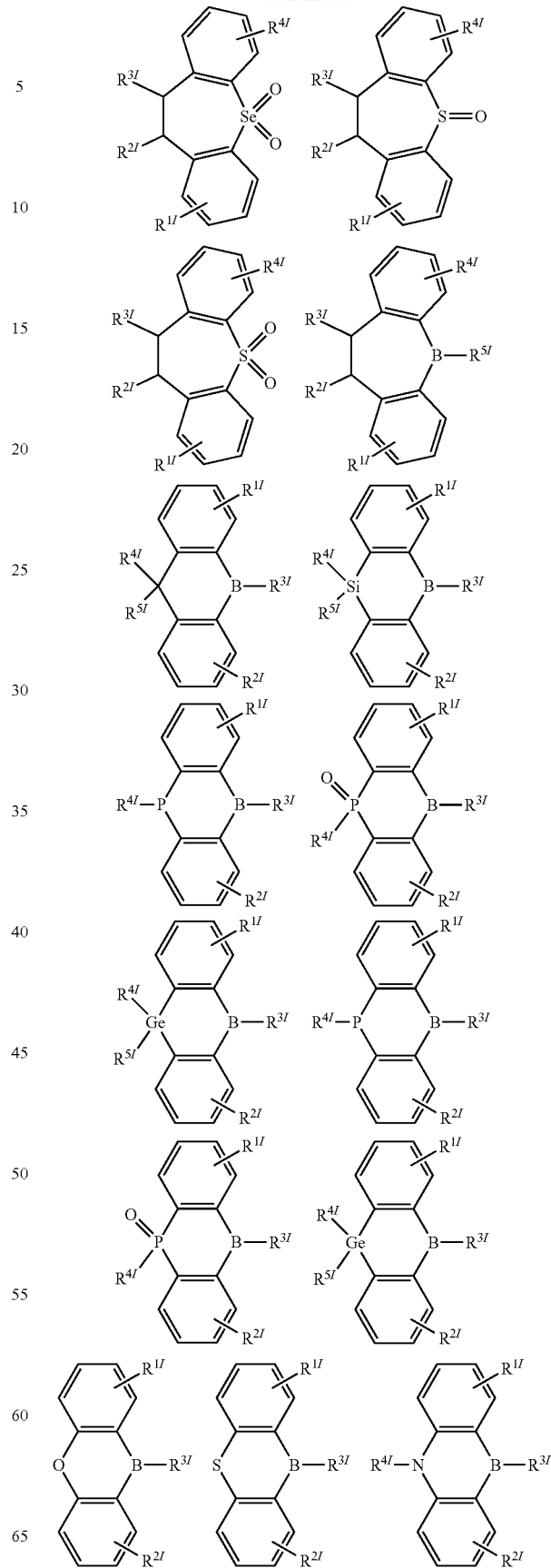

-continued
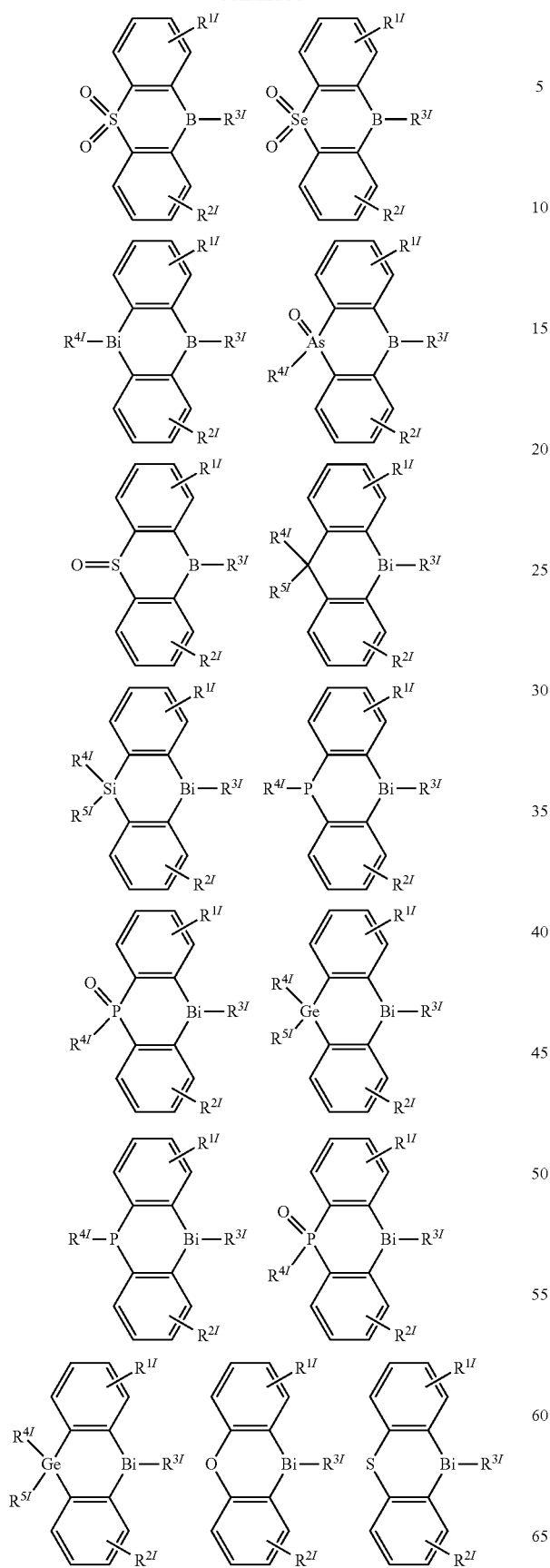
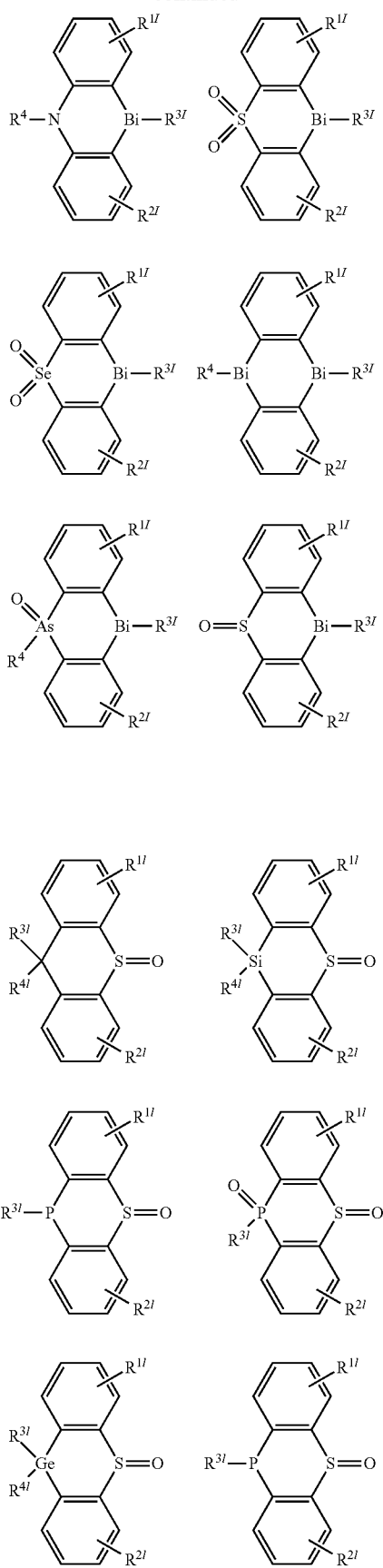

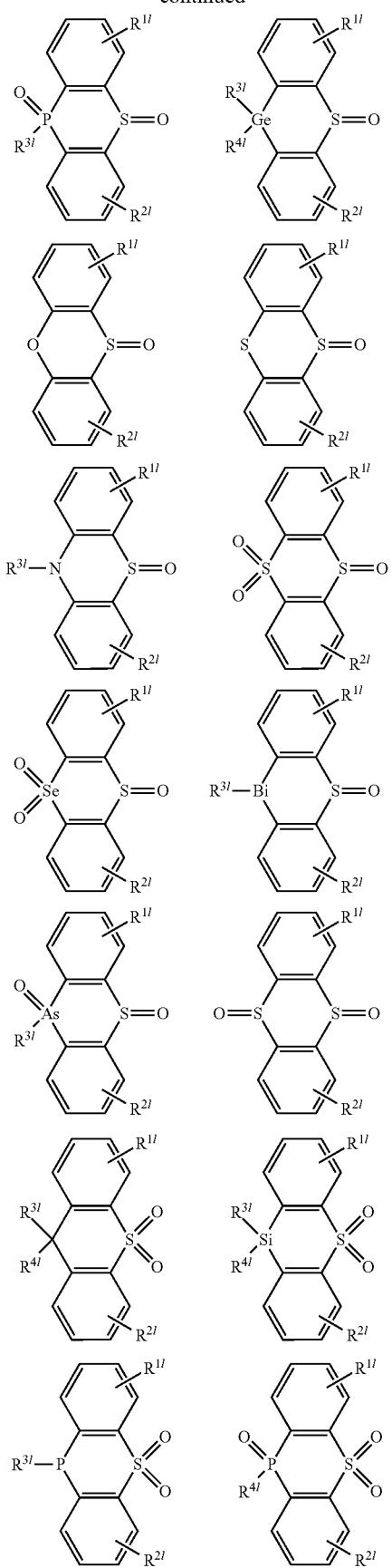
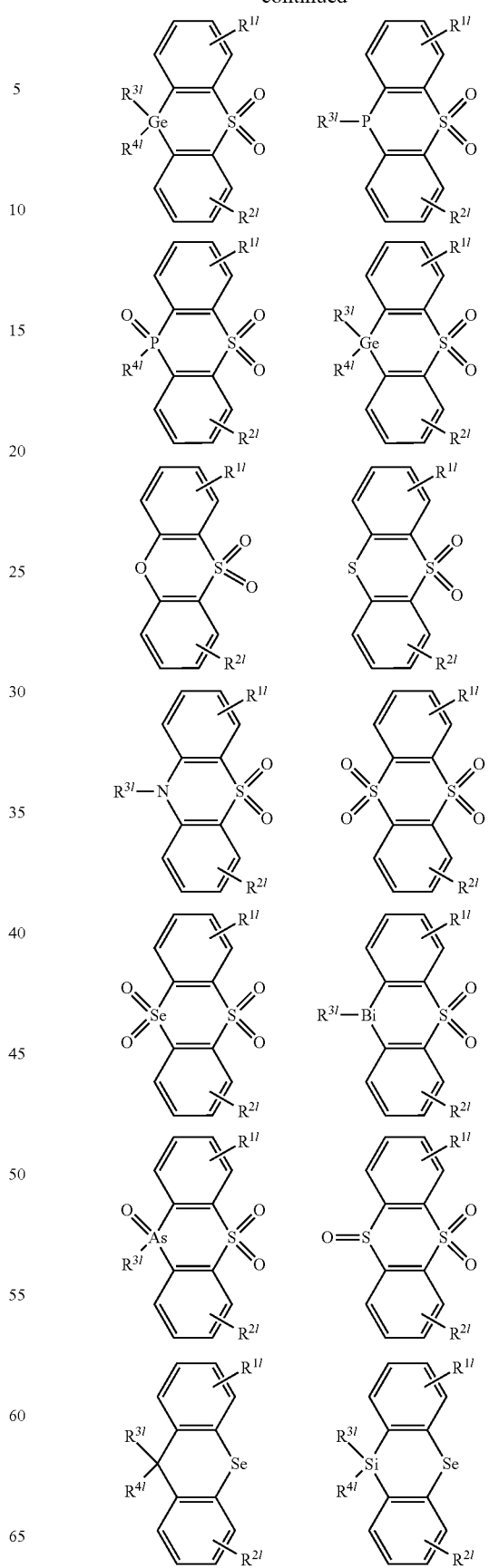

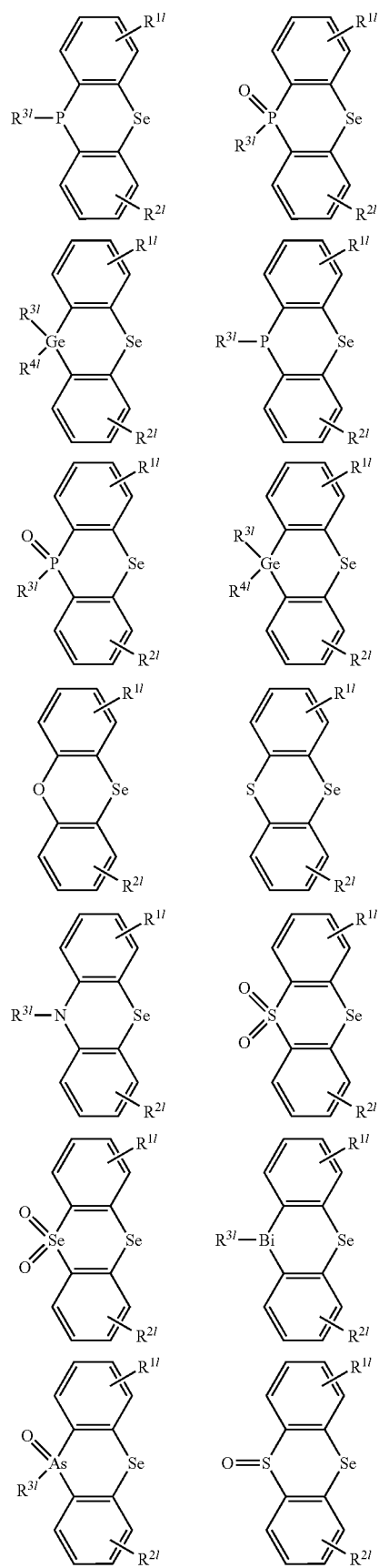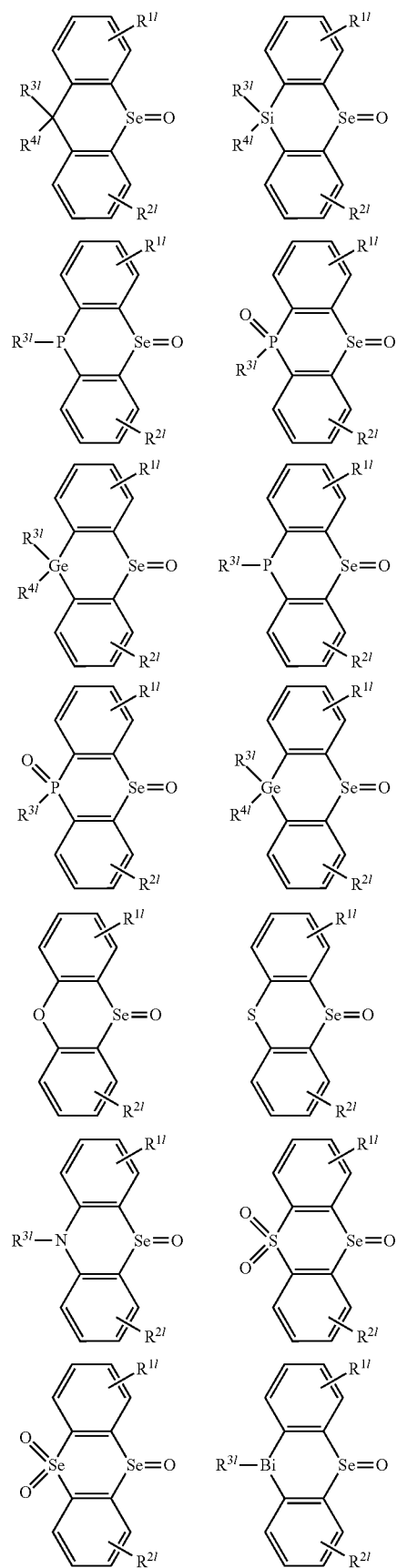

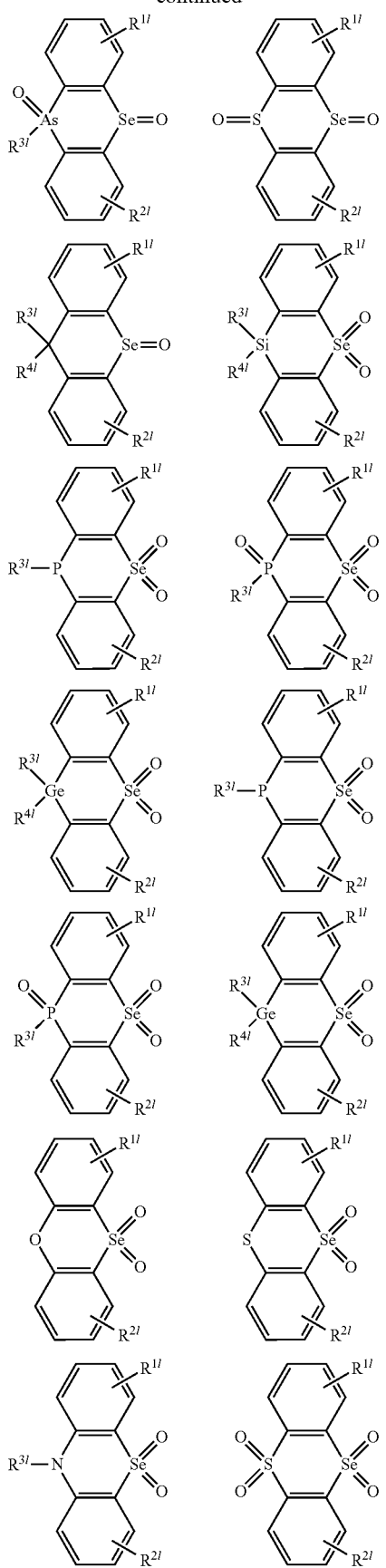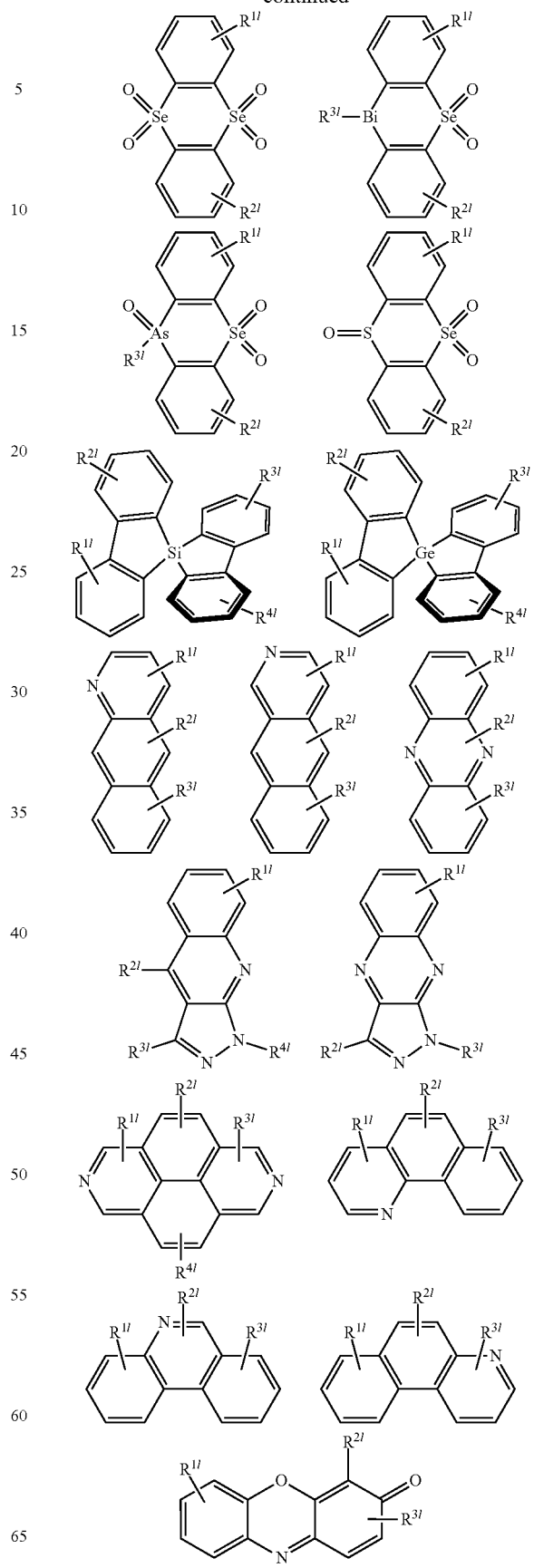

111
-continued
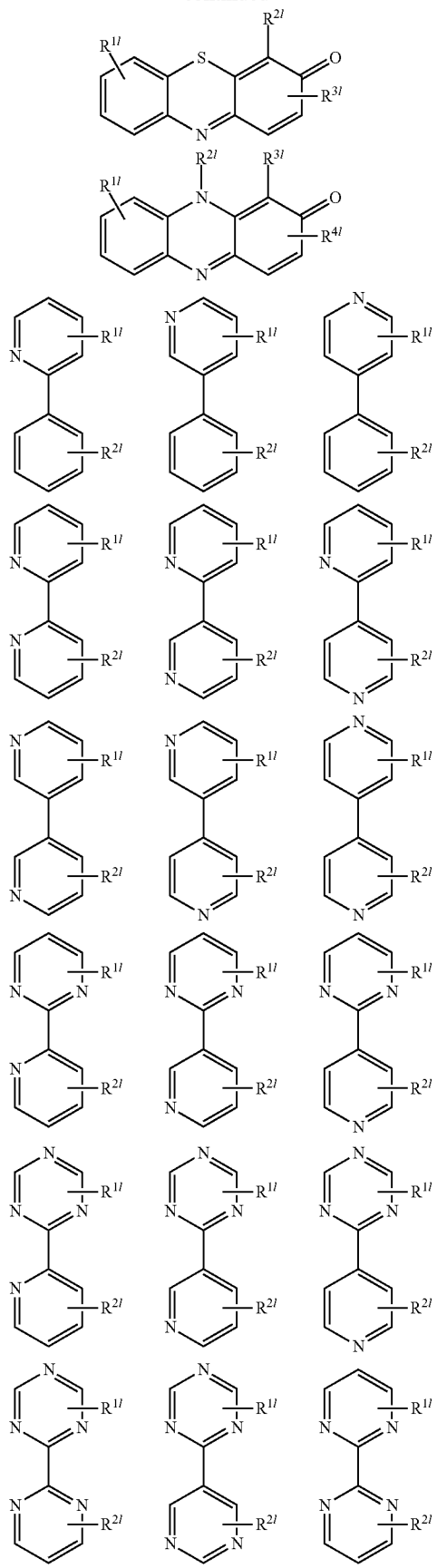
112
-continued
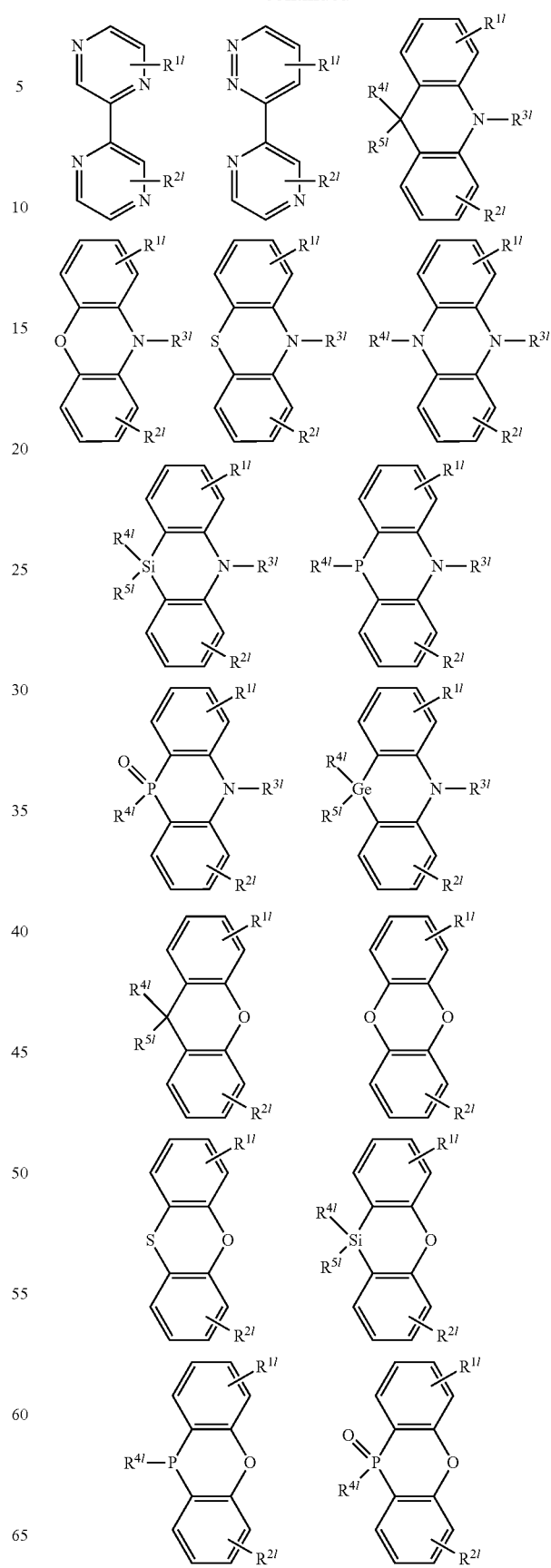

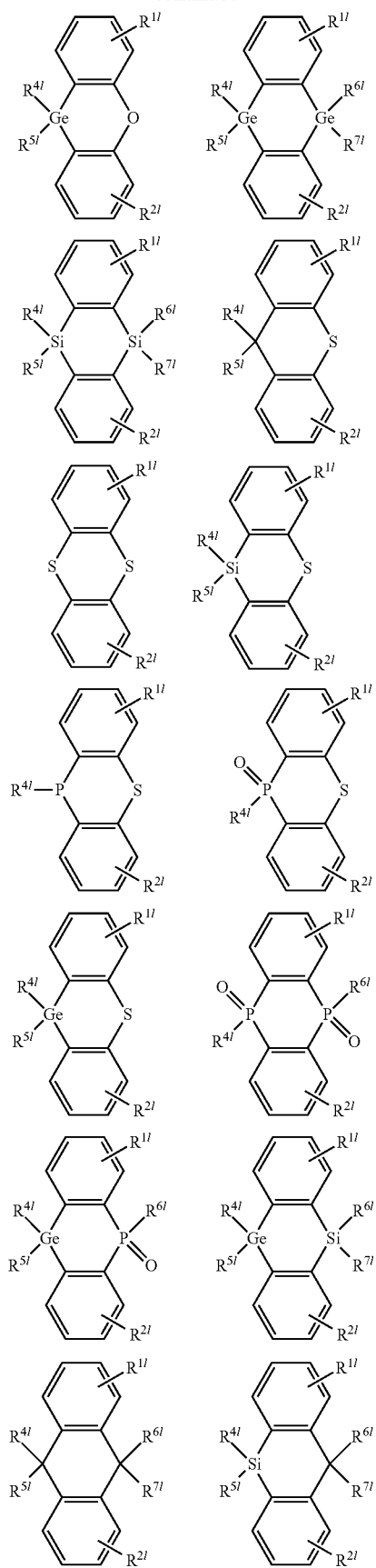
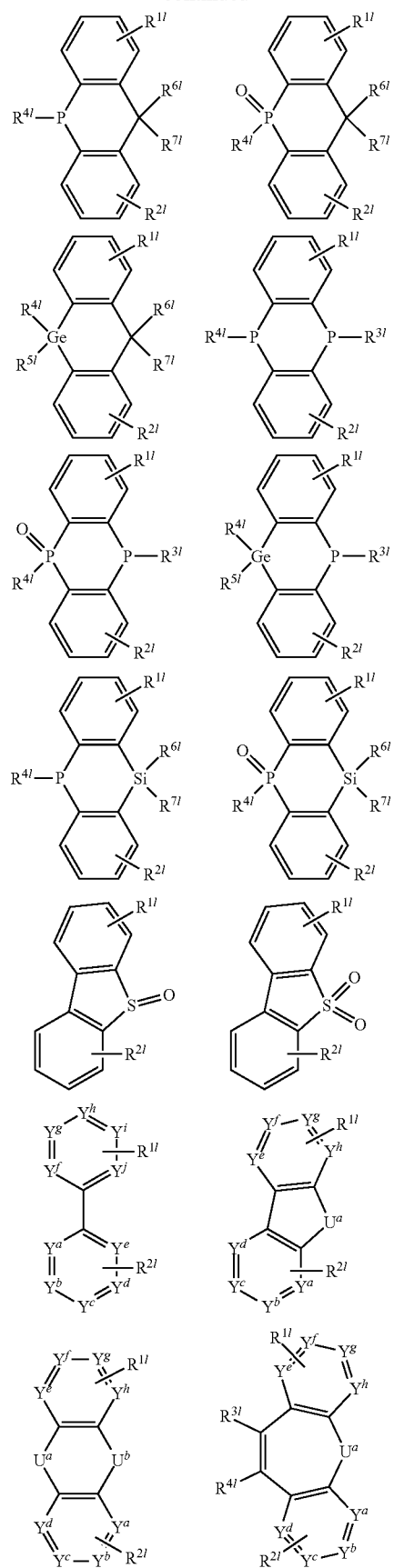

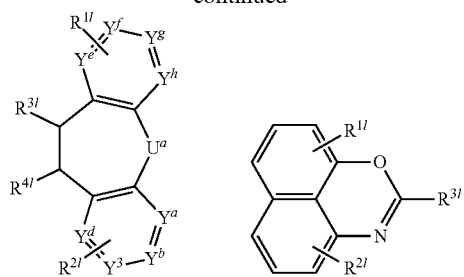
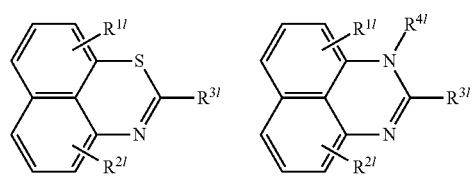
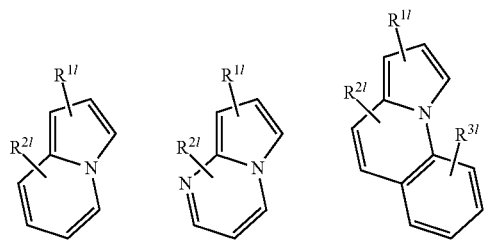
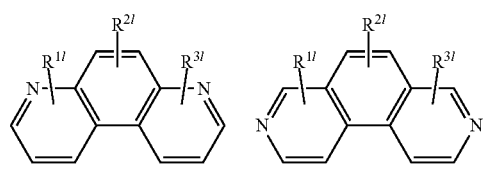
4. Other fluorescent luminophors
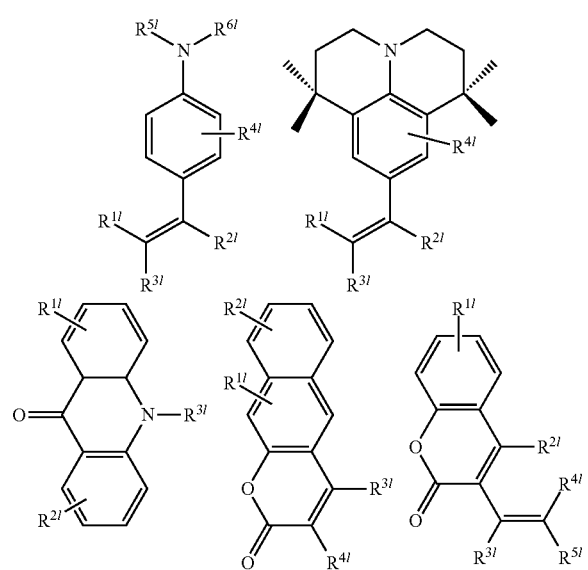
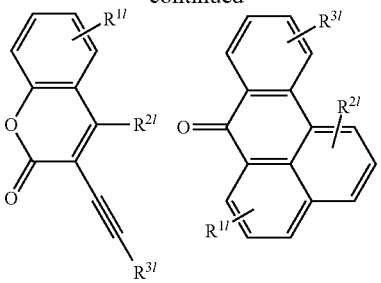
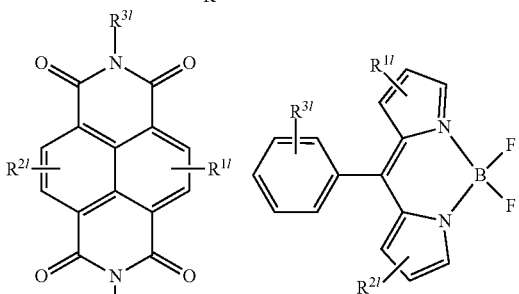
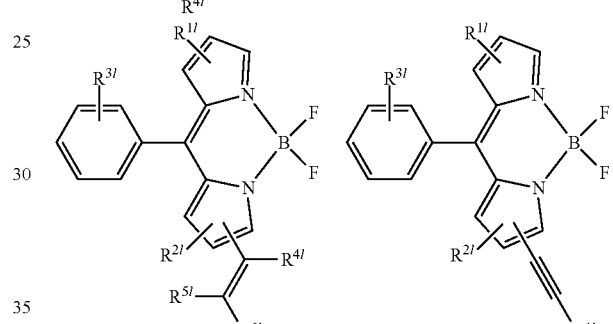
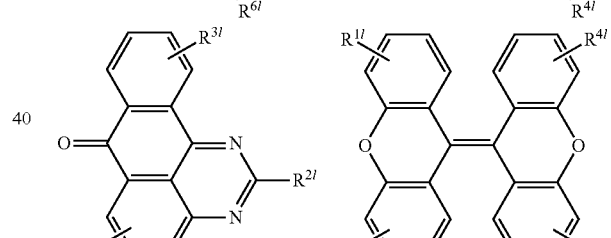
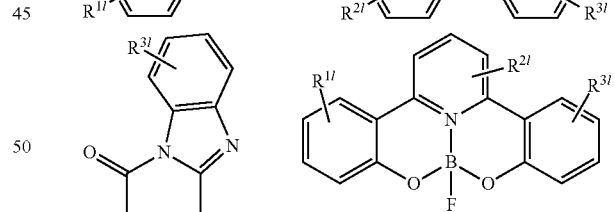
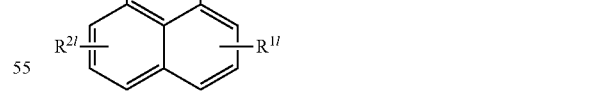
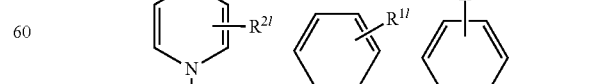

-continued

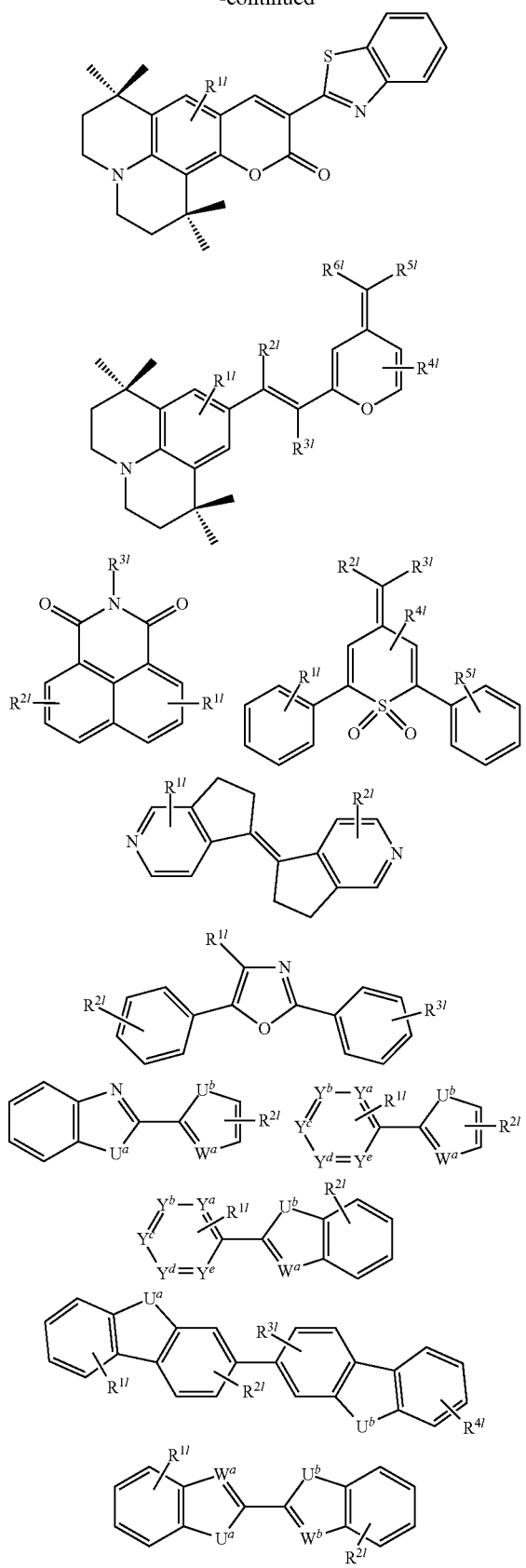

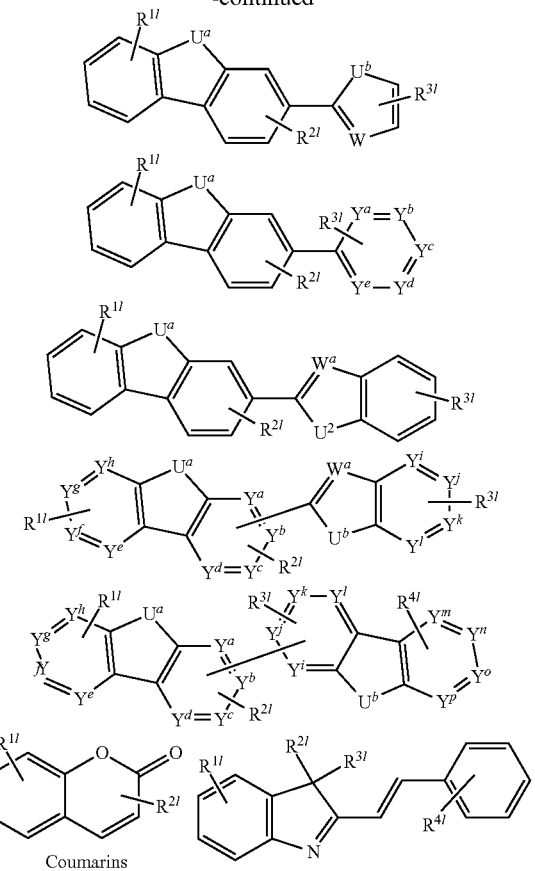

Coumarins wherein:
each of $R^{1l}$, $R^{2l}$, $R^{3l}$, $R^{4l}$, $R^{5l}$, $R^{6l}$, $R^{7l}$ and $R^{8l}$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric, or any conjugate or combination thereof, and
each of $Y^a$, $Y^b$, $Y^c$, $Y^d$, $Y^e$, $Y^f$, $Y^g$, $Y^h$, $Y^i$, $Y^j$, $Y^k$, $Y^l$, $Y^m$, $Y^o$ and $Y^p$ is independently C, N or B; and
each of $U^a$, $U^b$ and $U^c$ is independently $CH_2$, CRR, C=O, SiRR, $GeH_2$, $GeRR^2$, NH, NR, PH, PR, RP=O, AsR, RAs=O, O, S, S=O, $SO_2$, Se, Se=O, $SeO_2$, BH, BR, RBi=O, BiH, or BiR, wherein each R is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric, or any conjugate or combination thereof.

* * * * *